US012432907B2

(12) United States Patent
Gawase et al.

(10) Patent No.: US 12,432,907 B2
(45) Date of Patent: Sep. 30, 2025

(54) SEMICONDUCTOR DEVICE AND SEMICONDUCTOR MEMORY DEVICE

(71) Applicant: Kioxia Corporation, Tokyo (JP)

(72) Inventors: Akifumi Gawase, Kuwana Mie (JP); Shuntaro Yamashita, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 406 days.

(21) Appl. No.: 18/178,474

(22) Filed: Mar. 3, 2023

(65) Prior Publication Data

US 2023/0413530 A1 Dec. 21, 2023

(30) Foreign Application Priority Data

Jun. 21, 2022 (JP) ................................. 2022-099891

(51) Int. Cl.
| | |
|---|---|
| H10B 12/00 | (2023.01) |
| H10D 30/63 | (2025.01) |
| H10D 30/67 | (2025.01) |
| H10D 62/80 | (2025.01) |

(52) U.S. Cl.
CPC ............. *H10B 12/33* (2023.02); *H10B 12/05* (2023.02)

(58) Field of Classification Search
CPC .... H10B 12/33; H10B 12/05; H10D 30/6728; H10D 30/6755; H10D 30/63; H10D 62/80
See application file for complete search history.

(56) References Cited

U.S. PATENT DOCUMENTS

| | | | |
|---|---|---|---|
| 8,278,657 | B2 | 10/2012 | Sakata |
| 8,785,266 | B2 | 7/2014 | Yamazaki |
| 8,872,171 | B2 | 10/2014 | Yamazaki |
| 9,859,439 | B2 | 1/2018 | Miyairi |
| 11,094,698 | B2 | 8/2021 | Inaba |
| 2007/0241327 | A1 | 10/2007 | Kim |
| 2010/0283049 | A1* | 11/2010 | Sato ................... H10D 30/6704 257/53 |

(Continued)

FOREIGN PATENT DOCUMENTS

| | | |
|---|---|---|
| JP | 6347704 B2 | 6/2018 |
| JP | 2019096856 A | 6/2019 |

(Continued)

*Primary Examiner* — Omar F Mojaddedi
(74) *Attorney, Agent, or Firm* — Kim & Stewart LLP

(57) ABSTRACT

According to one embodiment, a semiconductor device includes first and second electrodes comprising a metal oxide an oxide semiconductor layer between the first and second electrodes, a gate electrode surrounding the oxide semiconductor layer, a gate insulating layer, a first insulating layer between the first and gate electrodes, a second insulating layer between the second and gate electrodes, a first conductive layer contacting the surface of the first electrode, a second conductive layer contacting the surface of second electrode, a first layer surrounding the first electrode, a second layer surrounding the second electrode, a third insulating layer between the first electrode and the first insulating layer and contacting the gate insulating layer and the first layer, and a fourth insulating layer between the second electrode and the second insulating layer and contacting the gate insulating layer and the second layer.

30 Claims, 48 Drawing Sheets

(56) References Cited

U.S. PATENT DOCUMENTS

| | | | |
|---|---|---|---|
| 2012/0043542 A1* | 2/2012 | Yanagisawa | H10D 30/6728 |
| | | | 257/57 |
| 2012/0199842 A1* | 8/2012 | Takemura | H10B 12/50 |
| | | | 438/666 |
| 2014/0054568 A1* | 2/2014 | Ishii | H10K 10/466 |
| | | | 257/40 |
| 2019/0296155 A1* | 9/2019 | Sawabe | H10B 12/31 |
| 2020/0013892 A1 | 1/2020 | Kataoka | |
| 2021/0305431 A1 | 9/2021 | Ishimaru | |
| 2022/0085212 A1 | 3/2022 | Sato | |
| 2022/0102352 A1* | 3/2022 | Lee | H10B 12/395 |
| 2022/0165737 A1* | 5/2022 | Pillarisetty | H10B 12/36 |
| 2022/0254932 A1 | 8/2022 | Suzuki | |

FOREIGN PATENT DOCUMENTS

| | | |
|---|---|---|
| JP | 2019117882 A | 7/2019 |
| JP | 2020009911 A | 1/2020 |
| TW | 202137417 A | 10/2021 |
| TW | 202213649 A | 4/2022 |
| WO | 2020254904 A1 | 12/2020 |

\* cited by examiner

AA' CROSS SECTION

GG' CROSS SECTION

HH' CROSS SECTION

JJ' CROSS SECTION

SEMICONDUCTOR DEVICE AND SEMICONDUCTOR MEMORY DEVICE

CROSS-REFERENCE TO RELATED APPLICATION

This application is based upon and claims the benefit of priority from Japanese Patent Application No. 2022-099891, filed Jun. 21, 2022, the entire contents of which are incorporated herein by reference.

FIELD

Embodiments described herein relate generally to a semiconductor device and a semiconductor memory device.

BACKGROUND

An oxide semiconductor transistor in which a channel is formed in an oxide semiconductor layer has excellent characteristics such as very low channel leakage current during off operation. Therefore, the oxide semiconductor transistor may be used as a switching transistor of a dynamic random access memory (DRAM) memory cell.

DETAILED DESCRIPTION

Figure 1:
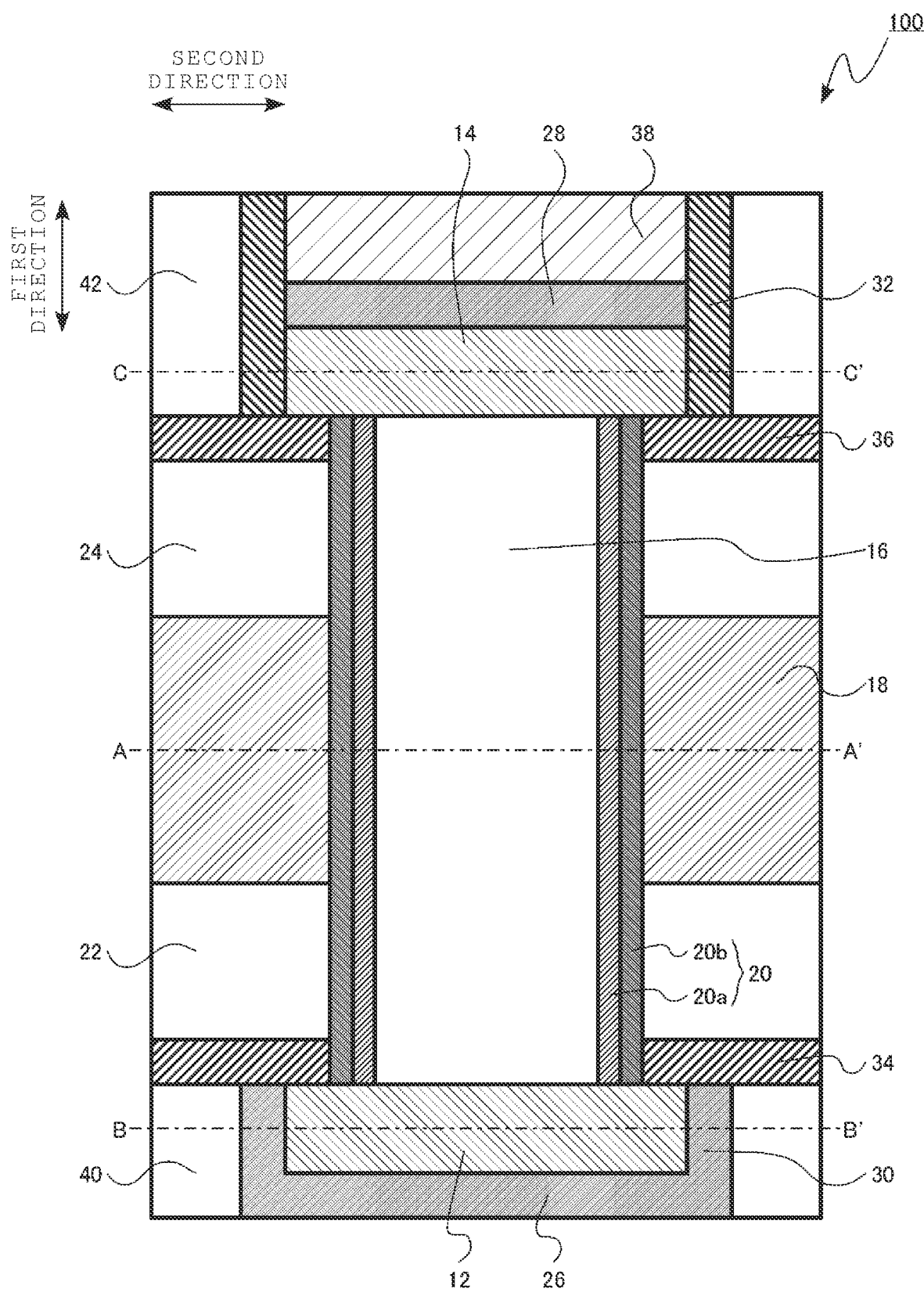
FIG. 1 is a schematic cross-sectional view of a semiconductor device according to a first embodiment.

Embodiments concern a semiconductor device having excellent transistor characteristics for various applications.

In general, according to one embodiment, there is provided a semiconductor device including a first electrode comprising a metal oxide, a second electrode comprising a metal oxide, an oxide semiconductor layer provided between the first electrode and the second electrode in a first direction. A gate electrode surrounds the oxide semiconductor layer in a second direction intersecting the first direction. A gate insulating layer is provided between the gate electrode and the oxide semiconductor layer in the second direction and comprises silicon (Si) and nitrogen (N). A first insulating layer is provided between the first electrode and the gate electrode in the first direction. A second insulating layer is provided between the second electrode and the gate electrode in the first direction. A first conductive layer is in contact with a surface of the first electrode opposite to the oxide semiconductor layer and comprises a metal, a metal nitride, or a metal carbide as a conductor. A second conductive layer is in contact with a surface of the second electrode opposite to the oxide semiconductor layer and comprises a metal, a metal nitride, or a metal carbide as a conductor. A first layer surrounds the first electrode in the second direction. The first layer is in contact with the first conductive layer and comprises at least one insulator selected from a group consisting of aluminum oxide, magnesium oxide, gallium oxide, germanium oxide, yttrium oxide, zirconium oxide, lanthanum oxide, hafnium oxide, tantalum oxide, silicon nitride, aluminum nitride, silicon oxynitride, and aluminum oxynitride or at least one conductor selected from a group consisting of metal, metal nitride, and metal carbide. A second layer surrounds the second electrode in the second direction. The second layer is in contact with the second conductive layer and comprises at least one insulator selected from a group consisting of aluminum oxide, magnesium oxide, gallium oxide, germanium oxide, yttrium oxide, zirconium oxide, lanthanum oxide, hafnium oxide, tantalum oxide, silicon nitride, aluminum nitride, silicon oxynitride, and aluminum oxynitride. Alternatively, the second layer is a conductor and comprises a metal, a metal nitride, or a metal carbide. A third insulating layer is provided between the first electrode and the first insulating layer. The third layer is in contact with the gate insulating layer and the first layer and comprises at least one insulator selected from a group consisting of aluminum oxide, magnesium oxide, gallium oxide, germanium oxide, yttrium oxide, zirconium oxide, lanthanum oxide, hafnium oxide, tantalum oxide, silicon nitride, aluminum nitride, silicon oxynitride, and aluminum oxynitride. A fourth insulating layer is provided between the second electrode and the second insulating layer. The fourth insulating layer is in contact with the gate insulating layer and the second layer and comprises at least one insulator selected from a group consisting of aluminum oxide, magnesium oxide, gallium oxide, germanium oxide, yttrium oxide, zirconium oxide, lanthanum oxide, hafnium oxide, tantalum oxide, silicon nitride, aluminum nitride, silicon oxynitride, and aluminum oxynitride.

Certain, non-limiting example embodiments of the present disclosure will be described with reference to the drawings. In the following, components, members, aspects, or the like that are the same or substantially the same are denoted by the same reference symbols, and once such a component, member, aspect, or the like has already been described repeated description may be omitted as appropriate.

In the description, the terms "on", "under", "upper", "lower", "above", or "below" may be used for convenience. But such terms such as "on", "under", "upper", "lower", "above", or "below" are indicate relative positional relationships in the drawings, and are not necessarily terms that define a positional relationship to gravity.

The qualitative analysis and quantitative analysis of chemical composition of components, materials, and the like configuring a semiconductor device and/or a semiconductor memory device can be performed, for example, by secondary ion mass spectrometry (SIMS), energy dispersive X-ray spectroscopy (EDX), and Rutherford back-scattering spectroscopy (RBS). Further, for example, a transmission electron microscope (TEM) can be used to measure a thickness of components, materials, and the like of a semiconductor device or a semiconductor memory device as well as distances between such components, materials, and members and characteristics or properties such as crystal grain sizes, or the like.

First Embodiment

A semiconductor device according to a first embodiment includes a first electrode containing a metal oxide, a second electrode containing a metal oxide, an oxide semiconductor layer provided between the first electrode and the second electrode, a gate electrode surrounding the oxide semiconductor layer, a gate insulating layer provided between the gate electrode and the oxide semiconductor layer and containing silicon (Si) and nitrogen (N), a first insulating layer provided between the first electrode and the gate electrode, a second insulating layer provided between the second electrode and the gate electrode, a first conductive layer being in contact with a surface of the first electrode opposite to the oxide semiconductor layer and containing at least one conductor selected from a group consisting of metal, metal nitride, and metal carbide, a second conductive layer being in contact with a surface of the second electrode opposite to the oxide semiconductor layer and containing at least one conductor selected from a group consisting of metal, metal nitride, and metal carbide, a first layer surrounding the first electrode in a first cross section perpendicular to a first direction from the first electrode to the second electrode, being in contact with the first conductive layer, and containing at least one insulator selected from a group consisting of aluminum oxide, magnesium oxide, gallium oxide, germanium oxide, yttrium oxide, zirconium oxide, lanthanum oxide, hafnium oxide, tantalum oxide, silicon nitride, aluminum nitride, silicon oxynitride, and aluminum oxynitride or at least one conductor selected from a group consisting of metal, metal nitride, and metal carbide, a second layer surrounding the second electrode in a second cross section perpendicular to the first direction, being in contact with the second conductive layer, and containing at least one insulator selected from a group consisting of aluminum oxide, magnesium oxide, gallium oxide, germanium oxide, yttrium oxide, zirconium oxide, lanthanum oxide, hafnium oxide, tantalum oxide, silicon nitride, aluminum nitride, silicon oxynitride, and aluminum oxynitride or at least one conductor selected from a group consisting of metal, metal nitride, and metal carbide, a third insulating layer provided between the first electrode and the first insulating layer, being in contact with the gate insulating layer and the first layer, and containing at least one insulator selected from a group consisting of aluminum oxide, magnesium oxide, gallium oxide, germanium oxide, yttrium oxide, zirconium oxide, lanthanum oxide, hafnium oxide, tantalum oxide, silicon nitride, aluminum nitride, silicon oxynitride, and aluminum oxynitride, and a fourth insulating layer provided between the second electrode and the second insulating layer, being in contact with the gate insulating layer and the second layer, and containing at least one insulator selected from a group consisting of aluminum oxide, magnesium oxide, gallium oxide, germanium oxide, yttrium oxide, zirconium oxide, lanthanum oxide, hafnium oxide, tantalum oxide, silicon nitride, aluminum nitride, silicon oxynitride, and aluminum oxynitride.

Figure 2:
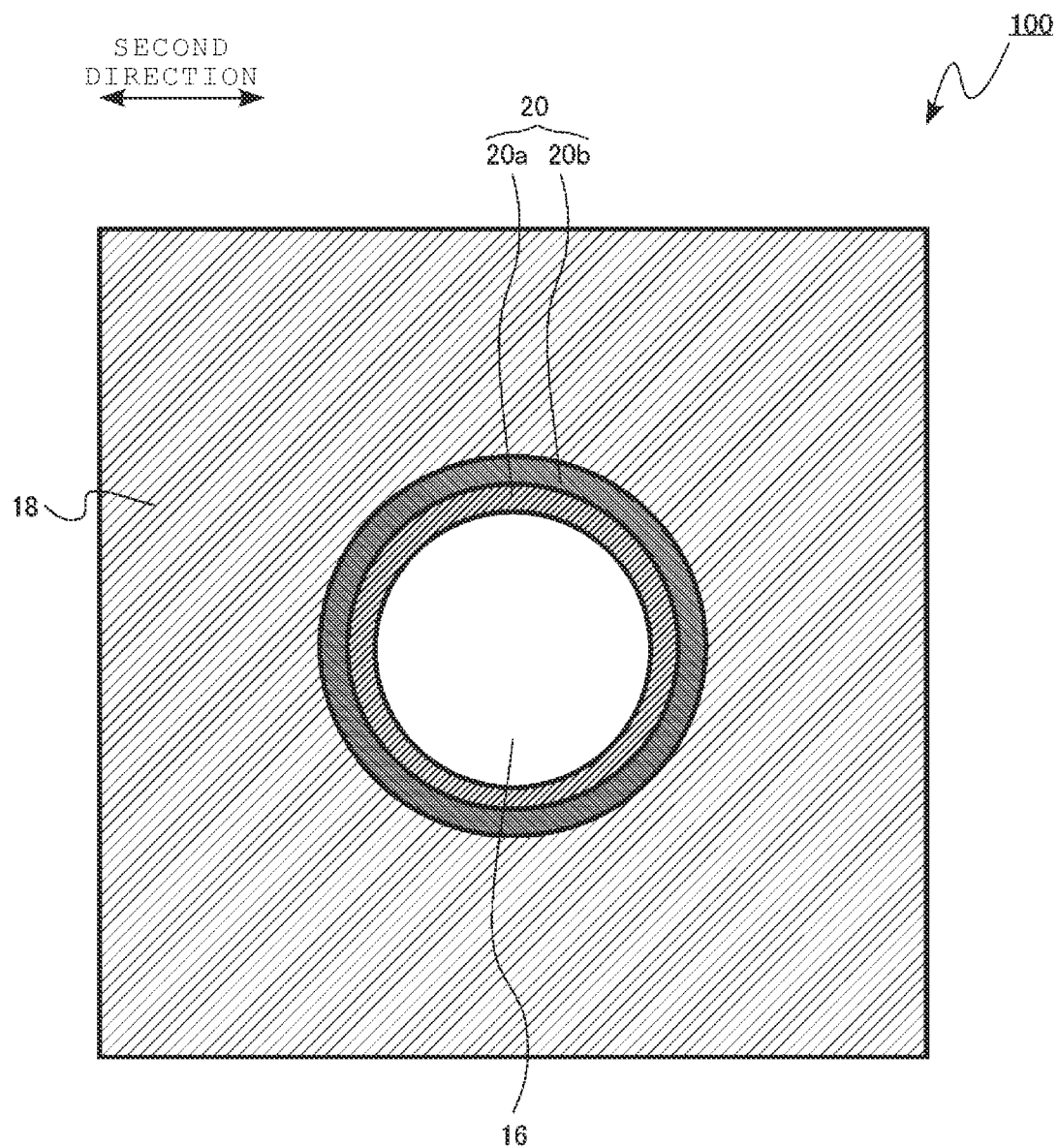
FIG. 2 is a schematic cross-sectional view of a semiconductor device according to a first embodiment.
Figure 3:
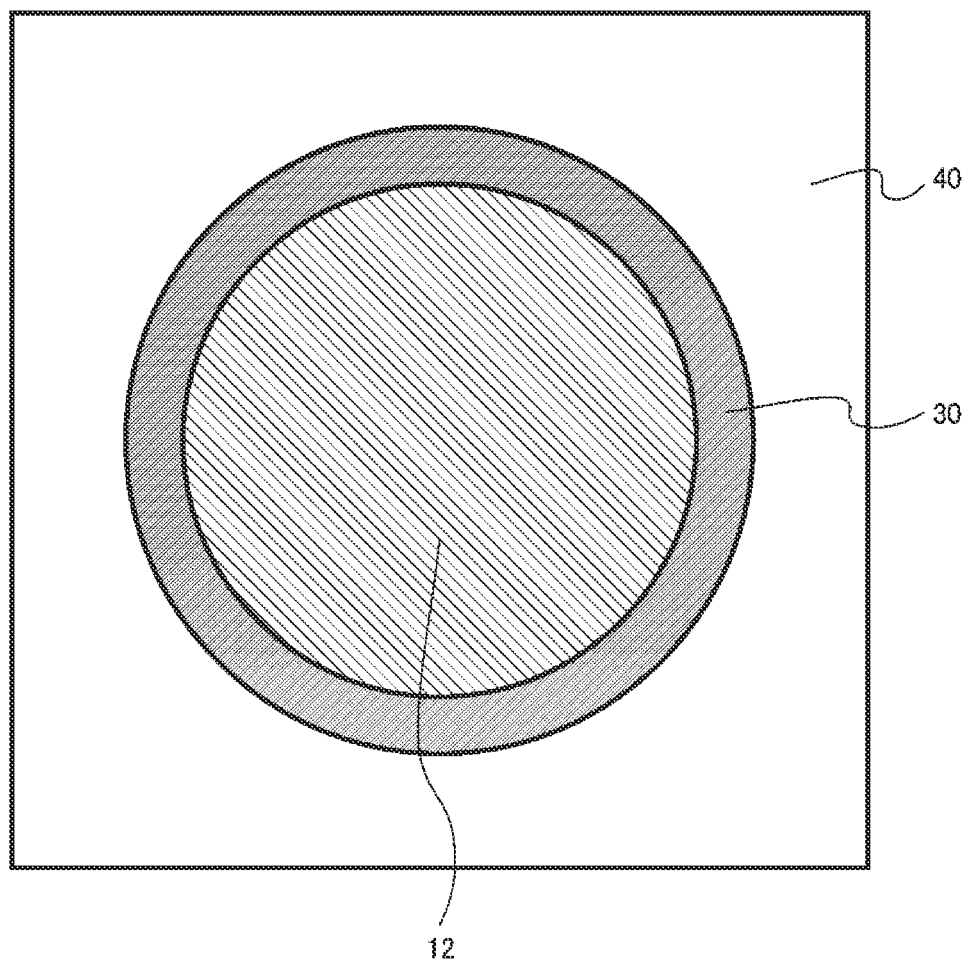
FIG. 3 is a schematic cross-sectional view of the semiconductor device according to a first embodiment.
Figure 4:
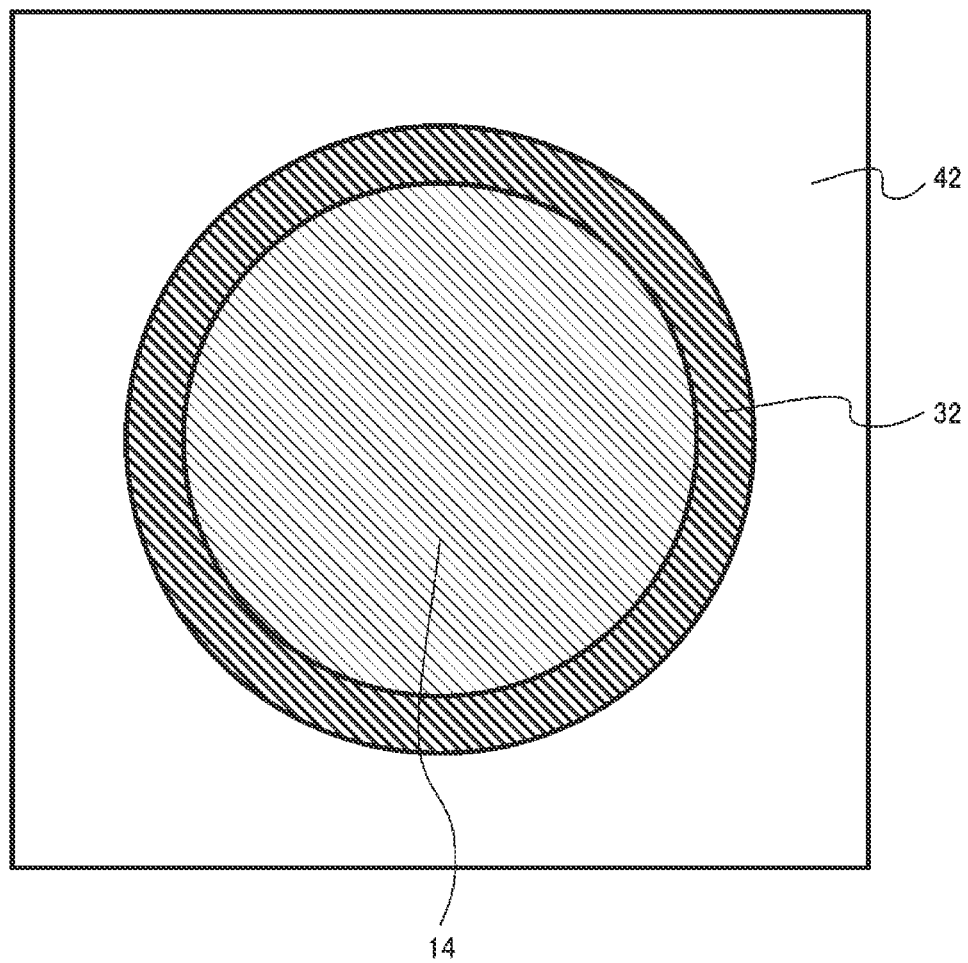
FIG. 4 is a schematic cross-sectional view of a semiconductor device according to a first embodiment.

FIGS. 1, 2, 3, and 4 are schematic cross-sectional views of the semiconductor device according to the first embodiment. FIG. 2 is a cross-sectional view taken along line AA' of FIG. 1. FIG. 3 is a cross-sectional view taken along line BB' of FIG. 1. FIG. 4 is a cross-sectional view taken along line CC' of FIG. 1. In FIG. 1, a vertical direction (also referred to as a first direction) is depicted. In FIG. 1, a horizontal direction (also referred to as a second direction) is depicted. The second direction is perpendicular to the first direction.

The cross section taken along line BB' is an example of what may be referred to as a first cross section. The cross section taken along line CC' is an example of what may be referred to as a second cross section.

The semiconductor device according to the first embodiment is a transistor 100. The transistor 100 is an oxide semiconductor transistor in which a channel is formed in an oxide semiconductor material. In the transistor 100, a gate electrode surrounds the oxide semiconductor layer in which the channel is formed. The transistor 100 is a so-called surrounding gate transistor (SGT). The transistor 100 is also a so-called vertical transistor.

The transistor 100 includes a lower electrode 12, an upper electrode 14, an oxide semiconductor layer 16, a gate electrode 18, a gate insulating layer 20, a lower insulating layer 22, an upper insulating layer 24, a lower barrier conductive layer 26, an upper barrier conductive layer 28, a first sidewall barrier layer 30, a second sidewall barrier layer 32, a lower barrier insulating layer 34, an upper barrier insulating layer 36, a metal layer 38, a lower interlayer insulating layer 40, and an upper interlayer insulating layer 42. The gate insulating layer 20 includes a first gate insulating film 20*a* and a second gate insulating film 20*b*.

The lower electrode 12 is an example of a first electrode. The upper electrode 14 is an example of a second electrode. The lower insulating layer 22 is an example of a first insulating layer. The upper insulating layer 24 is an example of a second insulating layer. The lower barrier conductive layer 26 is an example of a first conductive layer. The upper barrier conductive layer 28 is an example of a second conductive layer. The first sidewall barrier layer 30 is an example of a first layer. The second sidewall barrier layer 32 is an example of a second layer. The lower barrier insulating layer 34 is an example of a third insulating layer. The upper barrier insulating layer 36 is an example of a fourth insulating layer. The first gate insulating film 20a is an example of a first film. The second gate insulating film 20b is an example of a second film.

The lower electrode 12 is provided under the oxide semiconductor layer 16. The lower electrode 12 is electrically connected to the oxide semiconductor layer 16. The lower electrode 12 is in contact with the oxide semiconductor layer 16, for example. The lower electrode 12 functions as a source electrode or drain electrode of the transistor 100.

The lower electrode 12 is a conductor. The lower electrode 12 comprises a conductive metal oxide. The lower electrode 12 comprises, for example, indium (In), tin (Sn), and oxygen (O). The lower electrode 12 comprises, for example, an indium tin oxide. The lower electrode 12 is, for example, an indium tin oxide layer.

The upper electrode 14 is provided on the oxide semiconductor layer 16. The upper electrode 14 is electrically connected to the oxide semiconductor layer 16. The upper electrode 14 is in contact with the oxide semiconductor layer 16, for example. The upper electrode 14 functions as a source electrode or drain electrode of transistor 100.

The upper electrode 14 is a conductor. The upper electrode 14 comprises a conductive metal oxide. The upper electrode 14 comprises, for example, indium (In), tin (Sn), and oxygen (O). The upper electrode 14 comprises, for example, an indium tin oxide. The upper electrode 14 is, for example, an indium tin oxide layer.

The lower electrode 12 and the upper electrode 14, for example, contain the same material. Metal oxides contained in the lower electrode 12 and the upper electrode 14 contain, for example, indium (In) and tin (Sn). The lower electrode 12 and the upper electrode 14 contain, for example, an indium tin oxide. The lower electrode 12 and the upper electrode 14 are, for example, indium tin oxide layers.

The oxide semiconductor layer 16 is provided between the lower electrode 12 and the upper electrode 14. The oxide semiconductor layer 16 is in contact with the lower electrode 12, for example. The oxide semiconductor layer 16 is in contact with the upper electrode 14, for example.

In the oxide semiconductor layer 16, a channel that serves as a current path when the transistor 100 is turned on is formed.

The oxide semiconductor layer 16 is an oxide semiconductor material. The oxide semiconductor layer 16 is amorphous, for example.

In some examples, the oxide semiconductor layer 16 comprises oxygen and at least one element selected from indium (In), gallium (Ga), silicon (Si), aluminum (Al), and tin (Sn), zinc (Zn). The oxide semiconductor layer 16 comprises, for example, indium (In), gallium (Ga), zinc (Zn) and oxygen (O). The oxide semiconductor layer 16 comprises, for example, an indium gallium zinc oxide. The oxide semiconductor layer 16 is, for example, an indium gallium zinc oxide layer.

In some examples, the oxide semiconductor layer 16 comprises oxygen and at least one element selected from titanium (Ti), zinc (Zn), and tungsten (W). The oxide semiconductor layer 16 comprises, for example, a titanium oxide, a zinc oxide, or a tungsten oxide. The oxide semiconductor layer 16 can be, for example, a titanium oxide layer, a zinc oxide layer, or a tungsten oxide layer.

The oxide semiconductor layer 16 can have a chemical composition that is different from the chemical composition of the lower electrode 12 and the upper electrode 14.

The oxide semiconductor layer 16 contains oxygen vacancies therein. These oxygen vacancies in the oxide semiconductor layer 16 function as donors.

The dimension of the oxide semiconductor layer 16 in the first direction is, for example, 80 nm or more and 200 nm or less. The dimension of the oxide semiconductor layer 16 in the second direction is, for example, 20 nm or more and 100 nm or less.

In this context, the first direction is a direction from the lower electrode 12 to the upper electrode 14, and the second direction is a direction perpendicular to the first direction.

The gate electrode 18 faces the oxide semiconductor layer 16. The gate electrode 18 is provided such that the position coordinates thereof in the first direction are values between the position coordinates of the lower electrode 12 and the upper electrode 14 in the first direction.

As illustrated in FIG. 2, the gate electrode 18 surrounds the oxide semiconductor layer 16 in a cross section perpendicular to the first direction. The gate electrode 18 is provided around the oxide semiconductor layer 16.

The gate electrode 18 is a conductor. The gate electrode 18 is, for example, metal, a metal compound, or a semiconductor. The gate electrode 18 comprises, for example, tungsten (W). The gate electrode 18 is, for example, a tungsten layer.

The length of the gate electrode 18 in the first direction is, for example, 20 nm or more and 100 nm or less.

The gate insulating layer 20 is provided between the oxide semiconductor layer 16 and the gate electrode 18. The gate insulating layer 20 surrounds the oxide semiconductor layer 16 in a cross section perpendicular to the first direction. The gate insulating layer 20 is provided between the lower electrode 12 and the upper electrode 14. The gate insulating layer 20 is in contact with the lower barrier insulating layer 34 and the upper barrier insulating layer 36. The gate insulating layer 20 is in contact with the lower electrode 12 and the upper electrode 14, for example.

The gate insulating layer 20 comprises silicon (Si) and nitrogen (N). The gate insulating layer 20 comprises, for example, a silicon nitride.

The gate insulating layer 20 comprises the first gate insulating film 20a and the second gate insulating film 20b. The second gate insulating film 20b is provided between the first gate insulating film 20a and the gate electrode 18.

The second gate insulating film 20b is in contact with the lower electrode 12 and the upper electrode 14, for example. The second gate insulating film 20b is in contact with the lower barrier insulating layer 34 and the upper barrier insulating layer 36, for example.

The first gate insulating film 20a is, for example, an oxide. The first gate insulating film 20a comprises, for example, silicon (Si) and oxygen (O). The first gate insulating film 20a comprises, for example, a silicon oxide. The first gate insulating film 20a is, for example, a silicon oxide film.

The second gate insulating film 20b is, for example, a nitride. The second gate insulating film 20b comprises, for example, silicon (Si) and nitrogen (N). The second gate insulating film 20b comprises, for example, silicon nitride. The second gate insulating film 20b is, for example, a silicon nitride film.

The thickness of the gate insulating layer 20 is, for example, 2 nm or more and 10 nm or less.

The lower insulating layer 22 is provided above the lower electrode 12. The lower insulating layer 22 is provided between the lower electrode 12 and the gate electrode 18.

The lower insulating layer 22 surrounds the oxide semiconductor layer 16 on a plane perpendicular to the first direction. The lower insulating layer 22 surrounds the gate insulating layer 20 on a plane perpendicular to the first direction.

The lower insulating layer 22 is an insulator. The lower insulating layer 22 is, for example, an oxide, a nitride, or an oxynitride. The lower insulating layer 22 comprises, for example, silicon (Si) and oxygen (O). The lower insulating layer 22 comprises, for example, a silicon oxide. The lower insulating layer 22 is, for example, a silicon oxide layer.

The upper insulating layer 24 is provided on the gate electrode 18. The upper insulating layer 24 is provided, for example, between the gate electrode 18 and the upper electrode 14.

The upper insulating layer 24 surrounds the oxide semiconductor layer 16 on a plane perpendicular to the first direction. The upper insulating layer 24 surrounds the gate insulating layer 20 on a plane perpendicular to the first direction.

The upper insulating layer 24 is an insulator. The upper insulating layer 24 is, for example, an oxide, a nitride, or an oxynitride. The upper insulating layer 24 comprises, for example, silicon (Si) and oxygen (O). The upper insulating layer 24 comprises, for example, a silicon oxide. The upper insulating layer 24 is, for example, a silicon oxide layer.

The lower barrier conductive layer 26 is provided under the lower electrode 12. The lower barrier conductive layer 26 is in contact with a surface of the lower electrode 12 opposite to the oxide semiconductor layer 16.

The lower barrier conductive layer 26 has a function of preventing desorption of oxygen from the lower electrode 12 or preventing penetration of oxygen into the lower electrode 12. The lower barrier conductive layer 26 has, for example, a function of preventing oxidation of a metal layer (not illustrated) provided under the lower barrier conductive layer 26.

The lower barrier conductive layer 26 is a conductor. The lower barrier conductive layer 26 comprises a material different from the lower electrode 12. The lower barrier conductive layer 26 is formed of a material different from that of the lower electrode 12. The lower barrier conductive layer 26 comprises at least one of a metal, a metal nitride, or a metal carbide.

In some examples, the lower barrier conductive layer 26 comprises one metal element selected from tungsten (W), molybdenum (Mo), copper (Cu), aluminum (Al), titanium (Ti), and tantalum (Ta). The lower barrier conductive layer 26 can be, for example, a tungsten layer, a molybdenum layer, a copper layer, an aluminum layer, a titanium layer, or a tantalum layer.

In some examples, the lower barrier conductive layer 26 comprises nitrogen and at least one metal element selected from titanium (Ti), tungsten (W), molybdenum (Mo), and tantalum (Ta). The lower barrier conductive layer 26 comprises, for example, a titanium nitride, a tungsten nitride, a molybdenum nitride, or a tantalum nitride. The lower barrier conductive layer 26 can be, for example, a titanium nitride layer, a tungsten nitride layer, a molybdenum nitride layer, or a tantalum nitride layer.

In some examples, the lower barrier conductive layer 26 comprises carbon and at least one metal element selected from titanium (Ti), tungsten (W), molybdenum (Mo), and tantalum (Ta). The lower barrier conductive layer 26 comprises, for example, a titanium carbide, a tungsten carbide, a molybdenum carbide, or a tantalum carbide. The lower barrier conductive layer 26 can be, for example, a titanium carbide layer, a tungsten carbide layer, a molybdenum carbide layer, or a tantalum carbide layer.

The lower barrier conductive layer 26 is formed of a material having lower oxygen permeability than the lower electrode 12, for example. The lower barrier conductive layer 26 is formed of a material having the lower oxygen permeability than an indium tin oxide, for example.

The lower barrier conductive layer 26 is formed of a material having the lower oxygen permeability than the lower interlayer insulating layer 40, for example. The lower barrier conductive layer 26 is formed of, for example, a material having the lower oxygen permeability than a silicon oxide.

The upper barrier conductive layer 28 is provided on the upper electrode 14. The upper barrier conductive layer 28 is in contact with a surface of the upper electrode 14 opposite to the oxide semiconductor layer 16.

The upper barrier conductive layer 28 has a function of preventing desorption of oxygen from the upper electrode 14 or preventing penetration of oxygen into the upper electrode 14. The upper barrier conductive layer 28 has, for example, a function of preventing oxidation of a metal layer 38 provided above the upper electrode 14.

The upper barrier conductive layer 28 is a conductor. The upper barrier conductive layer 28 comprises a material different from the upper electrode 14. The upper barrier conductive layer 28 is formed of a material different from that of the upper electrode 14. The upper barrier conductive layer 28 comprises at least one of a metal, a metal nitride, or a metal carbide.

In some examples, the upper barrier conductive layer 28 comprises one metal element selected from tungsten (W), molybdenum (Mo), copper (Cu), aluminum (Al), titanium (Ti), and tantalum (Ta). The upper barrier conductive layer 28 can be, for example, a tungsten layer, a molybdenum layer, a copper layer, an aluminum layer, a titanium layer, or a tantalum layer.

In some examples, the upper barrier conductive layer 28 comprises nitrogen and at least one metal element selected from titanium (Ti), tungsten (W), molybdenum (Mo), and tantalum (Ta). The upper barrier conductive layer 28 comprises, for example, a titanium nitride, a tungsten nitride, a molybdenum nitride, or a tantalum nitride. The upper barrier conductive layer 28 can be, for example, a titanium nitride layer, a tungsten nitride layer, a molybdenum nitride layer, or a tantalum nitride layer.

In some examples, the upper barrier conductive layer 28 comprises carbon and at least one metal element selected from titanium (Ti), tungsten (W), molybdenum (Mo), and tantalum (Ta). The upper barrier conductive layer 28 comprises, for example, a titanium carbide, a tungsten carbide, a molybdenum carbide, or a tantalum carbide. The upper barrier conductive layer 28 can be, for example, a titanium carbide layer, a tungsten carbide layer, a molybdenum carbide layer, or a tantalum carbide layer.

The upper barrier conductive layer 28 is formed of a material that has the lower oxygen permeability than the upper electrode 14, for example. The upper barrier conductive layer 28 is formed of a material having the lower oxygen permeability than an indium tin oxide, for example.

The upper barrier conductive layer 28 is formed of a material having the lower oxygen permeability than the upper interlayer insulating layer 42, for example. The upper barrier conductive layer 28 is formed of a material with the lower oxygen permeability than silicon oxide, for example.

The first sidewall barrier layer 30 surrounds side surfaces of the lower electrode 12. As illustrated in FIG. 3, the first sidewall barrier layer 30 surrounds the lower electrode 12 in a first cross section perpendicular to the first direction. The cross section taken along line BB' illustrated in FIG. 3 is an example of the first cross section.

The first sidewall barrier layer 30 is in contact with the lower barrier conductive layer 26 and the lower barrier insulating layer 34. The first sidewall barrier layer 30 is in contact with the lower electrode 12, for example. The first sidewall barrier layer 30 is in contact with the side surfaces of the lower electrode 12, for example.

The first sidewall barrier layer 30 has a function of preventing desorption of oxygen from the lower electrode 12 or preventing penetration of oxygen into the lower electrode 12.

The first sidewall barrier layer 30 is, for example, a conductor. The first sidewall barrier layer 30 comprises a material different from lower electrode 12. The first sidewall barrier layer 30 is formed of a material different from that of the lower electrode 12.

In some examples, the first sidewall barrier layer 30 comprises the same material as the lower barrier conductive layer 26. That is, the first sidewall barrier layer 30 is formed of the same material as the lower barrier conductive layer 26, for example. The first sidewall barrier layer 30 can be continuous with the lower barrier conductive layer 26 in some examples. In some examples, the first sidewall barrier layer 30 comprises at least one of a metal, a metal nitride, or a metal carbide.

In some examples, the first sidewall barrier layer 30 comprises one metal element selected from tungsten (W), molybdenum (Mo), copper (Cu), aluminum (Al), titanium (Ti), and tantalum (Ta). The first sidewall barrier layer 30 can be, for example, a tungsten layer, a molybdenum layer, a copper layer, an aluminum layer, a titanium layer, or a tantalum layer.

In some examples, the first sidewall barrier layer 30 comprises nitrogen and at least one metal element selected from titanium (Ti), tungsten (W), molybdenum (Mo), and tantalum (Ta). The first sidewall barrier layer 30 comprises, for example, a titanium nitride, a tungsten nitride, a molybdenum nitride, or a tantalum nitride. The first sidewall barrier layer 30 can be, for example, a titanium nitride layer, a tungsten nitride layer, a molybdenum nitride layer, or a tantalum nitride layer.

In some examples, the first sidewall barrier layer 30 comprises carbon and at least one metal element selected from titanium (Ti), tungsten (W), molybdenum (Mo), and tantalum (Ta). The lower barrier conductive layer 26 comprises, for example, a titanium carbide, a tungsten carbide, a molybdenum carbide, or a tantalum carbide. The first sidewall barrier layer 30 can be, for example, a titanium carbide layer, a tungsten carbide layer, a molybdenum carbide layer, or a tantalum carbide layer.

The first sidewall barrier layer 30 is formed of a material that has the lower oxygen permeability than the lower electrode 12, for example. The first sidewall barrier layer 30 is formed of a material having the lower oxygen permeability than an indium tin oxide, for example.

The first sidewall barrier layer 30 is formed of a material having the lower oxygen permeability than the lower interlayer insulating layer 40, for example. The first sidewall barrier layer 30 is formed of a material having the lower oxygen permeability than a silicon oxide, for example.

The second sidewall barrier layer 32 surrounds side surfaces of the upper electrode 14. As illustrated in FIG. 4, the second sidewall barrier layer 32 surrounds the upper electrode 14 in the second cross section perpendicular to the first direction. The cross section taken along line CC' illustrated in FIG. 4 is an example of the second cross section.

The second sidewall barrier layer 32 is in contact with the upper barrier conductive layer 28 and the upper barrier insulating layer 36. The second sidewall barrier layer 32 is in contact with the upper electrode 14, for example. The second sidewall barrier layer 32 is in contact with, for example, the side surfaces of the upper electrode 14 and the side surfaces of the upper barrier conductive layer 28.

The second sidewall barrier layer 32 has a function of preventing desorption of oxygen from the upper electrode 14 or preventing penetration of oxygen into the upper electrode 14.

The second sidewall barrier layer 32 is, for example, an insulator. The second sidewall barrier layer 32 comprises at least one insulator selected from a group consisting of aluminum oxide, magnesium oxide, gallium oxide, germanium oxide, yttrium oxide, zirconium oxide, lanthanum oxide, hafnium oxide, tantalum oxide, silicon nitride, aluminum nitride, silicon oxynitride, and aluminum oxynitride. The second sidewall barrier layer 32 can be, for example, an aluminum oxide layer, a magnesium oxide layer, a gallium oxide layer, a germanium oxide layer, an yttrium oxide layer, a zirconium oxide layer, a lanthanum oxide layer, a hafnium oxide layer, a tantalum oxide layer, a silicon nitride layer, an aluminum nitride layer, a silicon oxynitride layer, or an aluminum oxynitride layer.

The second sidewall barrier layer 32 is formed of a material having the lower oxygen permeability than the upper electrode 14, for example. The second sidewall barrier layer 32 is formed of a material having the lower oxygen permeability than an indium tin oxide, for example.

The second sidewall barrier layer 32 is formed of a material having the lower oxygen permeability than the upper interlayer insulating layer 42, for example. The second sidewall barrier layer 32 is formed of a material having the lower oxygen permeability than a silicon oxide, for example.

The lower barrier insulating layer 34 is provided between the lower electrode 12 and the lower insulating layer 22. The lower barrier insulating layer 34 surrounds the oxide semiconductor layer 16 and the gate insulating layer 20, for example, in a cross section perpendicular to the first direction.

The lower barrier insulating layer 34 is in contact with the gate insulating layer 20 and the first sidewall barrier layer 30. The lower barrier insulating layer 34 is in contact with the second gate insulating film 20b, for example. The lower barrier insulating layer 34 is in contact with the lower electrode 12, for example.

The lower barrier insulating layer 34 has a function of preventing desorption of oxygen from the lower electrode 12 or preventing penetration of oxygen into the lower electrode 12.

The lower barrier insulating layer 34 is an insulator. The lower barrier insulating layer 34 comprises a material different from the lower insulating layer 22. The lower barrier insulating layer 34 is formed of a material different from that of the lower insulating layer 22.

The lower barrier insulating layer 34 comprises at least one insulator selected from the group consisting of aluminum oxide, magnesium oxide, gallium oxide, germanium oxide, yttrium oxide, zirconium oxide, lanthanum oxide, hafnium oxide, tantalum oxide, silicon nitride, aluminum nitride, silicon oxynitride, and aluminum oxynitride. The lower barrier insulating layer 34 is, for example, an aluminum oxide layer, a magnesium oxide layer, a gallium oxide layer, a germanium oxide layer, an yttrium oxide layer, a zirconium oxide layer, a lanthanum oxide layer, a hafnium oxide layer, a tantalum oxide layer, a silicon nitride layer, an aluminum nitride layer, a silicon oxynitride layer or an aluminum oxynitride layer.

The lower barrier insulating layer 34 is formed of a material having the lower oxygen permeability than the lower electrode 12, for example. The lower barrier insulating layer 34 is formed of a material having the lower oxygen permeability than an indium tin oxide, for example.

The lower barrier insulating layer 34 is formed of a material having the lower oxygen permeability than the lower insulating layer 22, for example. The lower barrier insulating layer 34 is formed of a material having the lower oxygen permeability than a silicon oxide, for example.

The upper barrier insulating layer 36 is provided between the upper electrode 14 and the upper insulating layer 24. The upper barrier insulating layer 36 surrounds the oxide semiconductor layer 16 and the gate insulating layer 20, for example, in the cross section perpendicular to the first direction.

The upper barrier insulating layer 36 is in contact with the gate insulating layer 20 and the second sidewall barrier layer 32. The upper barrier insulating layer 36 is in contact with the second gate insulating film 20b, for example. The upper barrier insulating layer 36 is in contact with the upper electrode 14, for example.

The upper barrier insulating layer 36 has a function of preventing desorption of oxygen from the upper electrode 14 or preventing penetration of oxygen into the upper electrode 14.

The upper barrier insulating layer 36 is an insulator. The upper barrier insulating layer 36 comprises a material different from the upper insulating layer 24. The upper barrier insulating layer 36 is formed of a material different from that of the upper insulating layer 24.

The upper barrier insulating layer 36 comprises at least one insulator selected from the group consisting of aluminum oxide, magnesium oxide, gallium oxide, germanium oxide, yttrium oxide, zirconium oxide, lanthanum oxide, hafnium oxide, tantalum oxide, silicon nitride, aluminum nitride, silicon oxynitride, and aluminum oxynitride. The upper barrier insulating layer 36 is, for example, an aluminum oxide layer, a magnesium oxide layer, a gallium oxide layer, a germanium oxide layer, an yttrium oxide layer, a zirconium oxide layer, a lanthanum oxide layer, a hafnium oxide layer, a tantalum oxide layer, a silicon nitride layer, an aluminum nitride layer, a silicon oxynitride layer, or an aluminum oxynitride layer.

The upper barrier insulating layer 36 is formed of a material having the lower oxygen permeability than the upper electrode 14, for example. The upper barrier insulating layer 36 is formed of a material having the lower oxygen permeability than an indium tin oxide, for example.

The upper barrier insulating layer 36 is formed of a material having the lower oxygen permeability than the upper insulating layer 24, for example. The upper barrier insulating layer 36 is formed of a material having the lower oxygen permeability than a silicon oxide, for example.

The metal layer 38 is provided on the upper barrier conductive layer 28. The upper barrier conductive layer 28 is provided between the metal layer 38 and the upper electrode 14. The metal layer 38 is in contact with the upper barrier conductive layer 28, for example.

The metal layer 38 is a conductor. The metal layer 38 comprises a material different from the upper barrier conductive layer 28. The metal layer 38 is formed of a material different from that of the upper barrier conductive layer 28. The metal layer 38 comprises a metal.

The metal layer 38 comprises, for example, one metal element selected from a group consisting of tungsten (W), molybdenum (Mo), copper (Cu), aluminum (Al), titanium (Ti), and tantalum (Ta). The metal layer 38 is, for example, a tungsten layer, a molybdenum layer, a copper layer, an aluminum layer, a titanium layer, or a tantalum layer.

The lower interlayer insulating layer 40 is provided under the lower barrier insulating layer 34. The lower interlayer insulating layer 40 is provided on the side of the lower electrode 12.

The lower interlayer insulating layer 40 surrounds the lower electrode 12 in a cross section perpendicular to the first direction. The lower interlayer insulating layer 40 surrounds the first sidewall barrier layer 30 in the cross section perpendicular to the first direction.

The lower interlayer insulating layer 40 has a function of electrically insulating a wiring layer (not illustrated) and the lower electrode 12, for example.

The lower interlayer insulating layer 40 is an insulator. The lower interlayer insulating layer 40 is, for example, an oxide, a nitride, or an oxynitride. The lower interlayer insulating layer 40 comprises, for example, silicon (Si) and oxygen (O). The lower interlayer insulating layer 40 comprises, for example, a silicon oxide. The lower interlayer insulating layer 40 is, for example, a silicon oxide layer.

The upper interlayer insulating layer 42 is provided on the upper barrier insulating layer 36. The upper interlayer insulating layer 42 is provided on the side of the upper electrode 14.

The upper interlayer insulating layer 42 surrounds the upper electrode 14 in the cross section perpendicular to the first direction. The upper interlayer insulating layer 42 surrounds the second sidewall barrier layer 32 in the cross section perpendicular to the first direction.

The upper interlayer insulating layer 42 has a function of electrically insulating a wiring layer (not illustrated) and the upper electrode 14, for example.

The upper interlayer insulating layer 42 is an insulator. The upper interlayer insulating layer 42 is, for example, an oxide, a nitride, or an oxynitride. The upper interlayer insulating layer 42 comprises, for example, silicon (Si) and oxygen (O). The upper interlayer insulating layer 42 comprises, for example, a silicon oxide. The upper interlayer insulating layer 42 is, for example, a silicon oxide layer.

Next, an example of a method for manufacturing the semiconductor device according to the first embodiment will be described.

FIGS. 5, 6, 7, 8, 9, 10, 11, and 12 are schematic cross-sectional views illustrating an example of the method for manufacturing the semiconductor device according to the first embodiment. FIGS. 5 to 12 each illustrate a cross section corresponding to FIG. 1. FIGS. 5 to 12 are diagrams illustrating an example of a method for manufacturing the transistor 100.

Hereinafter, a case where the lower electrode 12 is an indium tin oxide layer, the upper electrode 14 is an indium tin oxide layer, the oxide semiconductor layer 16 is an indium gallium zinc oxide layer, the gate electrode 18 is a tungsten layer, the gate insulating layer 20 has a stacked structure of a silicon oxide film and a silicon nitride film, the lower insulating layer 22 is a silicon oxide layer, the upper insulating layer 24 is a silicon oxide layer, the lower barrier conductive layer 26 is a titanium nitride layer, the upper barrier conductive layer 28 is a titanium nitride layer, the first sidewall barrier layer 30 is a titanium nitride layer, the second sidewall barrier layer 32 is a silicon nitride layer, the lower barrier insulating layer 34 is a silicon nitride layer, the upper barrier insulating layer 36 is a silicon nitride layer, the metal layer 38 is a tungsten layer, the lower interlayer insulating layer 40 is a silicon oxide layer, and the upper interlayer insulating layer 42 is a silicon oxide layer will be described as an example.

First, a first silicon oxide film 51 is formed on a substrate (not illustrated). The first silicon oxide film 51 is formed by, for example, a chemical vapor deposition (CVD) method.

Next, an opening (not illustrated) is formed in the first silicon oxide film 51. The opening of the first silicon oxide film 51 is formed using, for example, a lithography method and a reactive ion etching (RIE) method.

Next, in the opening of the first silicon oxide film 51, a first titanium nitride film 52 and a first indium tin oxide film 53 are formed. The first titanium nitride film 52 and the first indium tin oxide film 53 are formed using, for example, the CVD method.

Figure 5:
FIGS. 5 to 12 are schematic cross-sectional views depicting aspects of a method for manufacturing a semiconductor device according to a first embodiment.

Next, the first titanium nitride film 52 and the first indium tin oxide film 53 on the surface of the first silicon oxide film 51 are removed (FIG. 5). For example, a chemical mechanical polishing (CMP) method is used for removing the first titanium nitride film 52 and the first indium tin oxide film 53.

The first silicon oxide film 51 finally becomes the lower interlayer insulating layer 40. The first titanium nitride film 52 finally becomes the lower barrier conductive layer 26 and the first sidewall barrier layer 30. The first indium tin oxide film 53 finally becomes the lower electrode 12.

Figure 6:
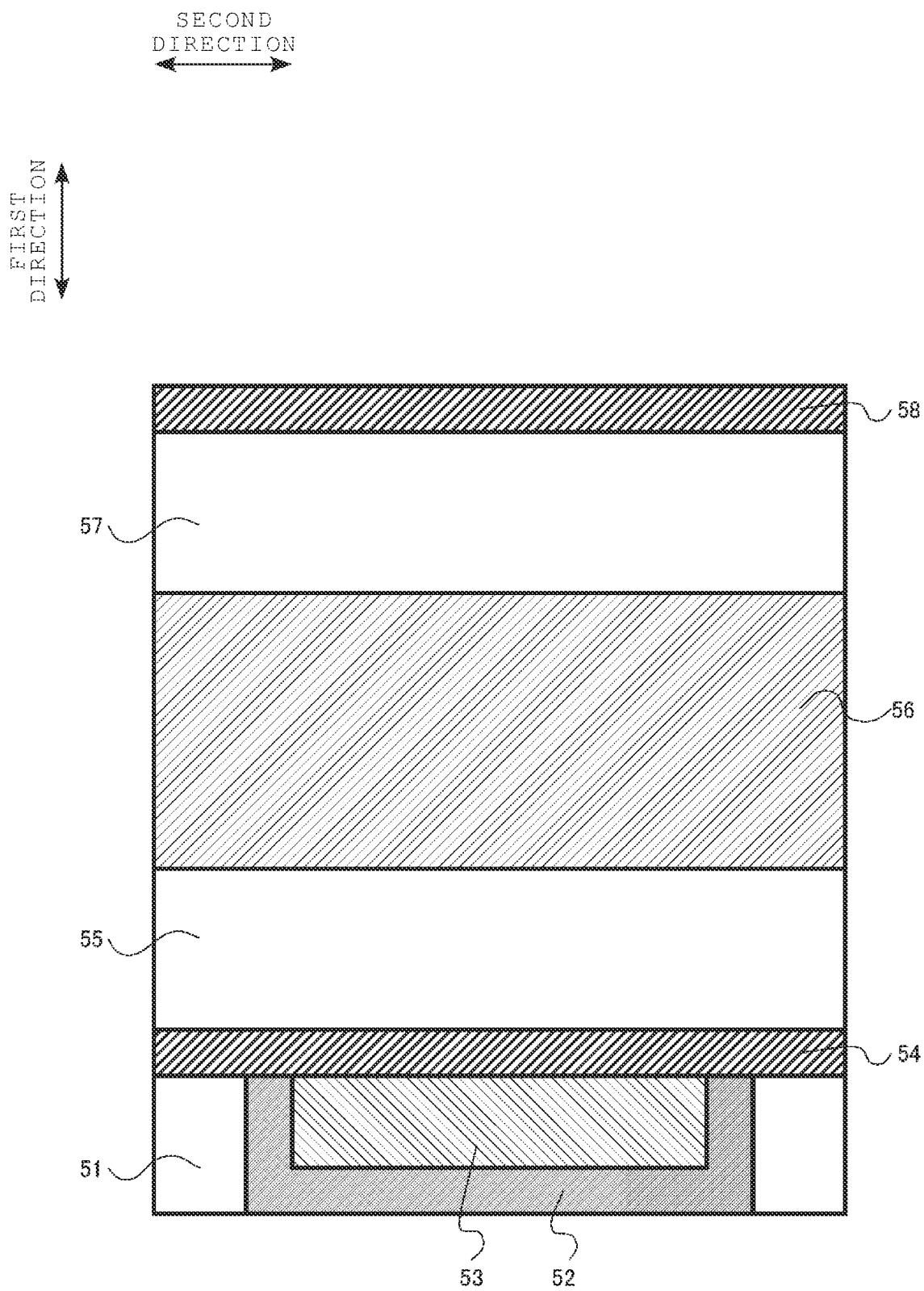

Next, on the first indium tin oxide film 53, a first silicon nitride film 54, a second silicon oxide film 55, a first tungsten film 56, a third silicon oxide film 57, and a second silicon nitride film 58 are stacked in this order in the first direction (FIG. 6). The first silicon nitride film 54, the second silicon oxide film 55, the first tungsten film 56, the third silicon oxide film 57, and the second silicon nitride film 58 are formed using, for example, the CVD method.

A part of the first silicon nitride film 54 finally becomes the lower barrier insulating layer 34. A part of the second silicon oxide film 55 finally becomes the lower insulating layer 22. A part of the first tungsten film 56 finally becomes the gate electrode 18. A part of the third silicon oxide film 57 finally becomes the upper insulating layer 24. A part of the second silicon nitride film 58 finally becomes the upper barrier insulating layer 36.

Figure 7:
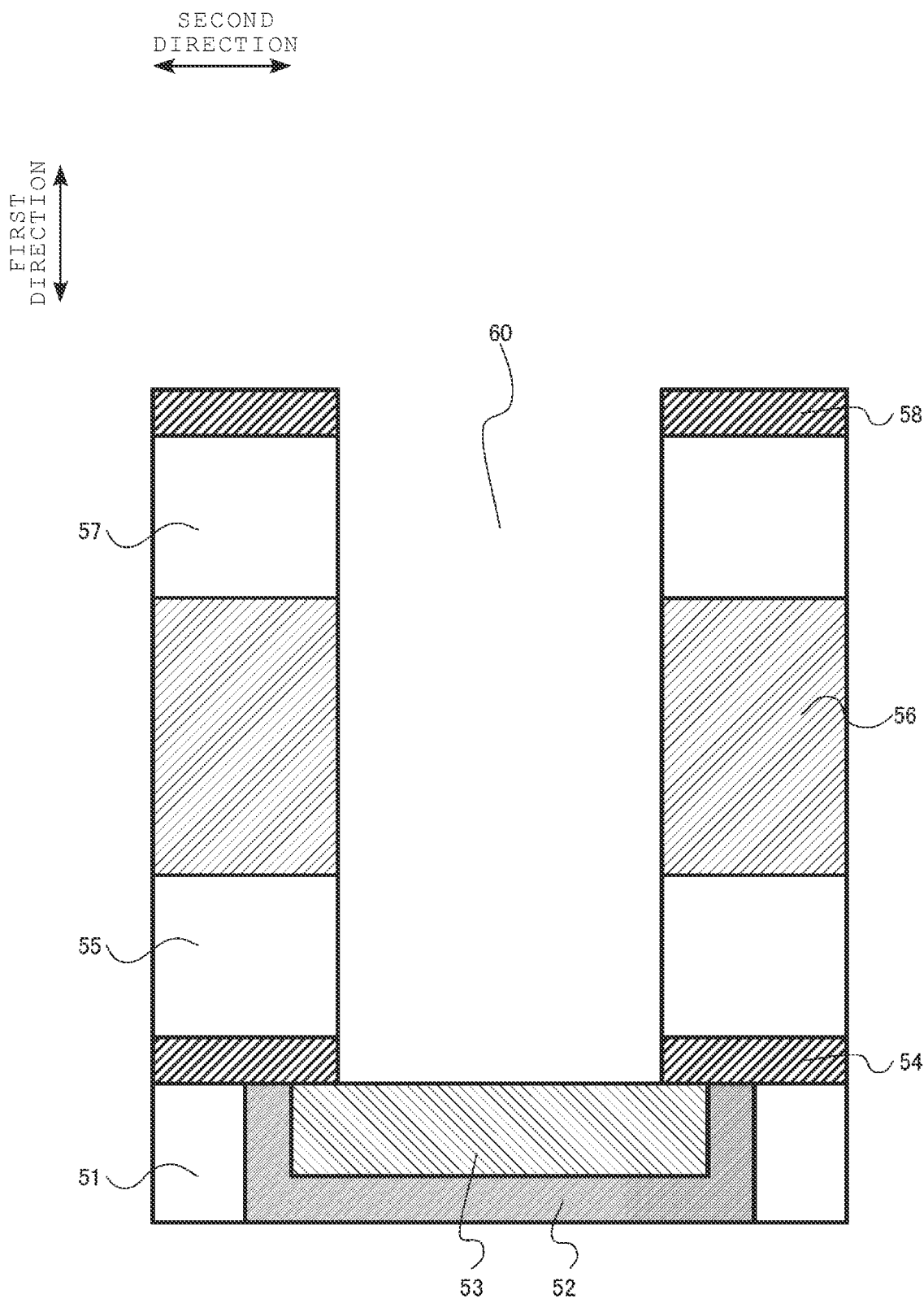

Next, an opening 60 extending from the surface of the second silicon nitride film 58 to reach the first indium tin oxide film 53 is formed by penetrating through the second silicon nitride film 58, the third silicon oxide film 57, the first tungsten film 56, the second silicon oxide film 55, and the first silicon nitride film 54 (FIG. 7). The opening 60 is formed using, for example, the lithography method and the RIE method.

Figure 8:
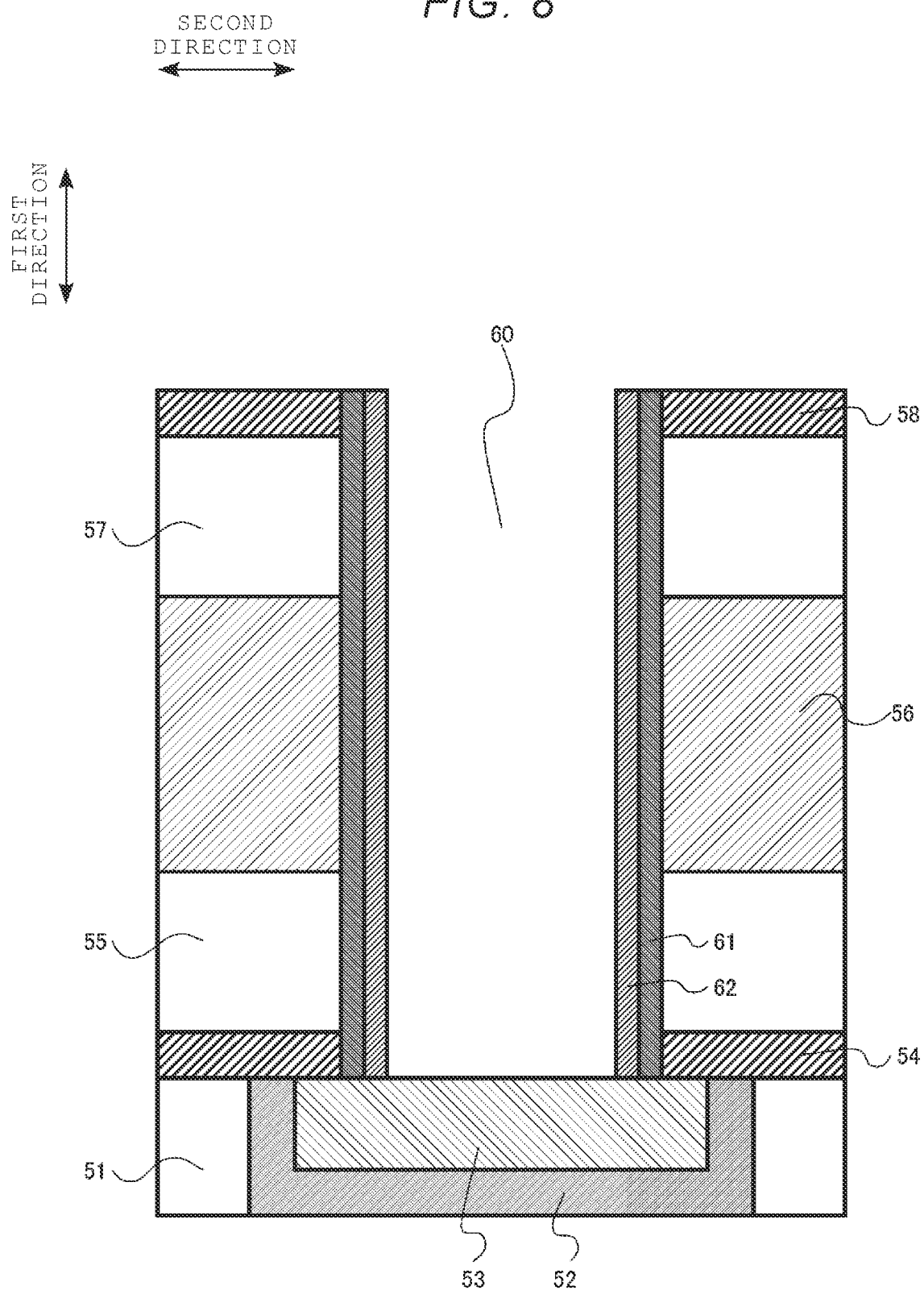

Next, a third silicon nitride film 61 and a fourth silicon oxide film 62 are formed on inner side surfaces of the opening 60 (FIG. 8). The third silicon nitride film 61 and the fourth silicon oxide film 62 are formed by, for example, deposition by the CVD method and etching by the RIE method. The third silicon nitride film 61 finally becomes the second gate insulating film 20b. The fourth silicon oxide film 62 finally becomes the first gate insulating film 20a.

Figure 9:
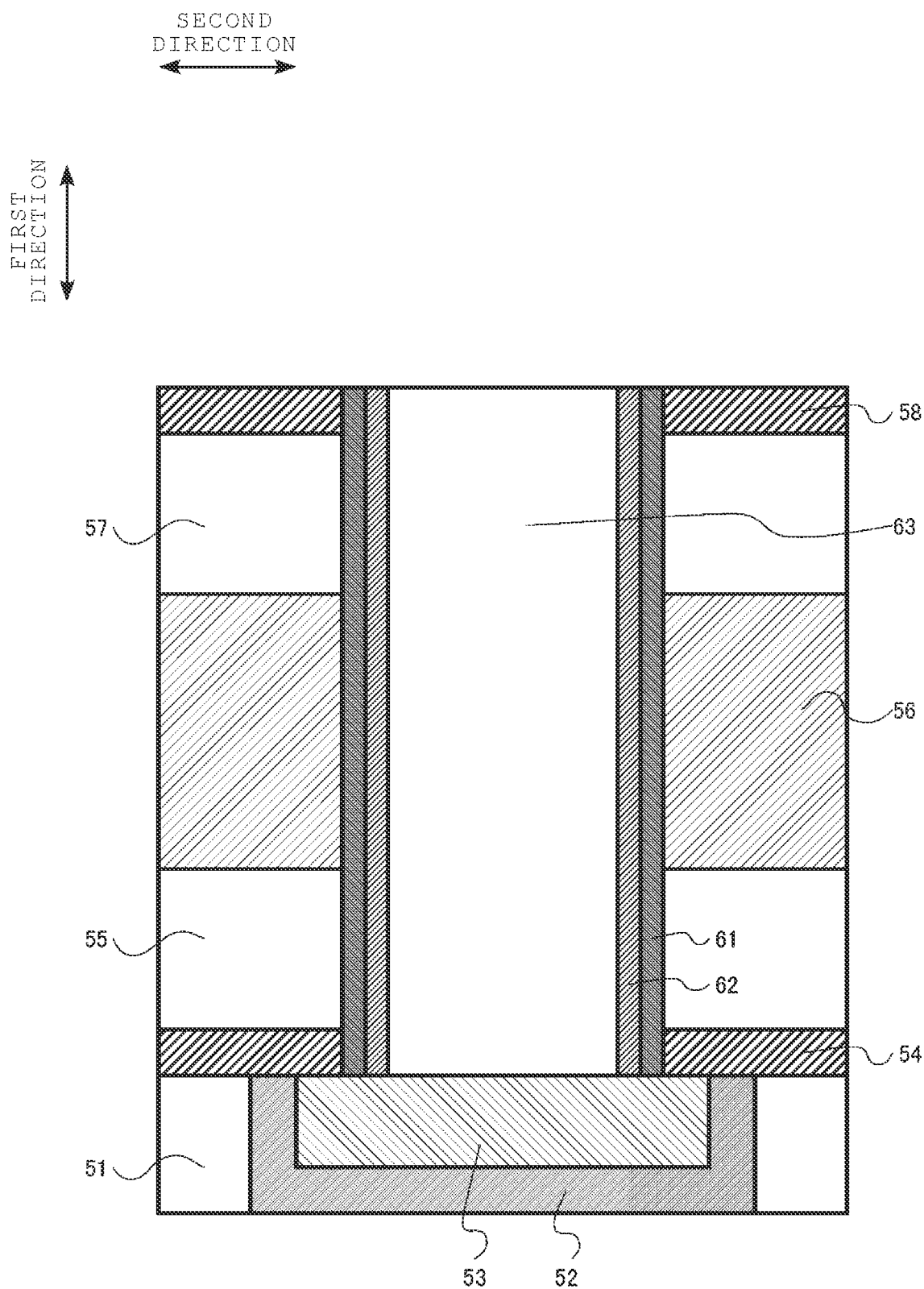

Next, the opening 60 is filled with an indium gallium zinc oxide film 63 (FIG. 9). The indium gallium zinc oxide film 63 finally becomes the oxide semiconductor layer 16. The indium gallium zinc oxide film 63 is deposited, for example, by the CVD method, and then a part of an upper portion thereof is removed by the CMP method.

Next, on the indium gallium zinc oxide film 63, a second indium tin oxide film 64, a second titanium nitride film and a second tungsten film 66 are formed in this order. The second indium tin oxide film 64, the second titanium nitride film and the second tungsten film 66 are formed using, for example, the CVD method.

Figure 10:
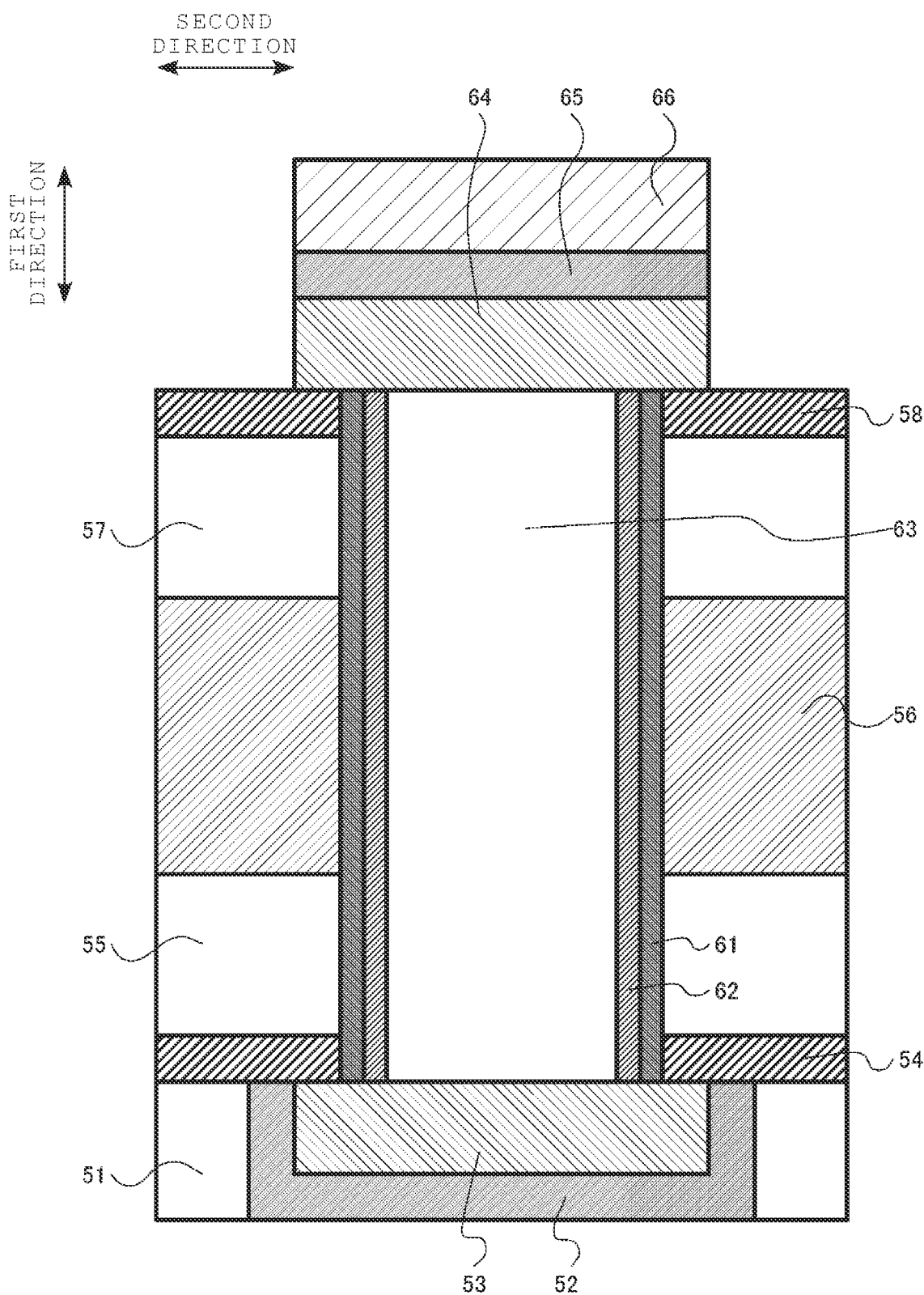

Next, the second indium tin oxide film 64, the second titanium nitride film 65, and the second tungsten film 66 are patterned (FIG. 10). The patterning of the second indium tin oxide film 64, the second titanium nitride film 65, and the second tungsten film 66 is performed using, for example, the lithography method and the RIE method.

The second indium tin oxide film 64 finally becomes the upper electrode 14. The second titanium nitride film 65 finally becomes the upper barrier conductive layer 28. The second tungsten film 66 finally becomes the metal layer 38.

Next, a heat treatment for adjusting an amount of oxygen vacancies in the indium gallium zinc oxide film 63 is performed. For example, when it is desired to increase the amount of oxygen vacancies, heat treatment is performed in a non-oxidizing atmosphere to accelerate desorption of oxygen from the indium gallium zinc oxide film 63. For example, when it is desired to reduce the amount of oxygen vacancies, heat treatment is performed in an oxidizing atmosphere to accelerate supply of oxygen to the indium gallium zinc oxide film 63.

The second indium tin oxide film 64 serves as a path for desorption of oxygen from the indium gallium zinc oxide film 63 or a path for supply of oxygen to the indium gallium zinc oxide film 63. By adjusting the amount of oxygen vacancies in the indium gallium zinc oxide film 63, for example, a threshold voltage of the transistor can be set to a desired value.

Figure 11:
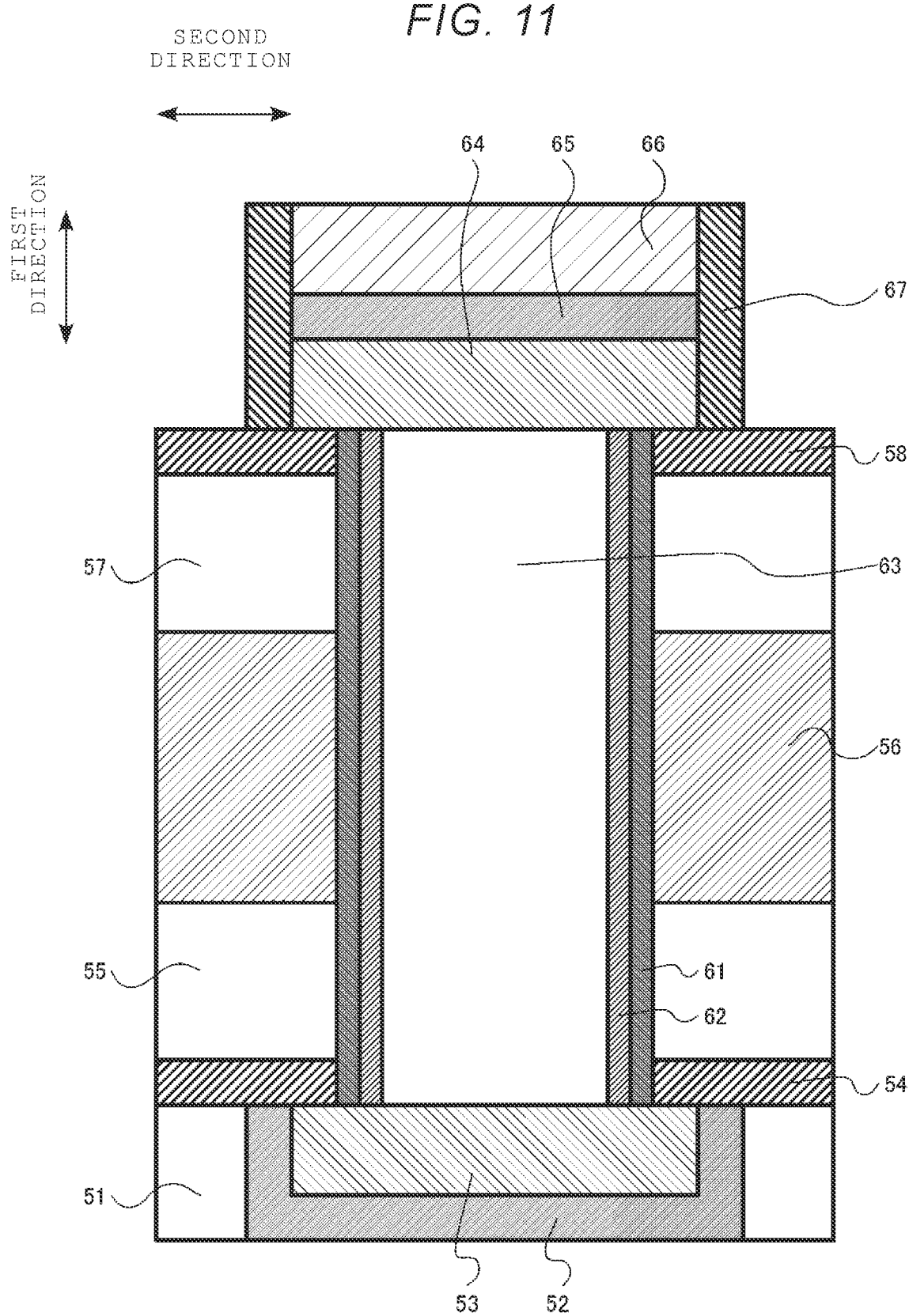

Next, a fourth silicon nitride film 67 is formed on the side surfaces of the second indium tin oxide film 64, the second titanium nitride film 65, and the second tungsten film 66 (FIG. 11). The fourth silicon nitride film 67 is formed by deposition by the CVD method and etching by the RIE method. The fourth silicon nitride film 67 finally becomes the second sidewall barrier layer 32.

Figure 12:
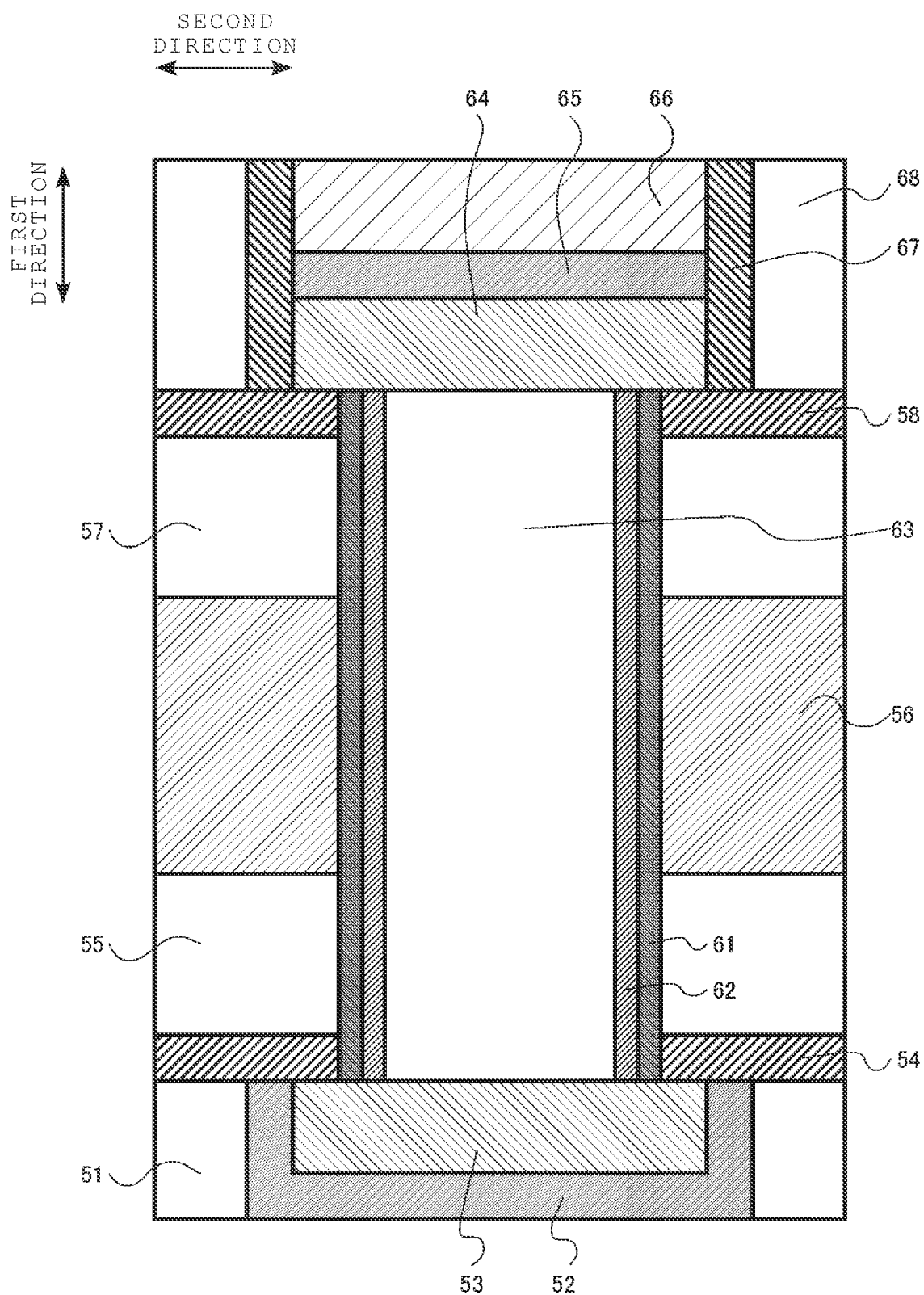

Next, a fifth silicon oxide film 68 is formed on the side surfaces of the fourth silicon nitride film 67 (FIG. 12). The fifth silicon oxide film 68 is formed by the CVD method, for example. The fifth silicon oxide film 68 finally becomes the upper interlayer insulating layer 42.

By the manufacturing method described as above, the transistor 100 illustrated in FIGS. 1, 2, 3, and 4 is manufactured.

Next, an action and effect of the semiconductor device according to the first embodiment will be described.

In the oxide semiconductor transistor, transistor characteristics may vary due to heat treatment after the transistor structure is formed. For example, the threshold voltage of a transistor may change when oxygen is desorbed from the oxide semiconductor layer in which the channel of the transistor is formed or oxygen is supplied to the oxide semiconductor layer.

A change in the threshold voltage of the transistor is caused by a change in the amount of oxygen vacancies that contribute as donors in the oxide semiconductor layer. For example, the change in the amount of oxygen vacancies changes the channel length of the transistor, thereby changing the threshold voltage of the transistor.

Figure 13:
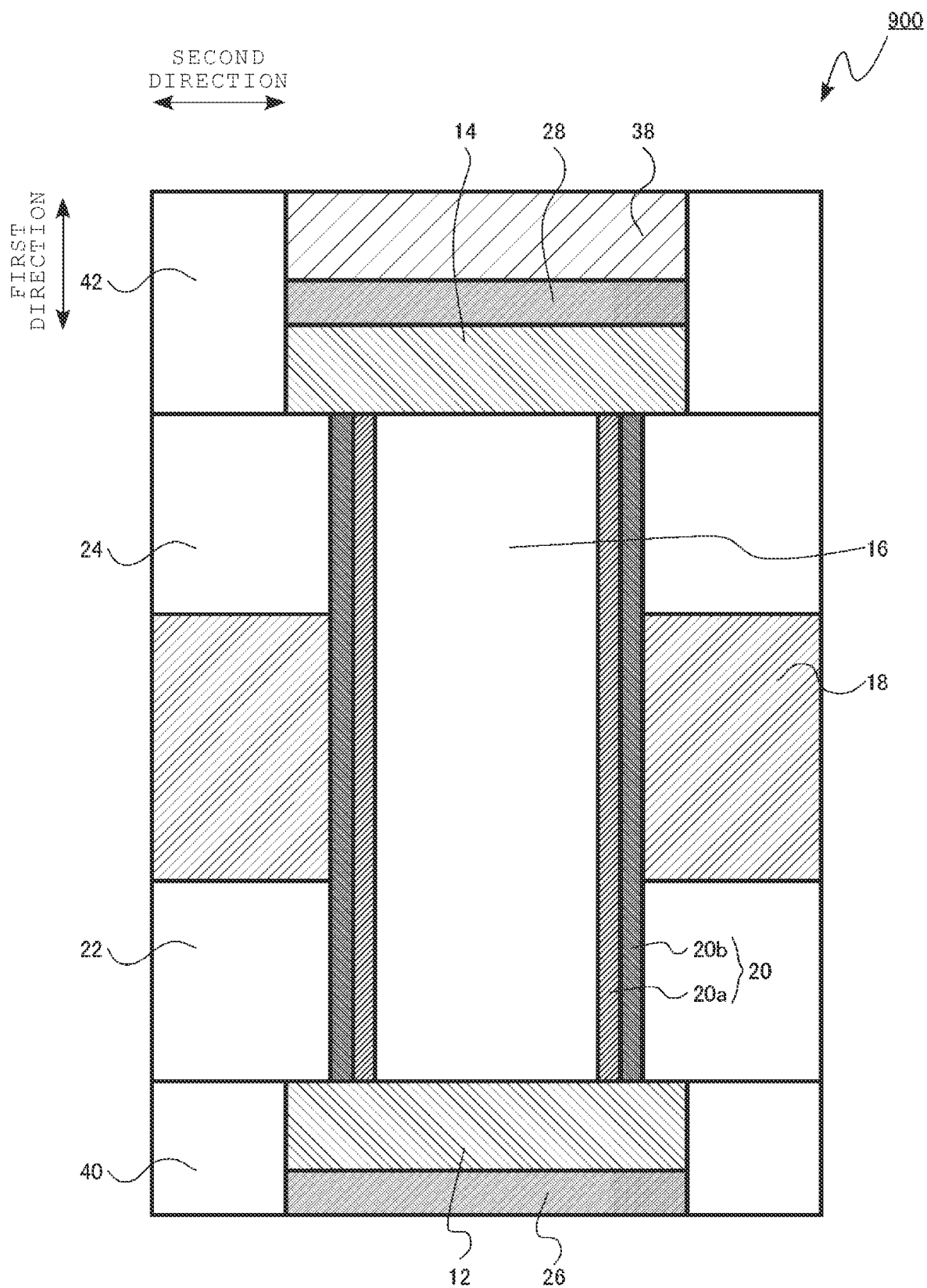
FIG. 13 is a schematic cross-sectional view of a semiconductor device of a comparative example.

FIG. 13 is a schematic cross-sectional view of a semiconductor device of a comparative example. FIG. 13 is a diagram corresponding, in general, to FIG. 1 of the first embodiment.

The semiconductor device of the comparative example is a transistor 900. The transistor 900 differs from the transistor 100 in that the first sidewall barrier layer 30, the second sidewall barrier layer 32, the lower barrier insulating layer 34, and the upper barrier insulating layer 36 are not provided.

Figure 14:
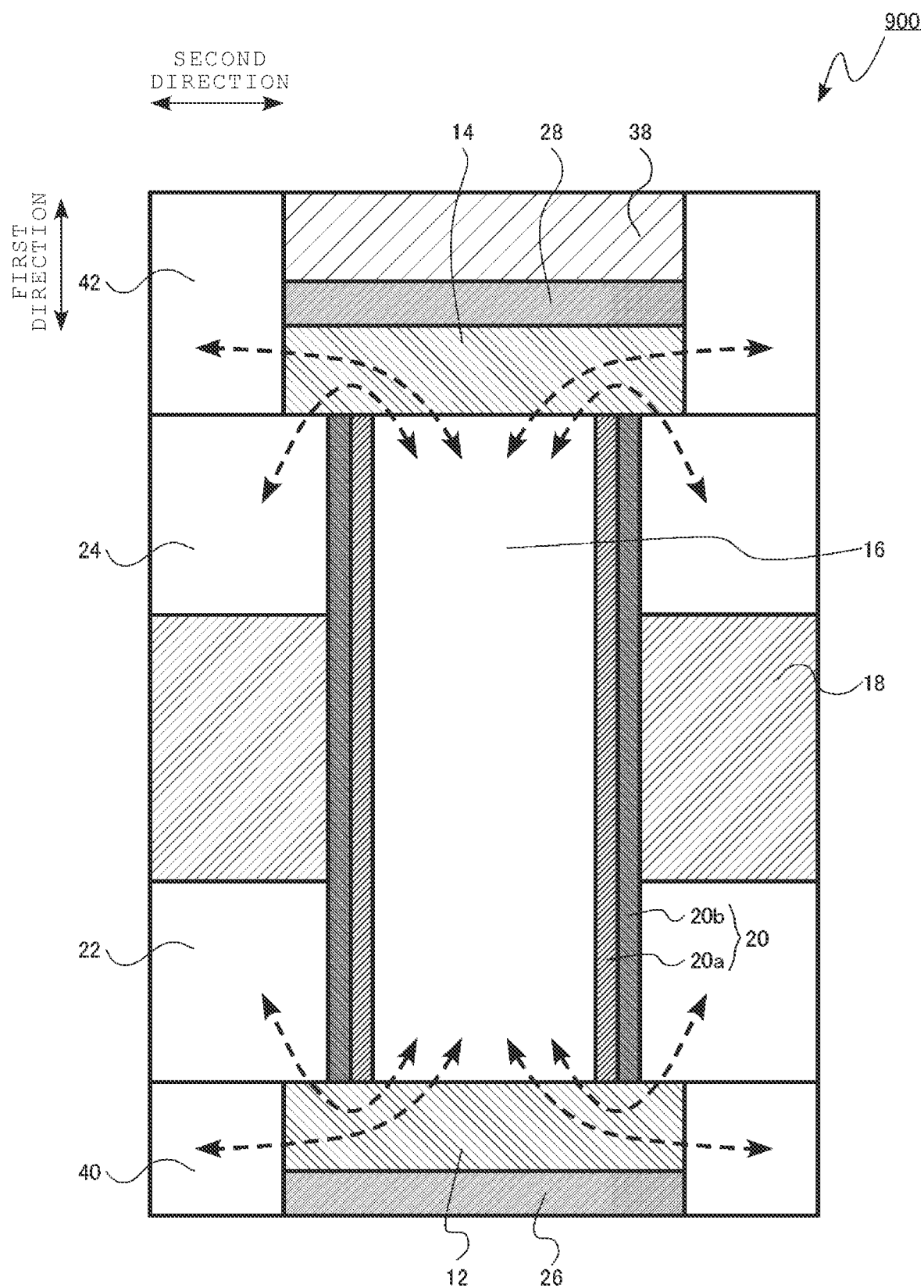
FIG. 14 is a diagram for explaining a problem with the semiconductor device of the comparative example.

FIG. 14 is a diagram illustrating a problem of the semiconductor device (transistor 900) of the comparative example.

A case where a heat treatment is applied after the structure of the transistor 900 has already been formed is explained. If such a heat treatment is performed in a non-oxidizing atmosphere, oxygen will be desorbed from the oxide semiconductor layer 16 through the lower electrode 12 and the upper electrode 14. If such a heat treatment is performed in an oxidizing atmosphere, oxygen will be supplied to the oxide semiconductor layer 16 through the lower electrode 12 and the upper electrode 14.

In the transistor 900, since there are oxygen migration paths as indicated by dotted double-headed arrows in FIG. 14, desorption of oxygen from the oxide semiconductor layer 16 and supply of oxygen to the oxide semiconductor layer 16 are likely to occur. Since oxygen is easily desorbed from the oxide semiconductor layer 16 and oxygen is easily supplied to the oxide semiconductor layer 16, the transistor characteristics are likely to vary unintentionally.

The transistor 100 according to the first embodiment includes the first sidewall barrier layer 30, the second sidewall barrier layer 32, the lower barrier insulating layer 34, and the upper barrier insulating layer 36. In this transistor 100, the lower electrode 12, the oxide semiconductor layer 16, and the upper electrode 14 are surrounded by the gate insulating layer 20, the lower barrier conductive layer 26, the upper barrier conductive layer 28, the first sidewall barrier layer 30, the second sidewall barrier layer 32, the lower barrier insulating layer 34, and the upper barrier insulating layer 36.

The gate insulating layer 20, the lower barrier conductive layer 26, the upper barrier conductive layer 28, the first sidewall barrier layer 30, the second sidewall barrier layer 32, the lower barrier insulating layer 34, and the upper barrier insulating layer 36 have high barrier properties against oxygen. In other words, the gate insulating layer 20, the lower barrier conductive layer 26, the upper barrier conductive layer 28, the first sidewall barrier layer 30, the second sidewall barrier layer 32, the lower barrier insulating layer 34, and the upper barrier insulating layer 36 have low oxygen permeability.

For example, the gate insulating layer 20, the lower barrier conductive layer 26, the upper barrier conductive layer 28, the first sidewall barrier layer 30, the second sidewall barrier layer 32, the lower barrier insulating layer 34, and the upper barrier insulating layer 36 have lower oxygen permeability than the lower insulating layer 22, the upper insulating layer 24, the lower interlayer insulating layer 40, and the upper interlayer insulating layer 42. Further, for example, the gate insulating layer 20, the lower barrier conductive layer 26, the upper barrier conductive layer 28, the first sidewall barrier layer 30, the second sidewall barrier layer 32, the lower barrier insulating layer 34, and the upper barrier insulating layer 36 have lower oxygen permeability than the lower electrode 12 and the upper electrode 14.

For example, the gate insulating layer 20, the lower barrier conductive layer 26, the upper barrier conductive layer 28, the first sidewall barrier layer 30, the second sidewall barrier layer 32, the lower barrier insulating layer 34, and the upper barrier insulating layer 36 have lower oxygen permeability than a silicon oxide. For example, the gate insulating layer 20, the lower barrier conductive layer 26, the upper barrier conductive layer 28, the first sidewall barrier layer 30, the second sidewall barrier layer 32, the lower barrier insulating layer 34, and the upper barrier insulating layer 36 have lower oxygen permeability than an indium tin oxide.

In the transistor 100 according to the first embodiment, the lower electrode 12, the oxide semiconductor layer 16, and the upper electrode 14 are surrounded by the gate insulating layer 20, the lower barrier conductive layer 26, the upper barrier conductive layer 28, the first sidewall barrier layer 30, the second sidewall barrier layer 32, the lower barrier insulating layer 34, and the upper barrier insulating layer 36. In other words, in the transistor 100 according to the first embodiment, the lower electrode 12, the oxide semiconductor layer 16, and the upper electrode 14 are surrounded by layers having barrier properties against oxygen. For this reason, desorption of oxygen from the oxide semiconductor layer 16 and supply of oxygen to the oxide semiconductor layer 16 due to heat treatment after the transistor structure is formed are prevented.

Therefore, variation in transistor characteristics due to heat treatment is prevented. Therefore, according to the first embodiment, the transistor 100 having excellent transistor characteristics can be implemented.

From the viewpoint of achieving high barrier properties against oxygen, the lower barrier conductive layer 26, the upper barrier conductive layer 28, and the first sidewall barrier layer 30 are preferably a metal nitride. From the viewpoint of achieving high barrier properties against oxygen, the lower barrier conductive layer 26, the upper barrier conductive layer 28, and the first sidewall barrier layer 30 preferably contain titanium (Ti) and nitrogen (N). From the viewpoint of achieving high barrier properties against oxygen, the lower barrier conductive layer 26, the upper barrier conductive layer 28, and the first sidewall barrier layer 30 preferably contain a titanium nitride.

From the viewpoint of achieving high barrier properties against oxygen, the gate insulating layer 20, the second sidewall barrier layer 32, the lower barrier insulating layer 34, and the upper barrier insulating layer 36 are preferably a nitride or an oxynitride. From the viewpoint of achieving high barrier properties against oxygen, the gate insulating layer 20, the second sidewall barrier layer 32, the lower barrier insulating layer 34, and the upper barrier insulating layer 36 preferably contain silicon (Si) and nitrogen (N). From the viewpoint of achieving high barrier properties against oxygen, the gate insulating layer 20, the second sidewall barrier layer 32, the lower barrier insulating layer 34, and the upper barrier insulating layer 36 preferably contain a silicon nitride.

First Modification

A semiconductor device of a first modification of the first embodiment differs in that the first sidewall barrier layer 30 is an insulator and the second sidewall barrier layer 32 is a conductor.

Figure 15:
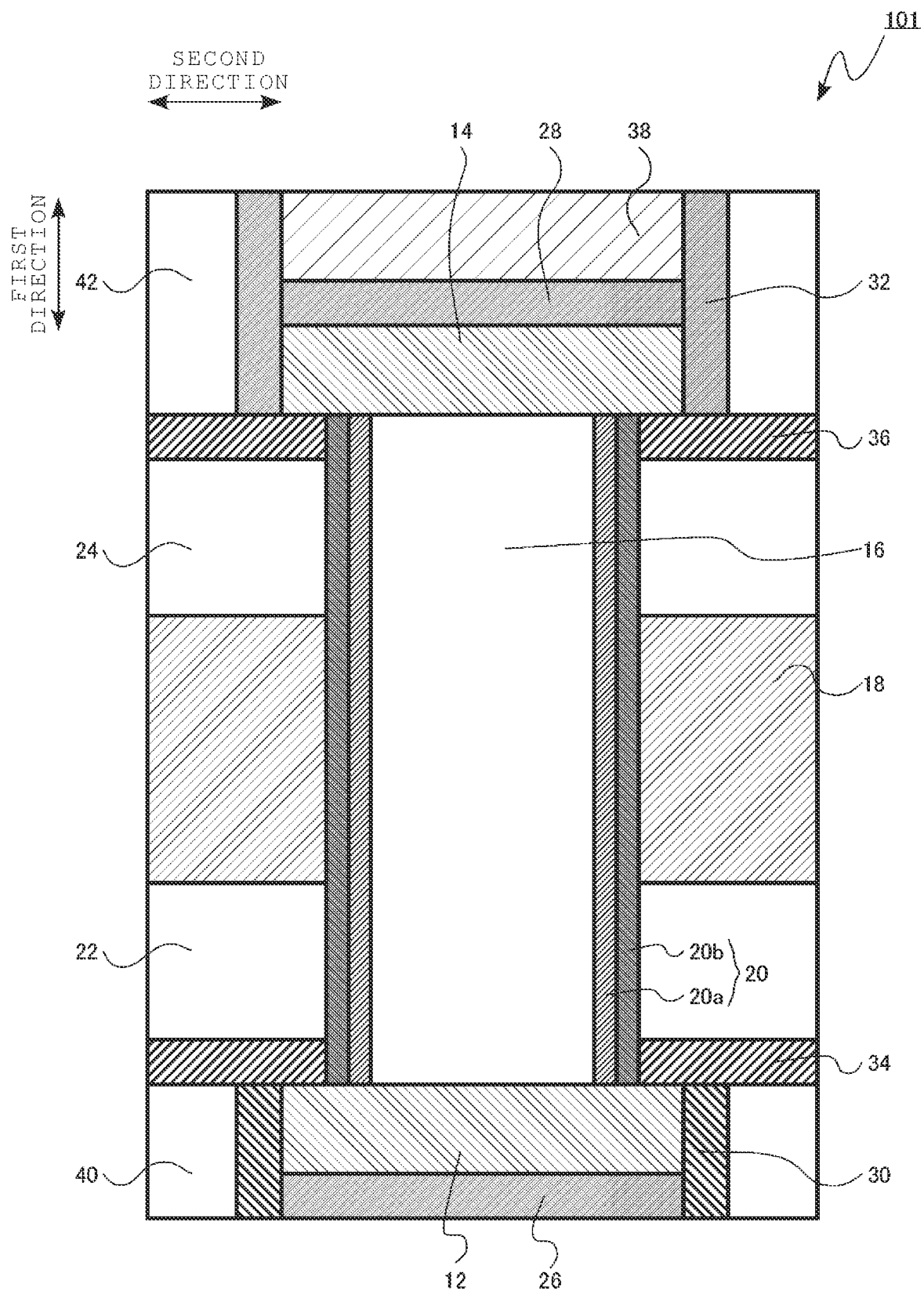
FIG. 15 is a schematic cross-sectional view of a semiconductor device according to a first modification of a first embodiment.

FIG. 15 is a schematic cross-sectional view of a semiconductor device of the first modification of the first embodiment. The semiconductor device of the first modification of the first embodiment is a transistor 101. FIG. 15 is a diagram corresponding, in general, to FIG. 1 of the first embodiment.

The first sidewall barrier layer 30 is an insulator. The first sidewall barrier layer 30 comprises at least one insulator selected from a group consisting of aluminum oxide, magnesium oxide, gallium oxide, germanium oxide, yttrium oxide, zirconium oxide, lanthanum oxide, hafnium oxide, tantalum oxide, silicon nitride, aluminum nitride, silicon oxynitride, and aluminum oxynitride. The second sidewall barrier layer 32 is, for example, an aluminum oxide layer, a magnesium oxide layer, a gallium oxide layer, a germanium oxide layer, an yttrium oxide layer, a zirconium oxide layer, a lanthanum oxide layer, a hafnium oxide layer, tantalum oxide layer, a silicon nitride layer, an aluminum nitride layer, a silicon oxynitride layer, or an aluminum oxynitride layer.

The second sidewall barrier layer 32 is a conductor. The second sidewall barrier layer 32 comprises, for example, a metal, a metal nitride, and/or a metal carbide.

For example, the second sidewall barrier layer 32 comprises at least one metal element selected from a group consisting of tungsten (W), molybdenum (Mo), copper (Cu), aluminum (Al), titanium (Ti), and tantalum (Ta). The second sidewall barrier layer 32 is, for example, a tungsten layer, a molybdenum layer, a copper layer, an aluminum layer, a titanium layer, or a tantalum layer.

For example, the second sidewall barrier layer 32 comprises nitrogen and at least one metal element selected from titanium (Ti), tungsten (W), molybdenum (Mo), and tantalum (Ta). In some examples, the second sidewall barrier layer 32 comprises a titanium nitride, a tungsten nitride, a molybdenum nitride, or a tantalum nitride. The second sidewall barrier layer 32 can be, for example, a titanium nitride layer, a tungsten nitride layer, a molybdenum nitride layer, or a tantalum nitride layer.

In some examples, the second sidewall barrier layer 32 comprises carbon and at least one metal element selected from titanium (Ti), tungsten (W), molybdenum (Mo), and tantalum (Ta). For example, the second sidewall barrier layer 32 comprises a titanium carbide, a tungsten carbide, a molybdenum carbide, or a tantalum carbide. The second sidewall barrier layer 32 can be, for example, a titanium carbide layer, a tungsten carbide layer, a molybdenum carbide layer, or a tantalum carbide layer.

In the transistor 101 of the first modification of the first embodiment, the lower electrode 12, the oxide semiconductor layer 16, and the upper electrode 14 are surrounded by layers having barrier properties against oxygen. Therefore, similar to the transistor 100 according to the first embodiment, variation in transistor characteristics accompanied by heat treatment is prevented.

Second Modification

A semiconductor device of a second modification of the first embodiment differs in that the semiconductor device of the second modification further includes a core insulating layer surrounded by the oxide semiconductor layers.

Figure 16:
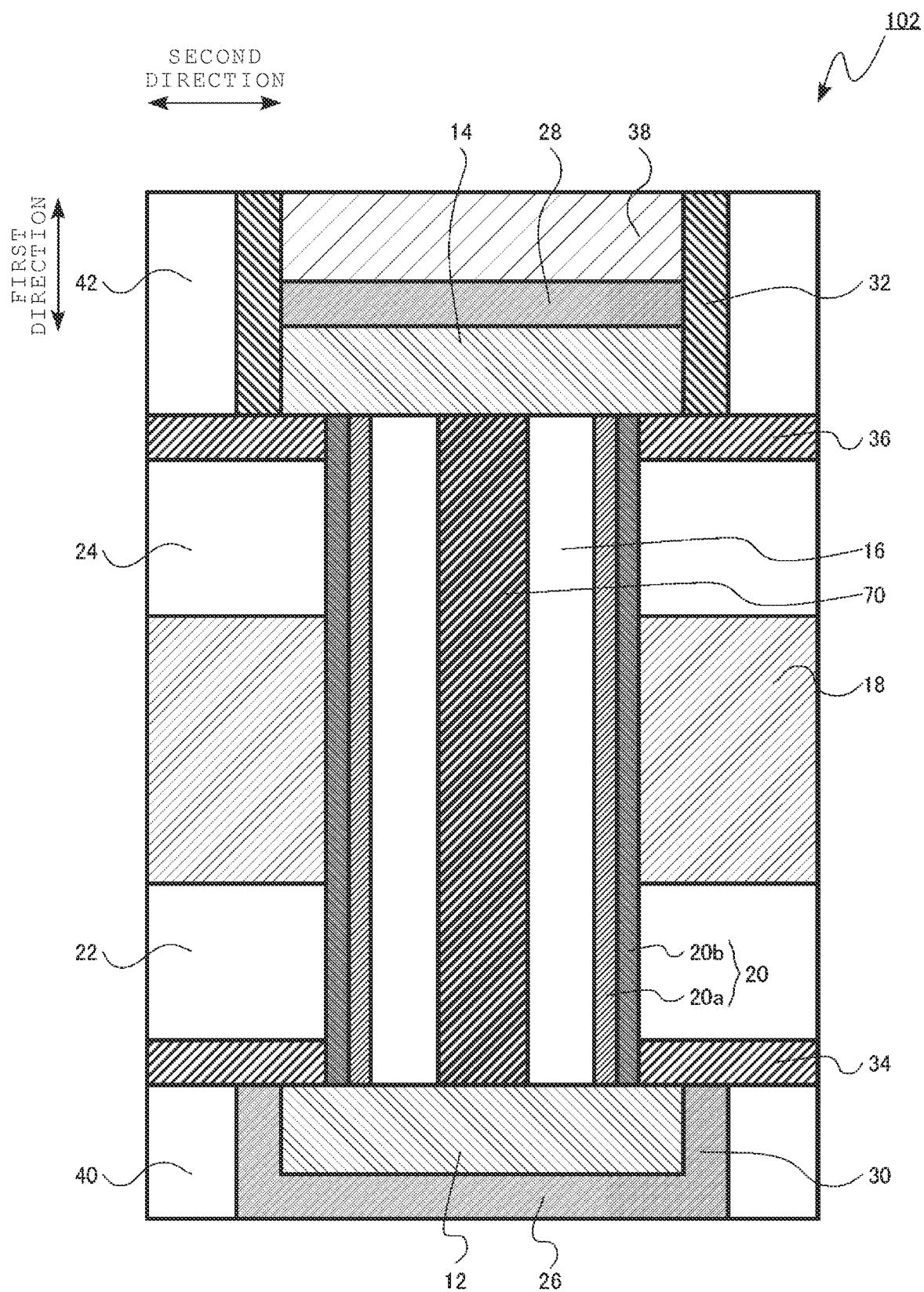
FIG. 16 is a schematic cross-sectional view of a semiconductor device according to a second modification of a first embodiment.

FIG. 16 is a schematic cross-sectional view of the semiconductor device of the second modification of the first embodiment. The semiconductor device of the second modification of the first embodiment is a transistor 102. FIG. 16 is a diagram corresponding, in general, to FIG. 1 of the first embodiment.

The transistor 102 includes a core insulating layer 70. The core insulating layer 70 is provided between the lower electrode 12 and the upper electrode 14. The core insulating layer 70 is surrounded by the oxide semiconductor layer 16. The core insulating layer 70 is surrounded by the oxide semiconductor layer 16 in a cross section perpendicular to the first direction.

In the transistor 102 of the second modification of the first embodiment, the lower electrode 12, the oxide semiconductor layer 16, and the upper electrode 14 are surrounded by layers having barrier properties against oxygen. Therefore, similar to the transistor 100 according to the first embodiment, variation in transistor characteristics due to heat treatment is prevented.

Third Modification

A semiconductor device of the third modification of the first embodiment differs in that the oxide semiconductor layer has a tapered shape.

Figure 17:
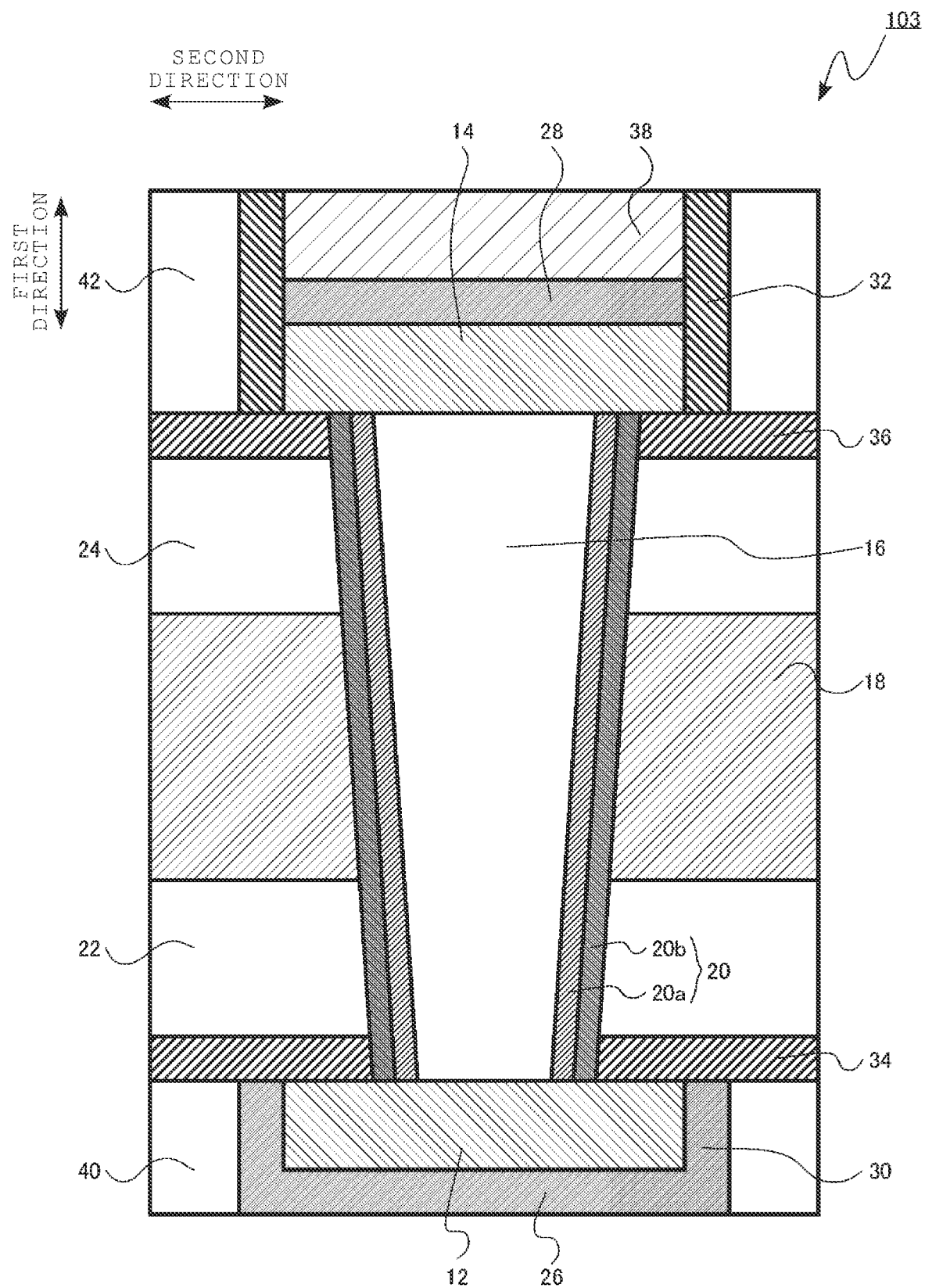
FIG. 17 is a schematic cross-sectional view of a semiconductor device according to a third modification of a first embodiment.

FIG. 17 is a schematic cross-sectional view of the semiconductor device of the third modification of the first embodiment. The semiconductor device of the third modification of the first embodiment is a transistor 103. FIG. 17 is a diagram corresponding, in general, to FIG. 1 of the first embodiment.

In the transistor 103, the oxide semiconductor layer 16 has a tapered shape. The oxide semiconductor layer 16 has a forward tapered shape in a cross section parallel to the first direction. In other words, the width of the oxide semiconductor layer 16 in the second direction narrows from the upper electrode 14 toward the lower electrode 12.

In the transistor 103 of the third modification of the first embodiment, the lower electrode 12, the oxide semiconductor layer 16, and the upper electrode 14 are surrounded by layers having barrier properties against oxygen. Therefore, similar to the transistor 100 according to the first embodiment, variation in transistor characteristics due to heat treatment is prevented.

As described above, according to the first embodiment and the modifications, variation in transistor characteristics due to heat treatment is prevented, and a semiconductor device having excellent transistor characteristics can be implemented.

Second Embodiment

A semiconductor device according to a second embodiment includes a first electrode containing a metal oxide, a second electrode containing a metal oxide, an oxide semiconductor layer provided between the first electrode and the second electrode, a gate electrode surrounding the oxide semiconductor layer, a gate insulating layer provided between the gate electrode and the oxide semiconductor layer and containing silicon (Si) and nitrogen (N), a first insulating layer provided between the first electrode and the gate electrode, a second insulating layer provided with the gate electrode between the first insulating layer and the second insulating layer, a first conductive layer being in contact with a surface of the first electrode opposite to the oxide semiconductor layer and containing at least one conductor selected from a group consisting of metal, metal nitride, and metal carbide, a second conductive layer being in contact with a surface of the second electrode opposite to the oxide semiconductor layer, surrounded by the second electrode in a first cross section perpendicular to a first direction from the first electrode to the second electrode, and containing at least one conductor selected from a group consisting of metal, metal nitride, and metal carbide, a metal layer surrounded by the second conductive layer in the first cross section, a first layer surrounding the first electrode in a second cross section perpendicular to the first direction, being in contact with the first conductive layer, and containing at least one insulator selected from a group consisting of aluminum oxide, magnesium oxide, gallium oxide, germanium oxide, yttrium oxide, zirconium oxide, lanthanum oxide, hafnium oxide, tantalum oxide, silicon nitride, aluminum nitride, silicon oxynitride, and aluminum oxynitride or at least one conductor selected from a group consisting of metal, metal nitride, and metal carbide, a third insulating layer provided between the first electrode and the first insulating layer, being in contact with the gate insulating layer and the first layer, and containing at least one insulator selected from a group consisting of aluminum oxide, magnesium oxide, gallium oxide, germanium oxide, yttrium oxide, zirconium oxide, lanthanum oxide, hafnium oxide, tantalum oxide, silicon nitride, aluminum nitride, silicon oxynitride, and aluminum oxynitride; and a fourth insulating layer provided with the second insulating layer between the gate electrode and the fourth insulating layer, surrounding the metal layer in a third cross section perpendicular to the first direction, being in contact with the second conductive layer and the gate insulating layer, and containing at least one insulator selected from a group consisting of aluminum oxide, magnesium oxide, gallium oxide, germanium oxide, yttrium oxide, zirconium oxide, lanthanum oxide, hafnium oxide, tantalum oxide, silicon nitride, aluminum nitride, silicon oxynitride, and aluminum oxynitride.

The semiconductor device according to the second embodiment differs from the first embodiment in that the second conductive layer is surrounded by the upper electrode, and the metal layer is surrounded by the second conductive layer. The semiconductor device according to the second embodiment also differs from the first embodiment in that the second layer (e.g., a second sidewall barrier layer 32) is not provided. Unless otherwise noted or apparent, description provided with regard to the first embodiment may considered to also apply to the second embodiment.

Figure 18:
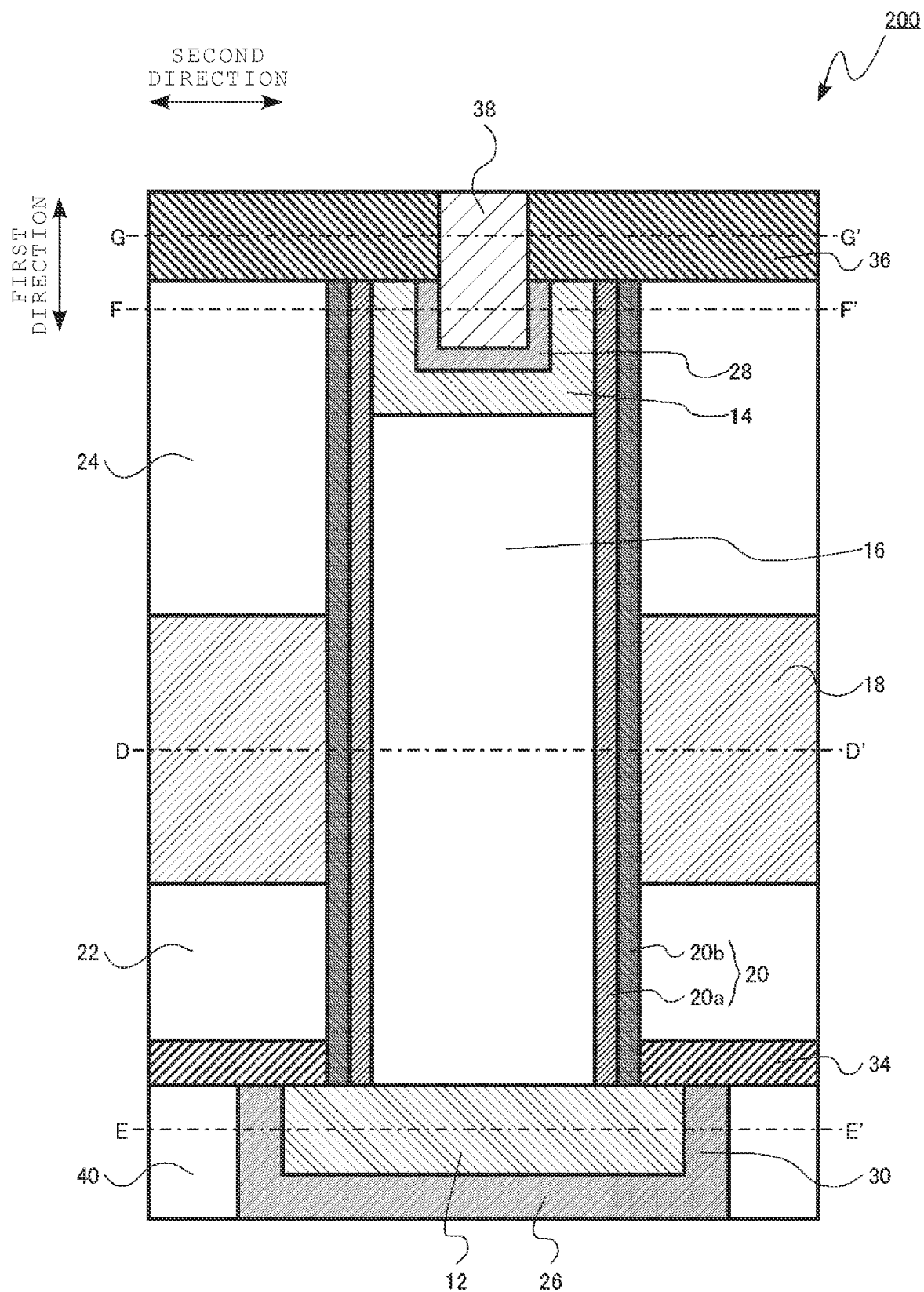
FIG. 18 is a schematic cross-sectional view of a semiconductor device according to a second embodiment.
Figure 19:
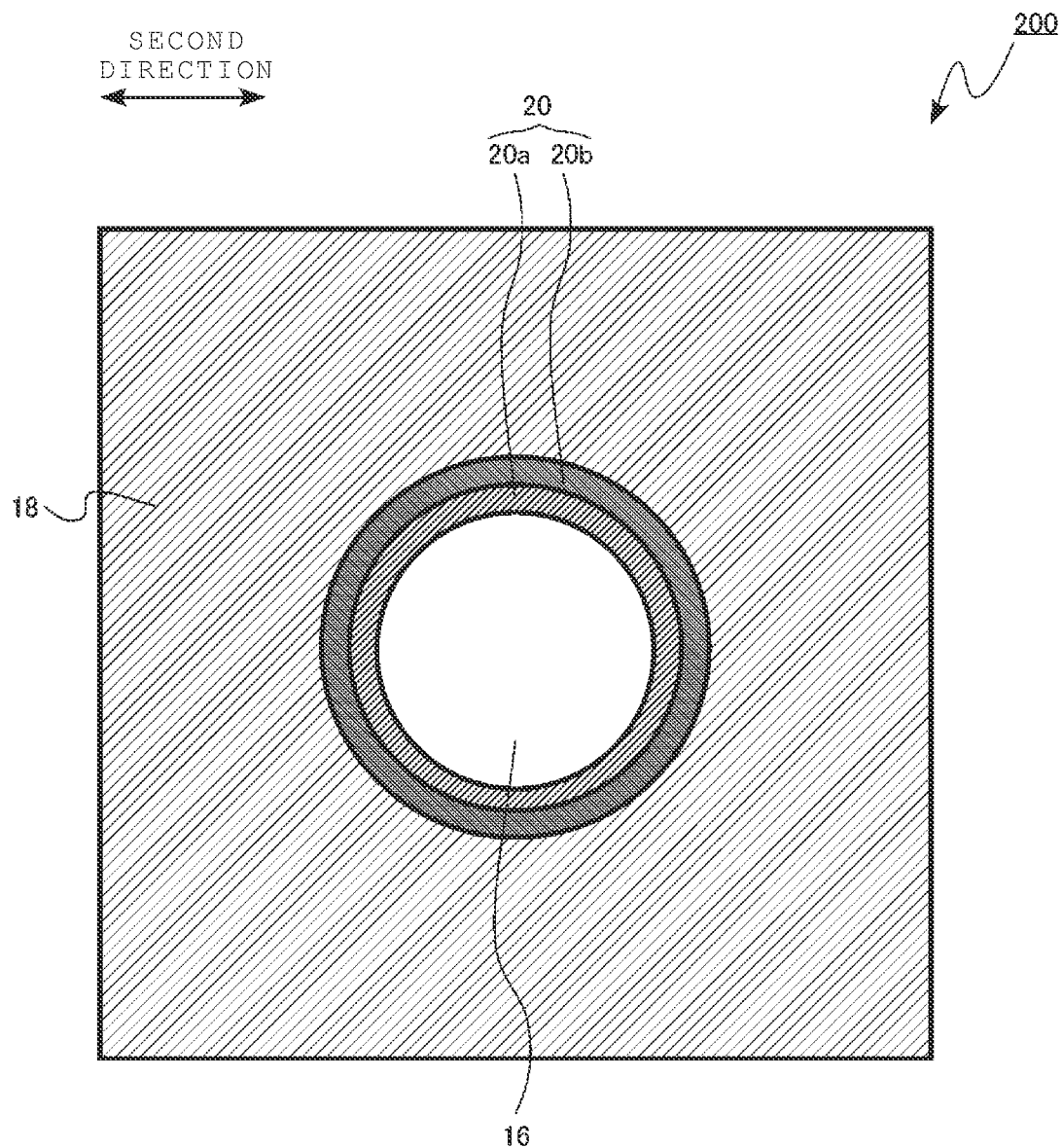
FIG. 19 is a schematic cross-sectional view of a semiconductor device according to a second embodiment.
Figure 20:
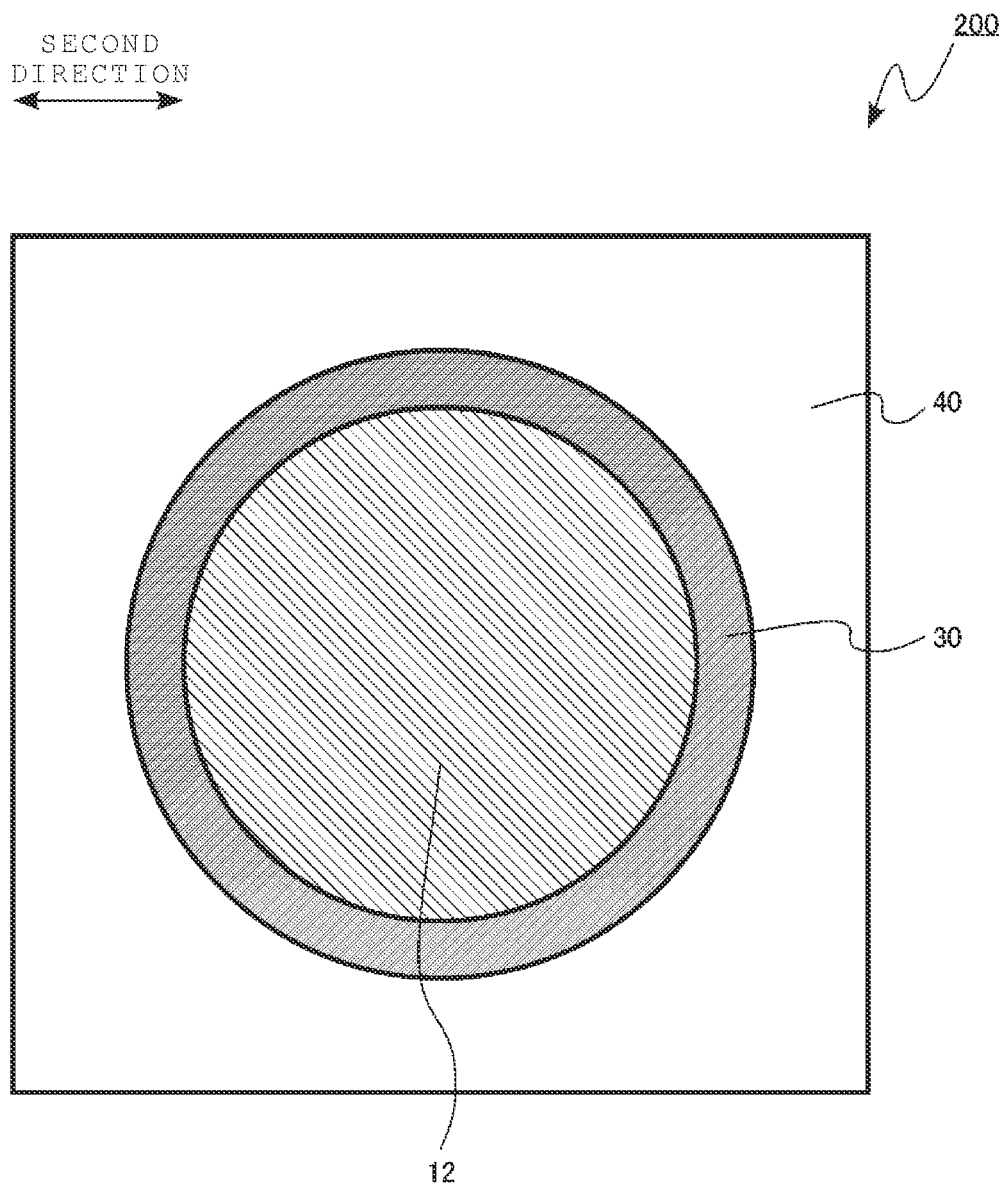
FIG. 20 is a schematic cross-sectional view of a semiconductor device according to a second embodiment.
Figure 21:
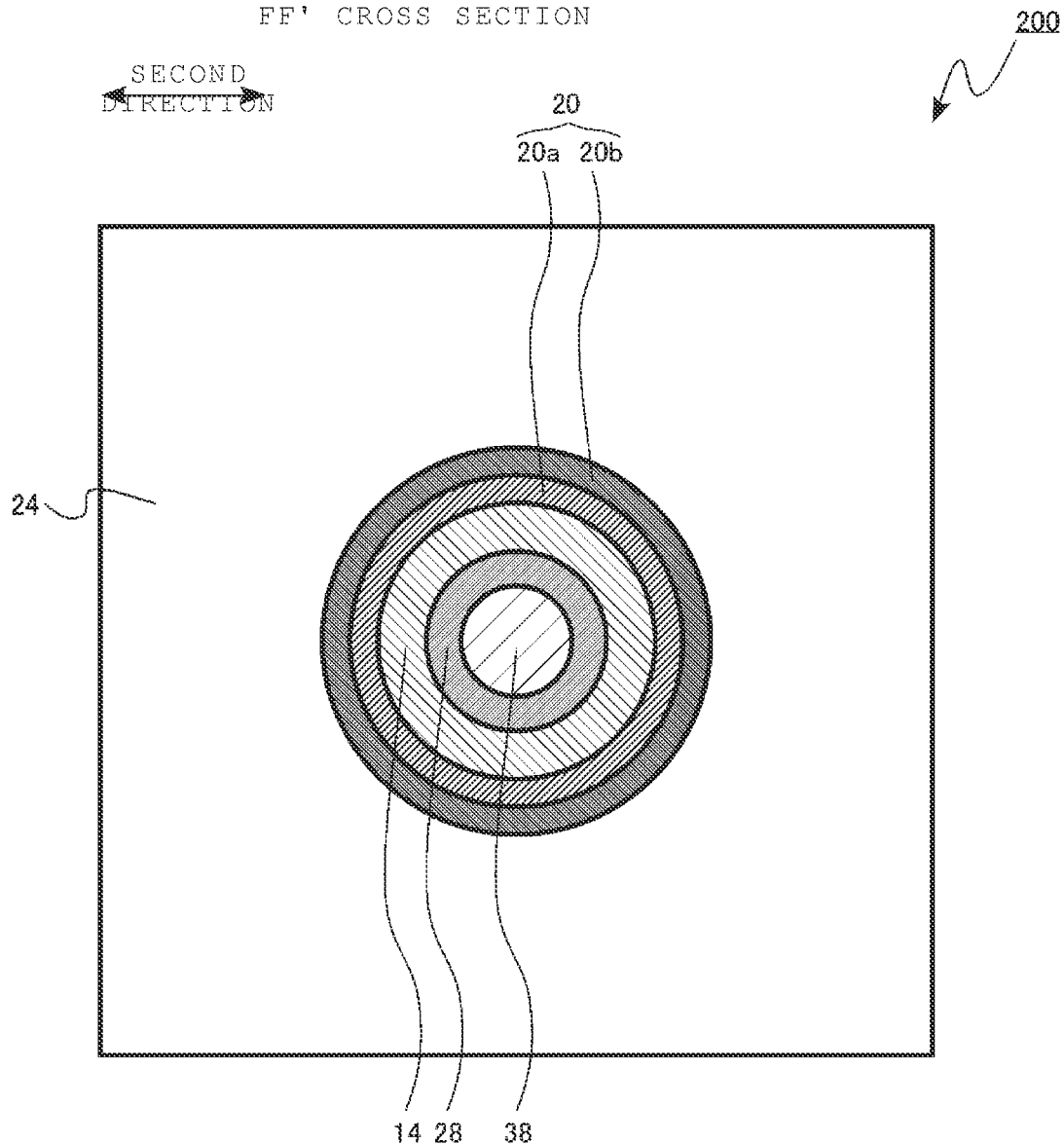
FIG. 21 is a schematic cross-sectional view of a semiconductor device according to a second embodiment.
Figure 22:
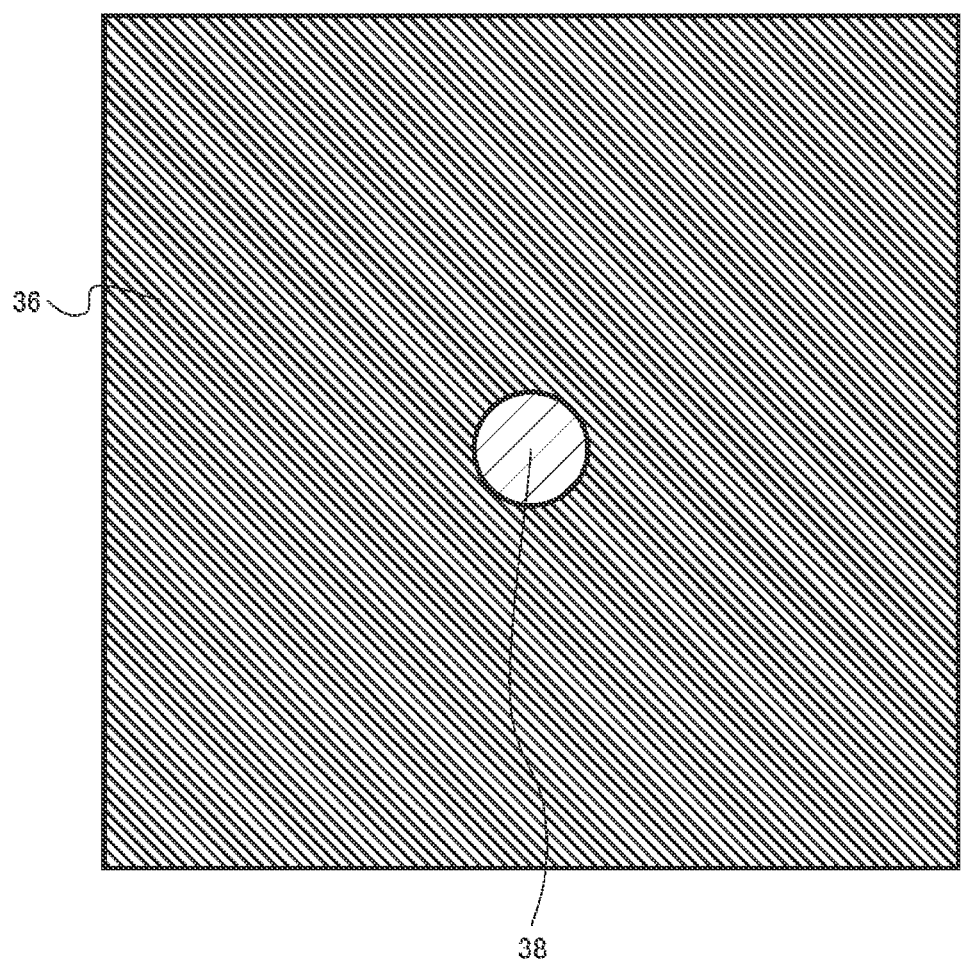
FIG. 22 is a schematic cross-sectional view of a semiconductor device according to a second embodiment.

FIGS. 18, 19, 20, 21, and 22 are schematic cross-sectional views of the semiconductor device according to the second embodiment. FIG. 19 is a cross-sectional view taken along line DD' of FIG. 18. FIG. 20 is a cross-sectional view taken along line EE' of FIG. 18. FIG. 21 is a cross-sectional view taken along line FF' of FIG. 18. FIG. 22 is a cross-sectional view taken along line GG' of FIG. 18. In FIG. 18, the vertical direction is called a first direction. In FIG. 18, the horizontal direction is called a second direction. The second direction is perpendicular to the first direction.

The cross section taken along line EE' is an example of a second cross section. The cross section taken along line FF' is an example of a first cross section. The cross section taken along line GG' is an example of a third cross section.

The semiconductor device according to the second embodiment is a transistor 200. The transistor 200 is an oxide semiconductor transistor in which a channel is formed in an oxide semiconductor. In the transistor 200, a gate electrode surrounds the oxide semiconductor layer in which the channel is formed. The transistor 200 is a so-called SGT. The transistor 200 is a so-called vertical transistor.

The transistor 200 includes a lower electrode 12, an upper electrode 14, an oxide semiconductor layer 16, a gate electrode 18, a gate insulating layer 20, a lower insulating layer 22, an upper insulating layer 24, a lower barrier conductive layer 26, an upper barrier conductive layer 28, a first sidewall barrier layer 30, a lower barrier insulating layer 34, an upper barrier insulating layer 36, a metal layer 38, and a lower interlayer insulating layer 40. The gate insulating layer 20 includes a first gate insulating film 20a and a second gate insulating film 20b.

The lower electrode 12 is an example of the first electrode. The upper electrode 14 is an example of the second electrode. The lower insulating layer 22 is an example of the first insulating layer. The upper insulating layer 24 is an example of the second insulating layer. The lower barrier conductive layer 26 is an example of the first conductive layer. The upper barrier conductive layer 28 is an example of the second conductive layer. The first sidewall barrier layer 30 is an example of the first layer. The lower barrier insulating layer 34 is an example of the third insulating layer. The upper barrier insulating layer 36 is an example of the fourth insulating layer. The first gate insulating film 20a is an example of a first film. The second gate insulating film 20b is an example of a second film.

The upper electrode 14 is provided on the oxide semiconductor layer 16. The upper electrode 14 is electrically connected to the oxide semiconductor layer 16. The upper electrode 14 is in contact with the oxide semiconductor layer 16, for example. The upper electrode 14 functions as a source electrode or drain electrode of the transistor 200.

The upper electrode 14 is surrounded by the upper insulating layer 24 and the gate insulating layer 20, as illustrated in FIG. 21. The upper electrode 14 is surrounded by the upper insulating layer 24 and the gate insulating layer 20 in the first cross section perpendicular to the first direction. The upper electrode 14 is in contact with the gate insulating layer 20, for example. The cross section taken along line FF' illustrated in FIG. 21 is an example of the first cross section.

As illustrated in FIG. 19, the gate electrode 18 surrounds the oxide semiconductor layer 16 in a cross section perpendicular to the first direction. The gate electrode 18 is provided around the oxide semiconductor layer 16.

The upper barrier conductive layer 28 is provided on the upper electrode 14. The upper barrier conductive layer 28 is in contact with the surface of the upper electrode 14 opposite to the oxide semiconductor layer 16.

The upper barrier conductive layer 28 is surrounded by the upper electrode 14, as illustrated in FIG. 21. The upper barrier conductive layer 28 is surrounded by the upper electrode 14 in the first cross section perpendicular to the first direction.

The first sidewall barrier layer 30 surrounds the side surfaces of the lower electrode 12. As illustrated in FIG. 20, the first sidewall barrier layer 30 surrounds the lower electrode 12 in the second cross section perpendicular to the first direction. The cross section taken along line EE' illustrated in FIG. 20 is an example of the second cross section.

The upper barrier insulating layer 36 is provided on the upper insulating layer 24. The upper insulating layer 24 is provided between the gate electrode 18 and the upper barrier insulating layer 36. As illustrated in FIG. 22, the upper barrier insulating layer 36 surrounds the metal layer 38 in the third cross section perpendicular to the first direction. The cross section taken along line GG' illustrated in FIG. 22 is an example of the third section.

The upper barrier insulating layer 36 is in contact with the upper barrier conductive layer 28 and the gate insulating layer 20. The upper barrier insulating layer 36 is in contact with the second gate insulating film 20b, for example. The upper barrier insulating layer 36 is in contact with the upper electrode 14, for example.

The upper electrode 14 is provided between the upper barrier insulating layer 36 and the oxide semiconductor layer 16.

The metal layer 38 is provided on the upper barrier conductive layer 28. The upper barrier conductive layer 28 is provided between the metal layer 38 and the upper electrode 14. The metal layer 38 is in contact with the upper barrier conductive layer 28, for example.

The metal layer 38 is surrounded by the upper barrier conductive layer 28, as illustrated in FIG. 21. The metal layer 38 is surrounded by the upper barrier conductive layer 28 in the first cross section perpendicular to the first direction.

Next, an example of a method for manufacturing the semiconductor device according to the second embodiment will be described.

FIGS. 23, 24, 25, 26, 27, 28, 29, 30, 31, 32, and 33 are schematic cross-sectional views illustrating an example of the method for manufacturing the semiconductor device according to the second embodiment. FIGS. 23 to 33 each illustrate a cross section corresponding to FIG. 18. FIGS. 23 to 33 are diagrams illustrating an example of the method for manufacturing the transistor 200.

Hereinafter, a case where the lower electrode 12 is an indium tin oxide layer, the upper electrode 14 is an indium tin oxide layer, the oxide semiconductor layer 16 is an indium gallium zinc oxide layer, the gate electrode 18 is a tungsten layer, the gate insulating layer 20 has a stacked structure of a silicon oxide film and a silicon nitride film, the lower insulating layer 22 is a silicon oxide layer, the upper insulating layer 24 is a silicon oxide layer, the lower barrier conductive layer 26 is a titanium nitride layer, the upper barrier conductive layer 28 is a titanium nitride layer, the first sidewall barrier layer 30 is a titanium nitride layer, the lower barrier insulating layer 34 is a silicon nitride layer, the upper barrier insulating layer 36 is a silicon nitride layer, the metal layer 38 is a tungsten layer, and the lower interlayer insulating layer 40 is a silicon oxide layer will be described as an example.

First, a first silicon oxide film 51 is formed on a substrate (not illustrated). The first silicon oxide film 51 is formed by, for example, the CVD method.

Next, an opening (not illustrated) is formed in the first silicon oxide film 51. The opening of the first silicon oxide film 51 is formed using, for example, the lithography method and the RIE method.

Next, in the opening of the first silicon oxide film 51, a first titanium nitride film 52 and a first indium tin oxide film 53 are formed. The first titanium nitride film 52 and the first indium tin oxide film 53 are formed using, for example, the CVD method.

Figure 23:
FIGS. 23 to 33 are schematic cross-sectional views aspects of a method for manufacturing the semiconductor device according to a second embodiment.

Next, the first titanium nitride film 52 and the first indium tin oxide film 53 on the surface of the first silicon oxide film 51 are removed (FIG. 23). For example, the CMP method is used for removing the first titanium nitride film 52 and the first indium tin oxide film 53.

The first silicon oxide film 51 finally becomes the lower interlayer insulating layer 40. The first titanium nitride film 52 finally becomes the lower barrier conductive layer 26 and the first sidewall barrier layer 30. The first indium tin oxide film 53 finally becomes the lower electrode 12.

Figure 24:
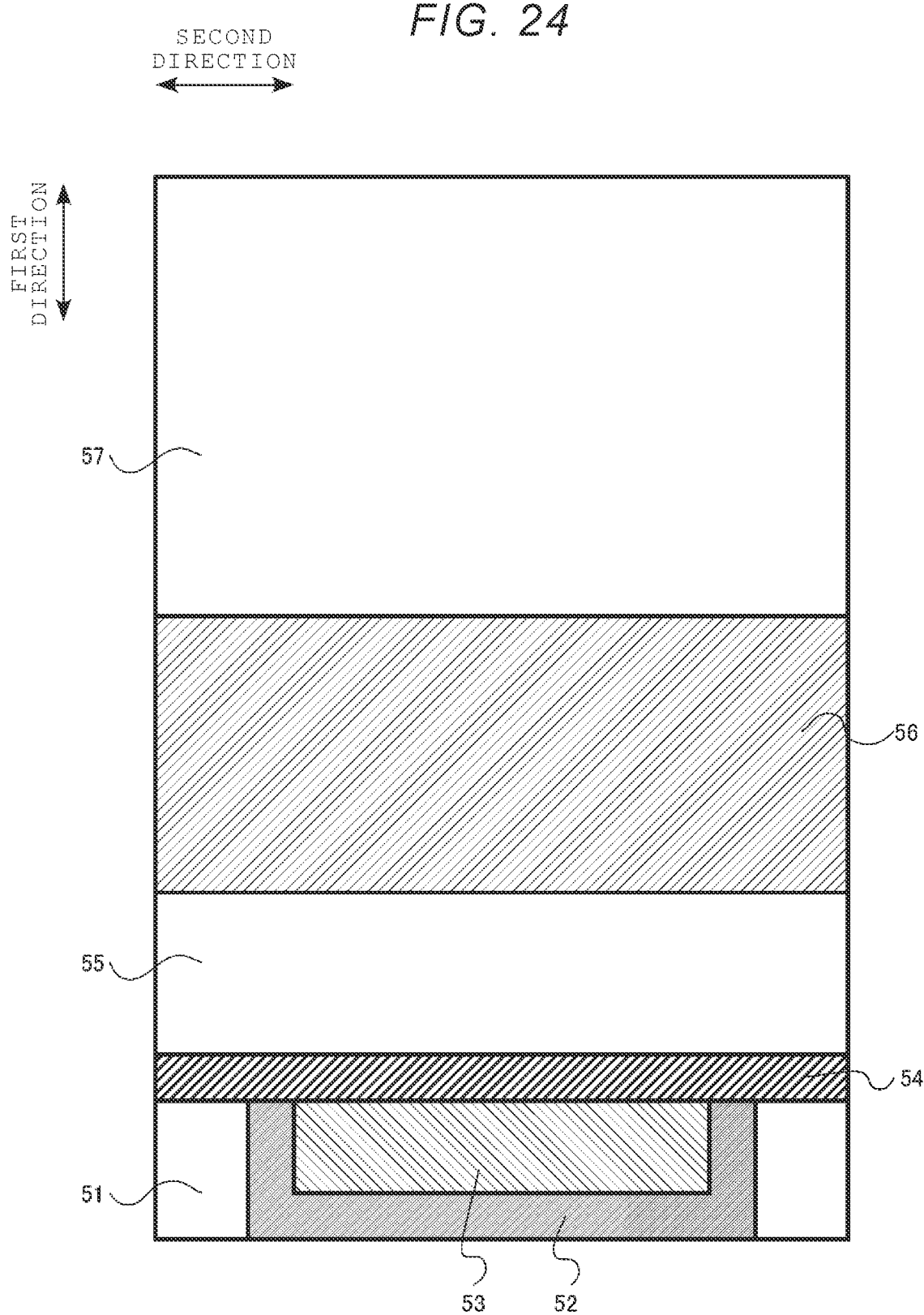

Next, on the first indium tin oxide film 53, a first silicon nitride film 54, a second silicon oxide film 55, a first tungsten film 56, and a third silicon oxide film 57 are stacked in this order in the first direction (FIG. 24). The first silicon nitride film 54, the second silicon oxide film 55, the first tungsten film 56, and the third silicon oxide film 57 are formed using, for example, the CVD method.

A part of the first silicon nitride film 54 finally becomes the lower barrier insulating layer 34. A part of the second silicon oxide film 55 finally becomes the lower insulating layer 22. A part of the first tungsten film 56 finally becomes the gate electrode 18. A part of the third silicon oxide film 57 finally becomes the upper insulating layer 24.

Figure 25:
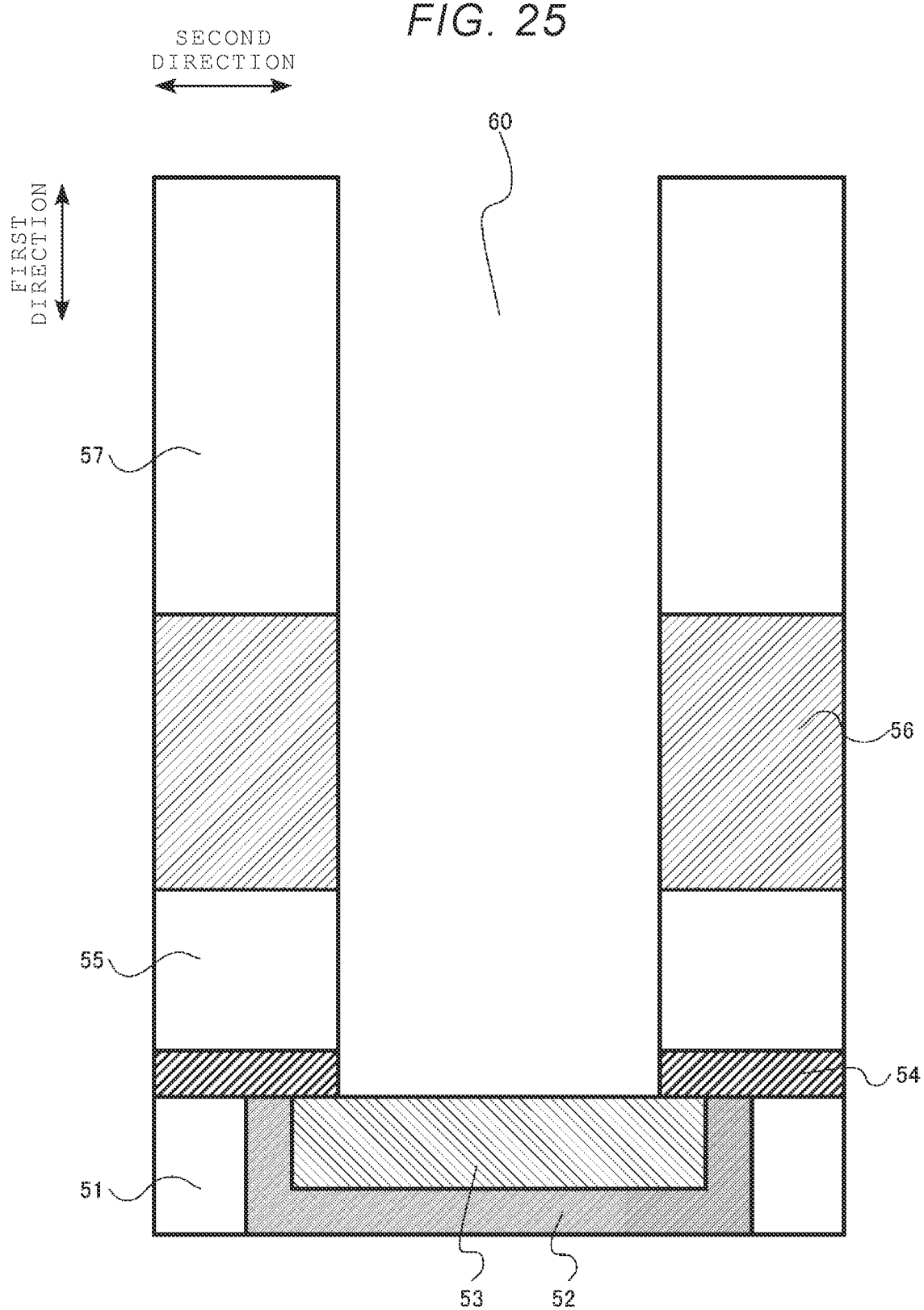

Next, an opening 60 extending from the surface of the third silicon oxide film 57 to reach the first indium tin oxide film 53 is formed by penetrating through the third silicon oxide film 57, the first tungsten film 56, the second silicon oxide film 55, and the first silicon nitride film 54 (FIG. 25). The opening 60 is formed using, for example, the lithography method and the RIE method.

Figure 26:
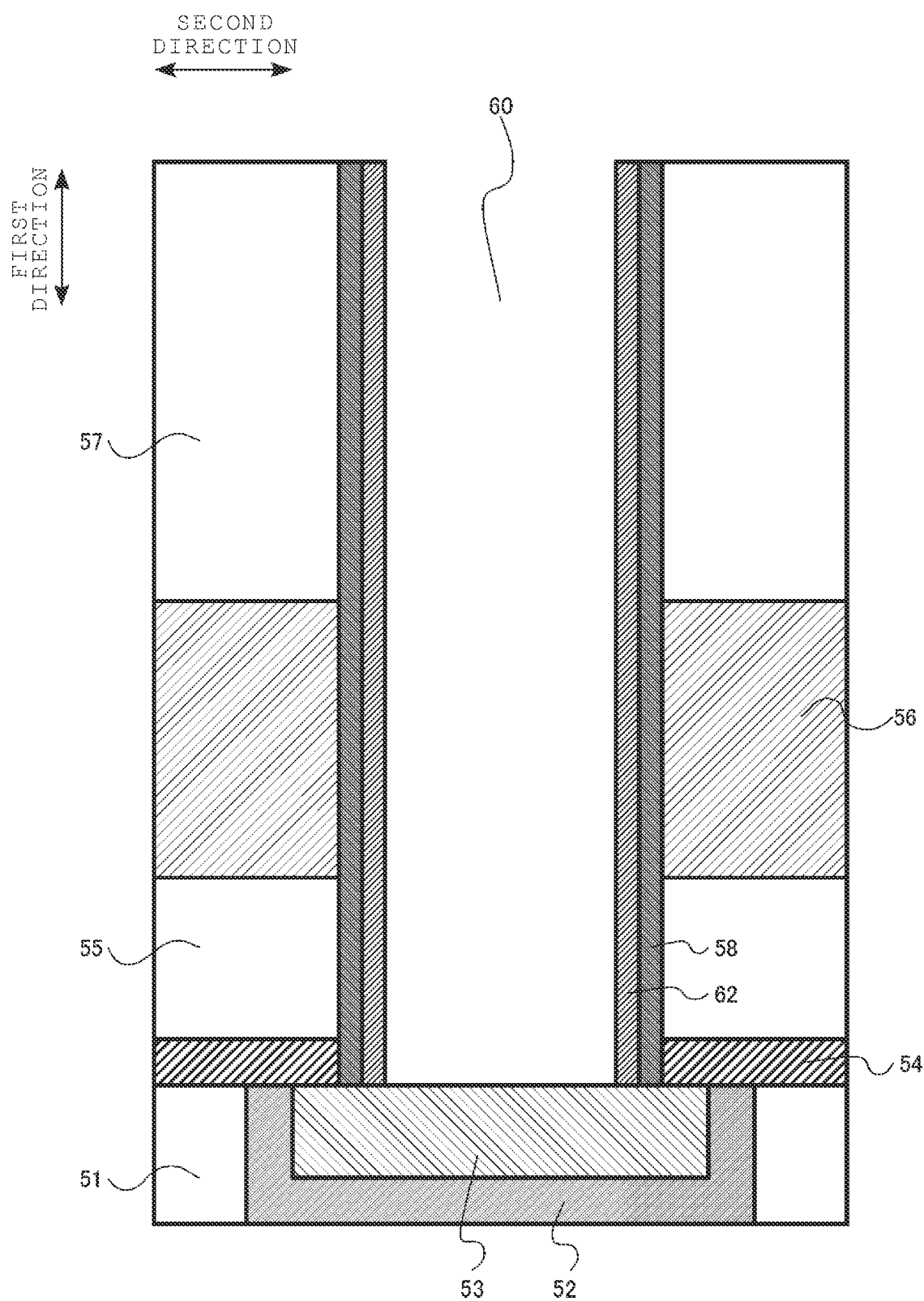

Next, a second silicon nitride film 58 and a fourth silicon oxide film 62 are formed on inner side surfaces of the opening 60 (FIG. 26). The second silicon nitride film 58 and the fourth silicon oxide film 62 are formed by, for example, deposition by the CVD method and etching by the RIE method. The second silicon nitride film 58 finally becomes the second gate insulating film 20b. The fourth silicon oxide film 62 finally becomes the first gate insulating film 20a.

Figure 27:
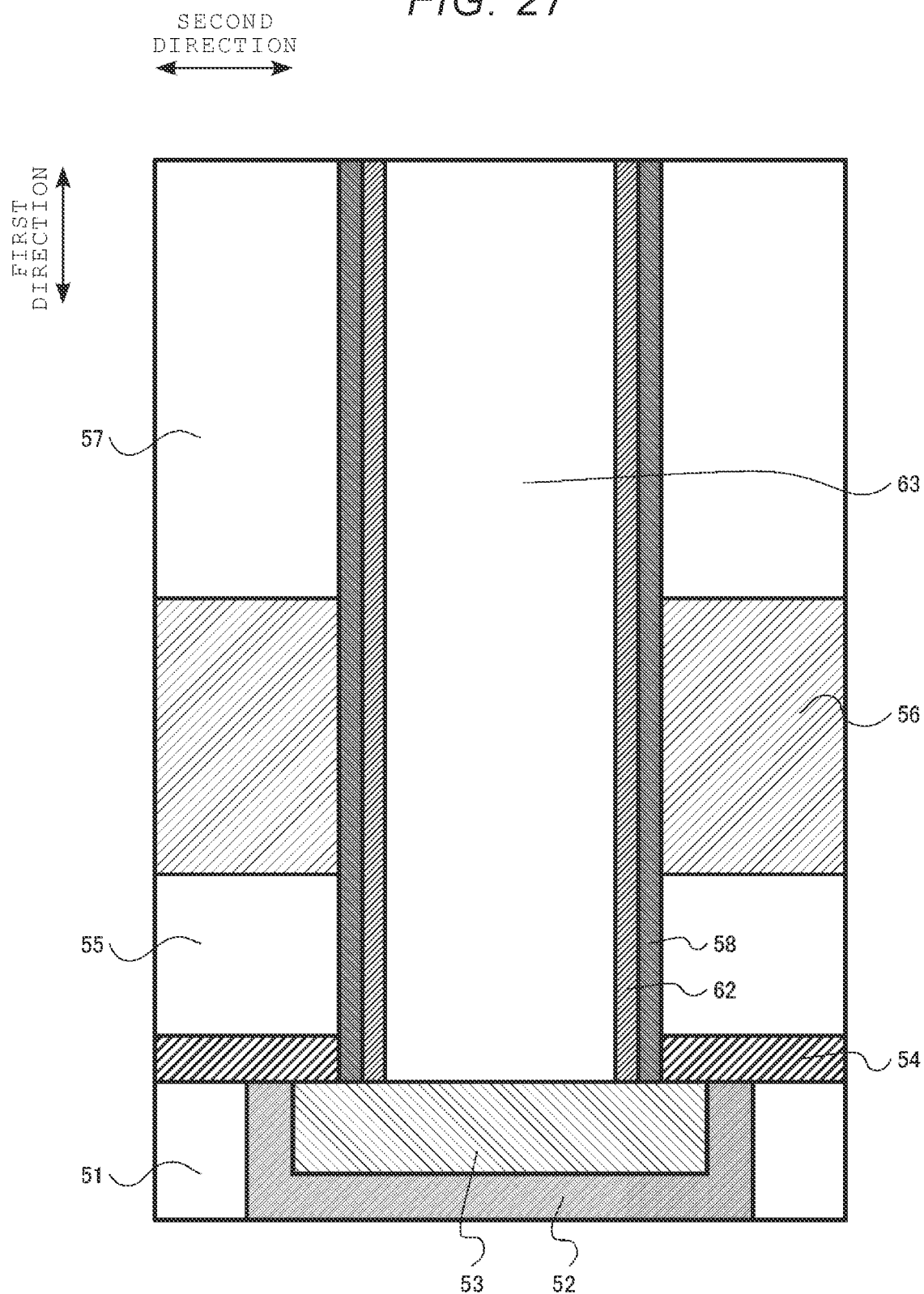

Next, the opening 60 is filled with an indium gallium zinc oxide film 63 (FIG. 27). The indium gallium zinc oxide film 63 finally becomes the oxide semiconductor layer 16. The indium gallium zinc oxide film 63 is deposited, for example, by the CVD method, and then a part of an upper portion thereof is partially removed by the CMP method.

Figure 28:
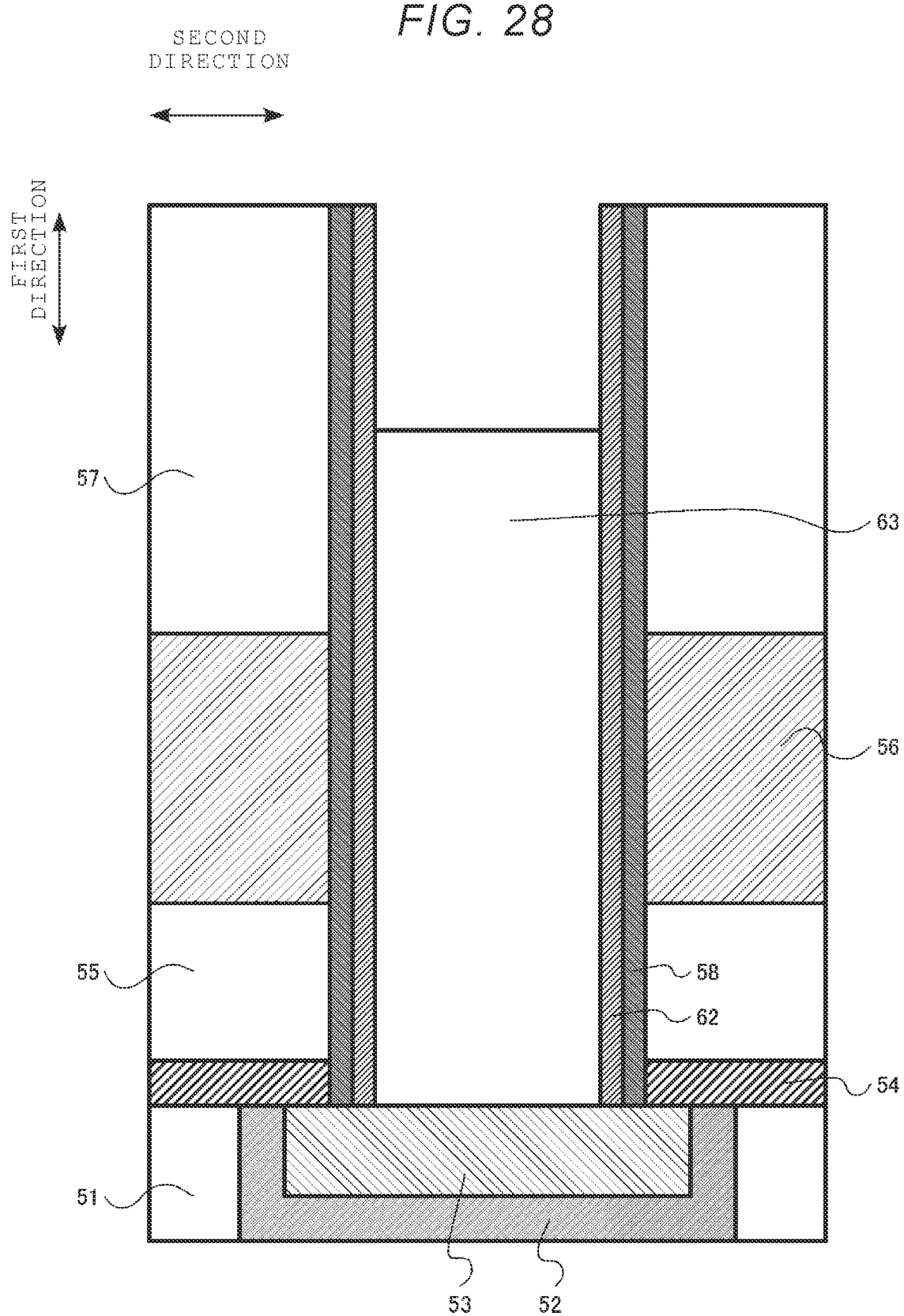

Next, a part of the upper portion of the indium gallium zinc oxide film 63 is selectively etched back (FIG. 28). Etching back of the indium gallium zinc oxide film 63 is performed using, for example, the RIE method.

Figure 29:
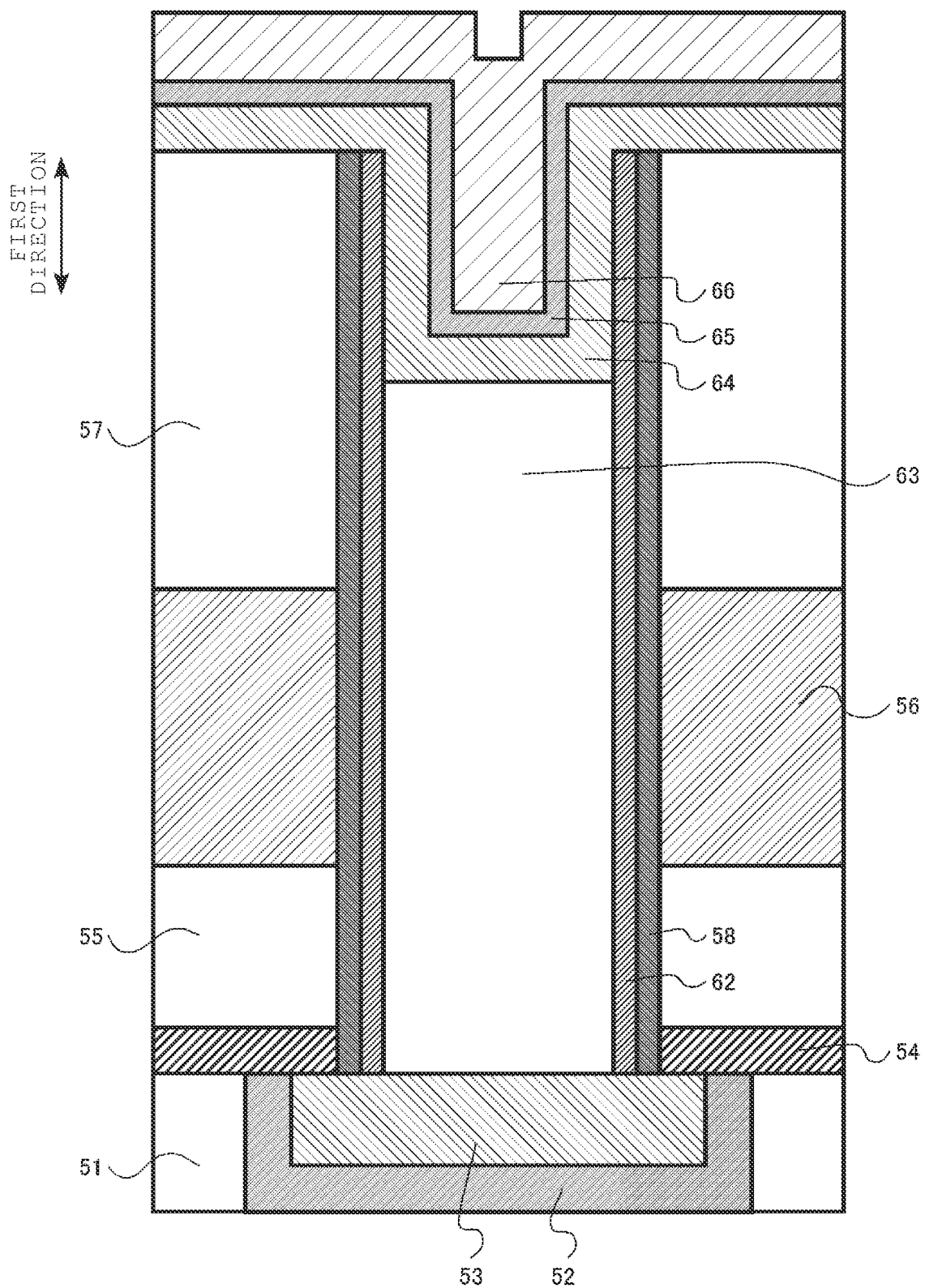

Next, on the indium gallium zinc oxide film 63, a second indium tin oxide film 64, a second titanium nitride film 65, and a second tungsten film 66 are formed in this order (FIG. 29). The second indium tin oxide film 64, the second titanium nitride film 65, and the second tungsten film 66 are formed using, for example, the CVD method.

A part of the second indium tin oxide film 64 finally becomes the upper electrode 14. A part of the second titanium nitride film 65 finally becomes the upper barrier conductive layer 28. A part of the second tungsten film 66 finally becomes the metal layer 38.

Figure 30:
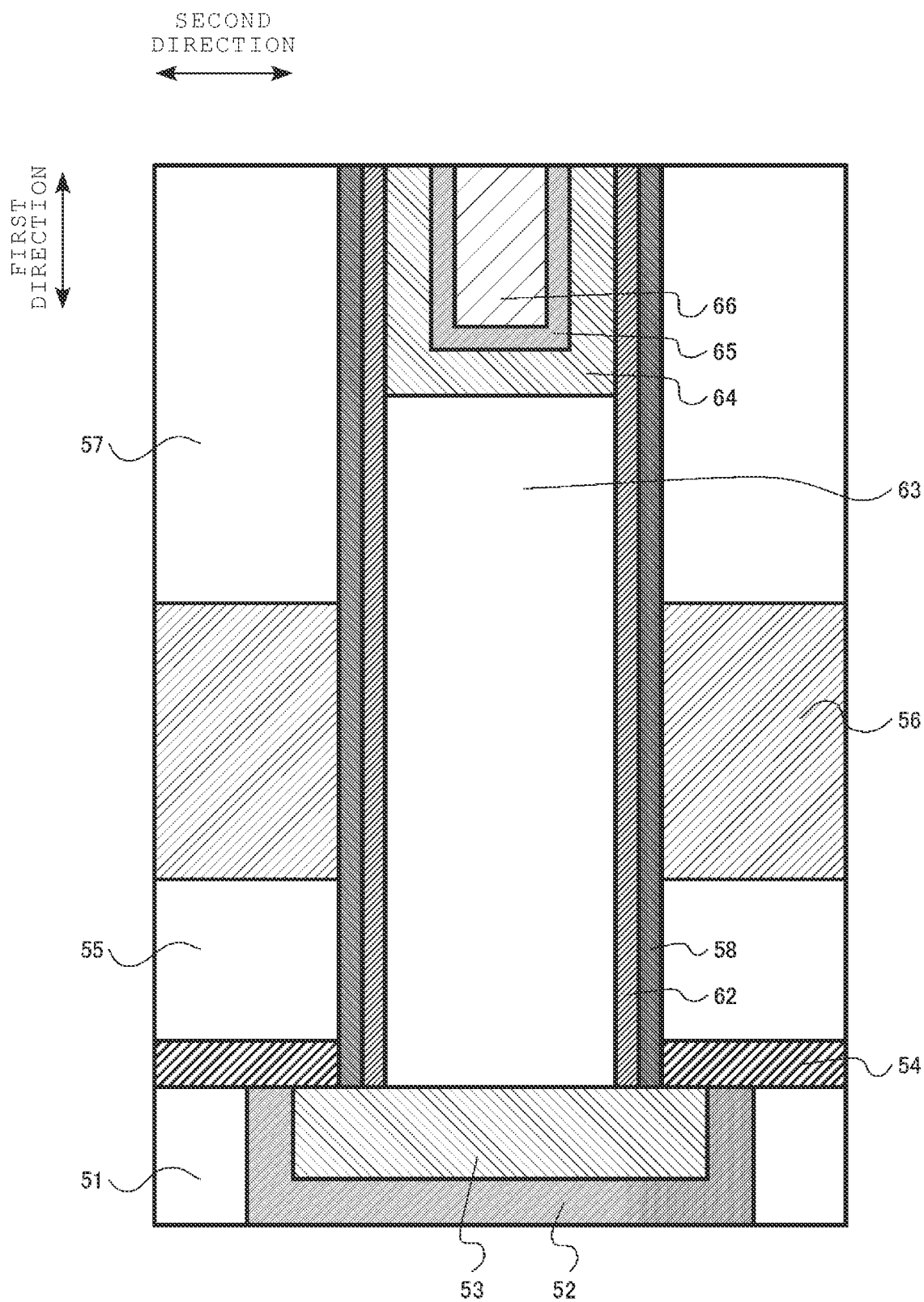

Next, the upper portions of the second indium tin oxide film 64, the second titanium nitride film 65, and the second tungsten film 66 are removed and planarized (FIG. 30). The upper portions of the second indium tin oxide film 64, the second titanium nitride film 65, and the second tungsten film 66 are planarized using, for example, the CMP method.

Figure 31:
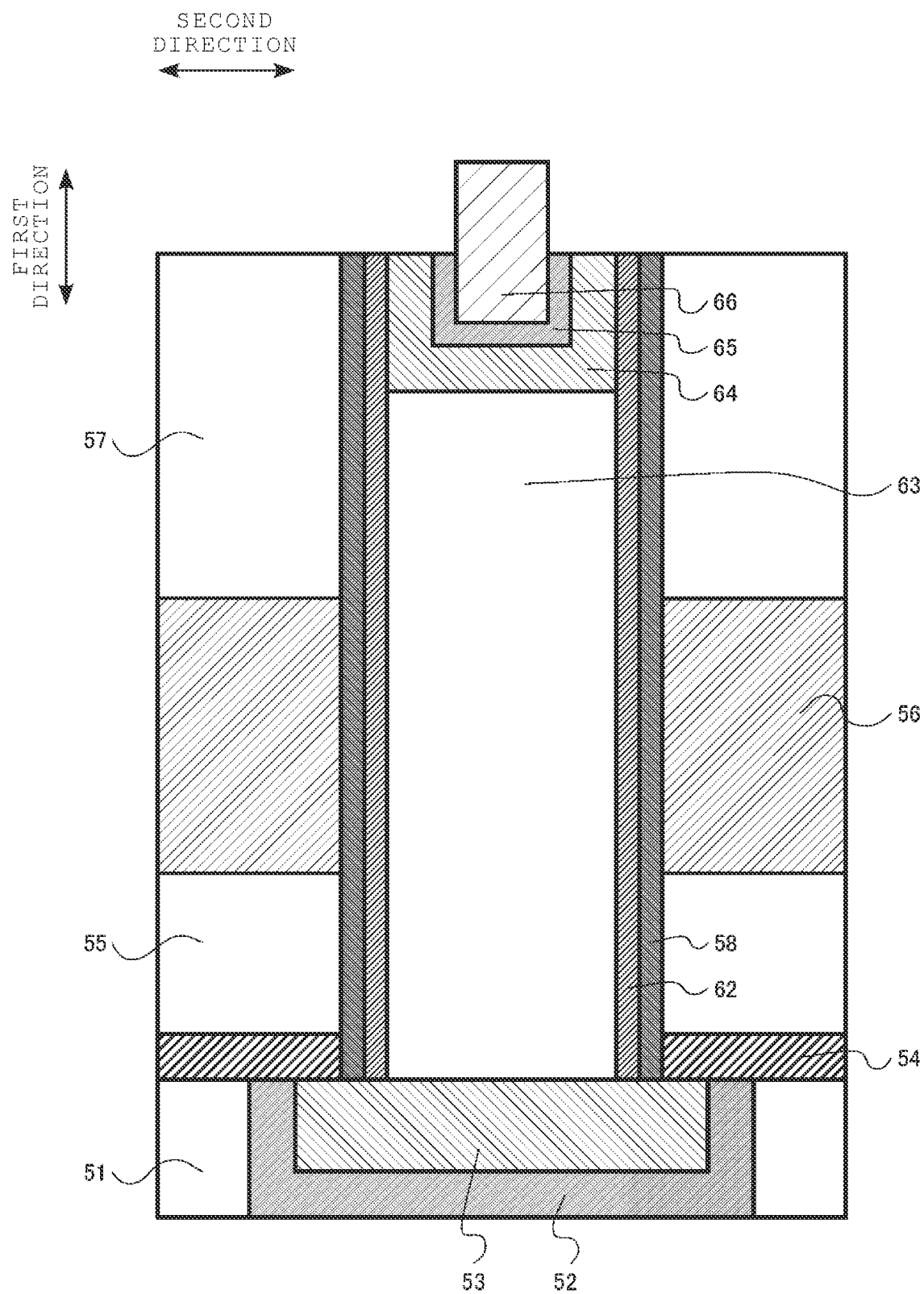

Next, the second indium tin oxide film 64, the second titanium nitride film 65, the fourth silicon oxide film 62, the second silicon nitride film 58, and the third silicon oxide film 57 are selectively etched back with respect to the second tungsten film 66 (FIG. 31). The second tungsten film 66 remains in a protruding state. The selective etch-back is performed by, for example, the RIE method.

Next, a heat treatment for adjusting an amount of oxygen vacancies in the indium gallium zinc oxide film 63 is performed. For example, when it is desired to increase the amount of oxygen vacancies, heat treatment is performed in a non-oxidizing atmosphere to accelerate desorption of oxygen from the indium gallium zinc oxide film 63. For example, when it is desired to reduce the amount of oxygen vacancies, heat treatment is performed in an oxidizing atmosphere to accelerate supply of oxygen to the indium gallium zinc oxide film 63.

The second indium tin oxide film 64 serves as a path for desorption of oxygen from the indium gallium zinc oxide film 63 or a path for supply of oxygen to the indium gallium zinc oxide film 63. By adjusting the amount of oxygen vacancies in the indium gallium zinc oxide film 63, for example, a threshold voltage of the transistor can be set to a desired value.

Figure 32:
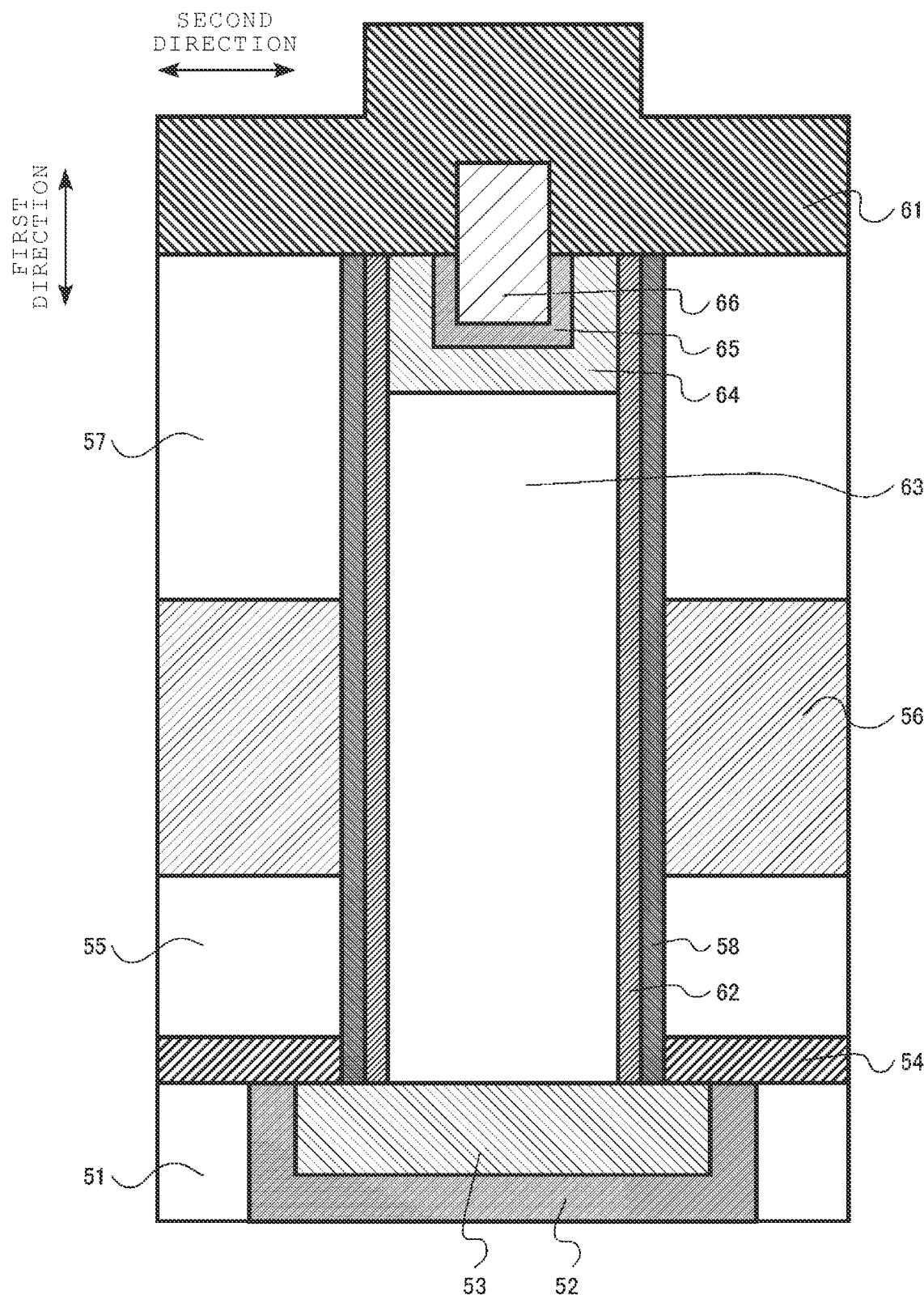

Next, a third silicon nitride film 61 is formed on the second indium tin oxide film 64, the second titanium nitride film 65, and the second tungsten film 66 (FIG. 32). The third silicon nitride film 61 is formed using, for example, the CVD method. A part of the third silicon nitride film 61 finally becomes the upper barrier insulating layer 36.

Figure 33:
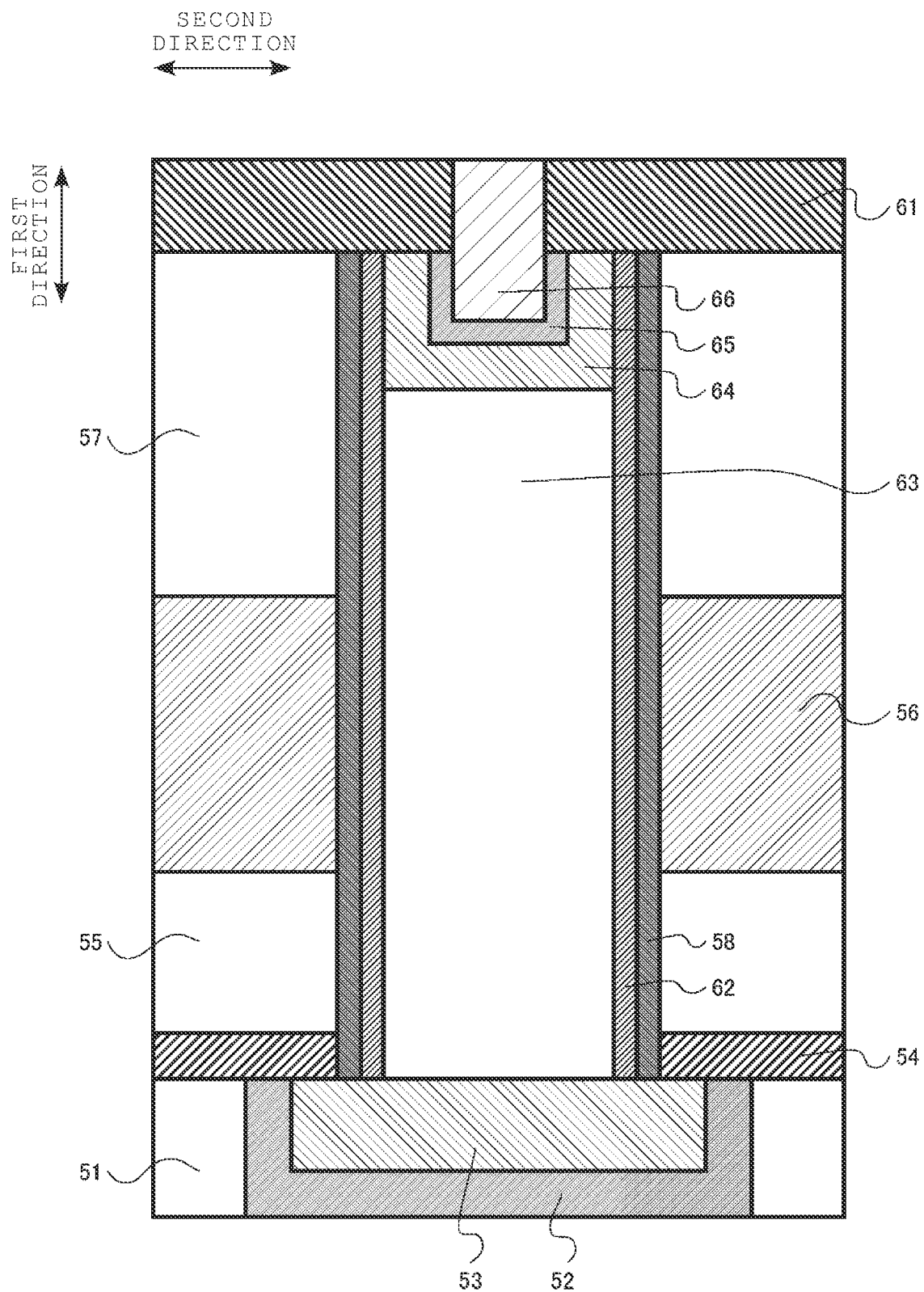

Next, the upper surface of the third silicon nitride film 61 is planarized to expose the surface of the second tungsten film 66 (FIG. 33). The planarization of the upper surface of the third silicon nitride film 61 is performed using, for example, the CMP method.

By the manufacturing method described above, the transistor 200 illustrated in FIGS. 18, 19, 20, 21 and 22 is manufactured.

Next, the action and effect of the semiconductor device according to the second embodiment will be described.

In the transistor 200 according to the second embodiment, the lower electrode 12, the oxide semiconductor layer 16, and the upper electrode 14 are surrounded by the gate insulating layer 20, the lower barrier conductive layer 26, the upper barrier conductive layer 28, the first sidewall barrier layer 30, the lower barrier insulating layer 34, and the upper barrier insulating layer 36. In other words, in the transistor 200 according to the second embodiment, the lower electrode 12, the oxide semiconductor layer 16, and the upper electrode 14 are surrounded by layers having barrier properties against oxygen. For this reason, desorption of oxygen from the oxide semiconductor layer 16 and supply of oxygen to the oxide semiconductor layer 16 due to heat treatment after the transistor structure is formed are prevented.

Therefore, by the same action as the semiconductor device of the first embodiment, variation in transistor characteristics due to heat treatment is prevented. Therefore, according to the second embodiment, the transistor 200 having excellent transistor characteristics can be implemented.

In the transistor 200, the metal layer 38 can be formed above the oxide semiconductor layer 16 in a self-aligned manner with respect to the oxide semiconductor layer 16. Therefore, for example, when forming the metal layer 38, it is not necessary to secure an alignment margin for the oxide semiconductor layer 16. Therefore, for example, when the transistors 200 are located in an array, the intervals between the transistors 200 can be reduced.

As described above, according to the second embodiment, variation in transistor characteristics due to heat treatment is prevented, and a semiconductor device having excellent transistor characteristics can be implemented.

Third Embodiment

A semiconductor device according to a third embodiment includes a first electrode containing a metal oxide, a second electrode containing a metal oxide, an oxide semiconductor layer provided between the first electrode and the second electrode, a gate electrode surrounding the oxide semiconductor layer, a gate insulating layer provided between the gate electrode and the oxide semiconductor layer, surrounding the second electrode in a first cross section perpendicular to a first direction from the first electrode to the second electrode, and containing silicon (Si) and nitrogen (N), a first insulating layer provided between the first electrode and the gate electrode, a second insulating layer provided with the gate electrode between the first insulating layer and the second insulating layer, a first conductive layer being in contact with a surface of the first electrode opposite to the oxide semiconductor layer and containing at least one conductor selected from a group consisting of metal, metal nitride, and metal carbide, a second conductive layer being in contact with a surface of the second electrode opposite to the oxide semiconductor layer, being in contact with the gate insulating layer, provided with the second insulating layer between the gate electrode and the second conductive layer, and containing at least one conductor selected from a group consisting of metal, metal nitride, and metal carbide, a first layer surrounding the first electrode in a second cross section perpendicular to the first direction, being in contact with the first conductive layer, and containing at least one insulator selected from a group consisting of aluminum oxide, magnesium oxide, gallium oxide, germanium oxide, yttrium oxide, zirconium oxide, lanthanum oxide, hafnium oxide, tantalum oxide, silicon nitride, aluminum nitride, silicon oxynitride, and aluminum oxynitride or at least one conductor selected from a group consisting of metal, metal nitride, and metal carbide, a third insulating layer provided between the first electrode and the first insulating layer, being in contact with the gate insulating layer and the first layer, and containing at least one insulator selected from a group consisting of aluminum oxide, magnesium oxide, gallium oxide, germanium oxide, yttrium oxide, zirconium oxide, lanthanum oxide, hafnium oxide, tantalum oxide, silicon nitride, aluminum nitride, silicon oxynitride, and aluminum oxynitride.

The semiconductor device according to the third embodiment differs from the first embodiment in that the second electrode is surrounded by the gate insulating layer, and also the second layer (e.g., a second sidewall barrier layer 32) and the fourth insulating layer (e.g., a upper barrier insulating layer 36) are not provided. Unless otherwise noted or apparent, the description provided with respect to the first embodiment may be considered to apply to the third embodiment as well.

Figure 34:
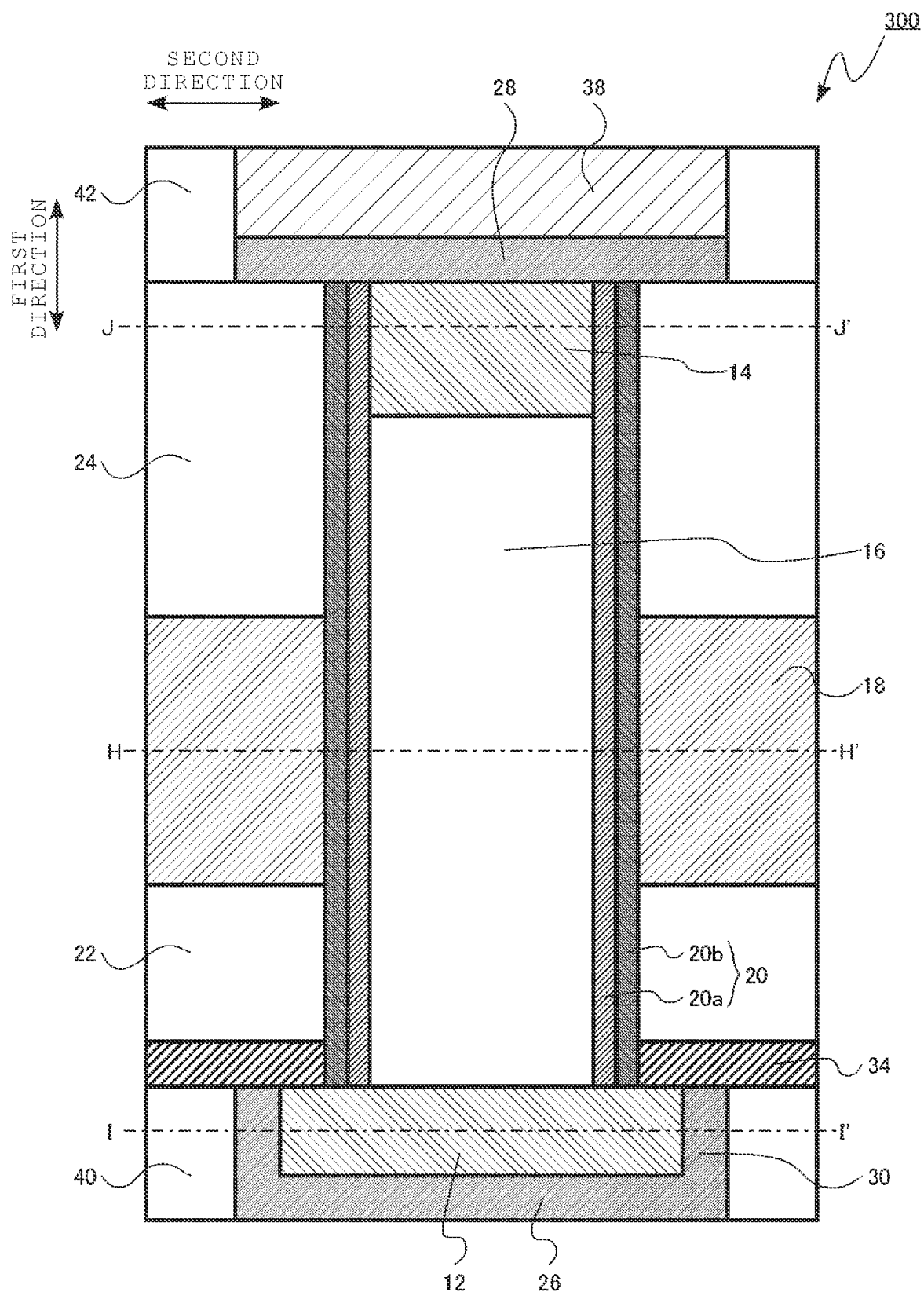
FIG. 34 is a schematic cross-sectional view of a semiconductor device according to a third embodiment.
Figure 35:
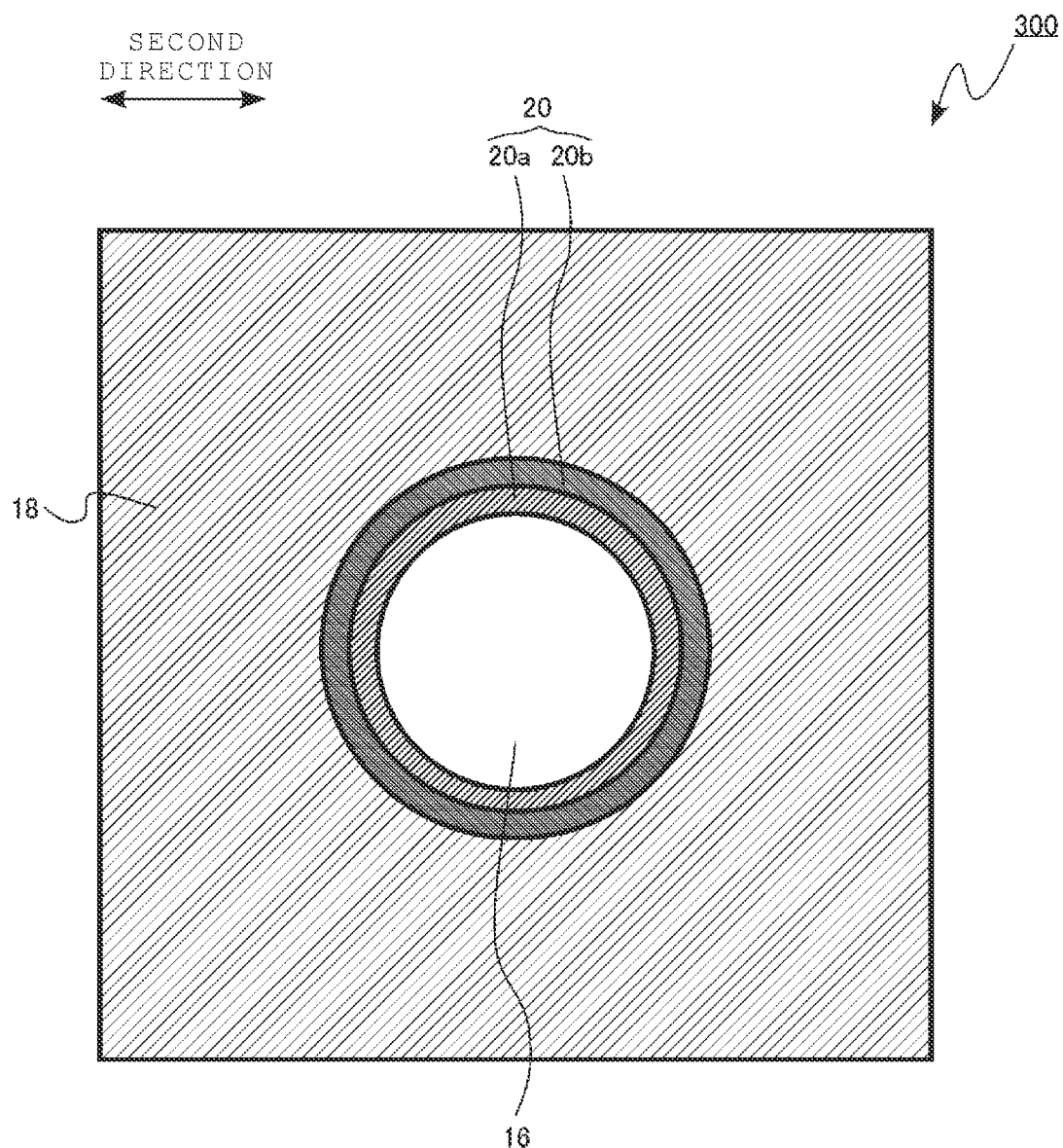
FIG. 35 is a schematic cross-sectional view of a semiconductor device according to a third embodiment.
Figure 36:
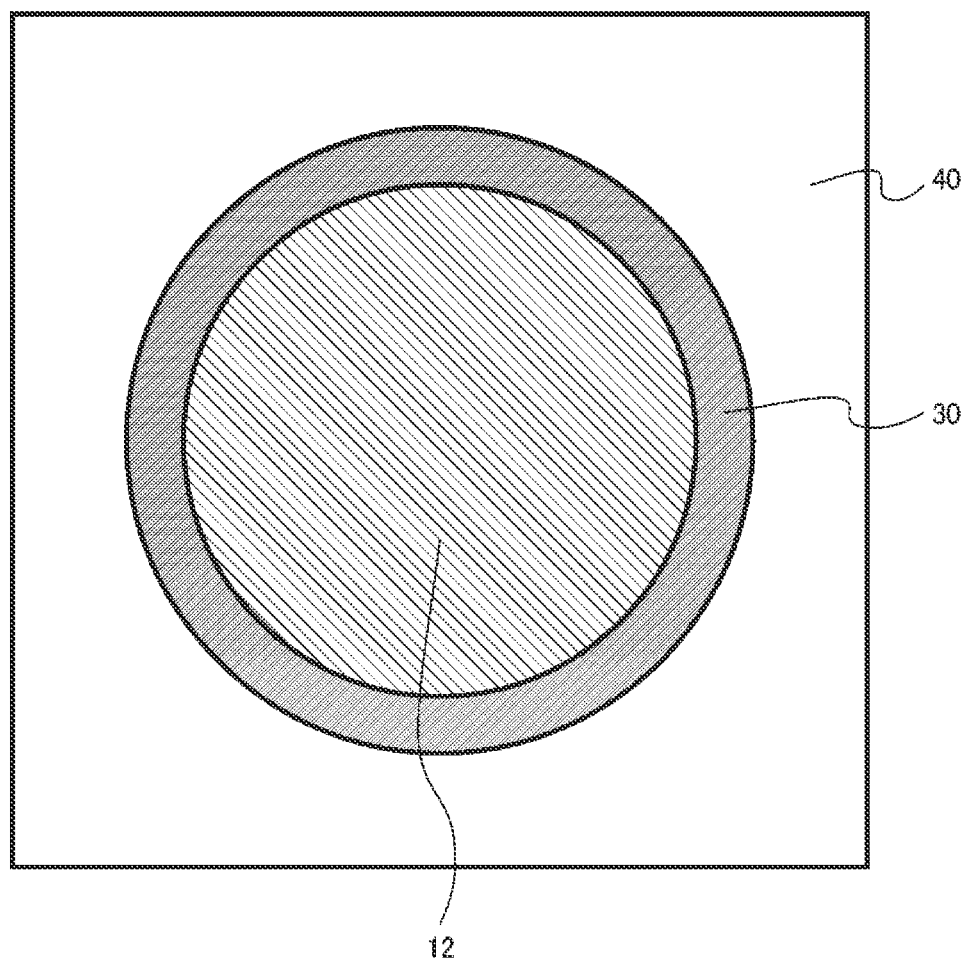
FIG. 36 is a schematic cross-sectional view of a semiconductor device according to a third embodiment.
Figure 37:
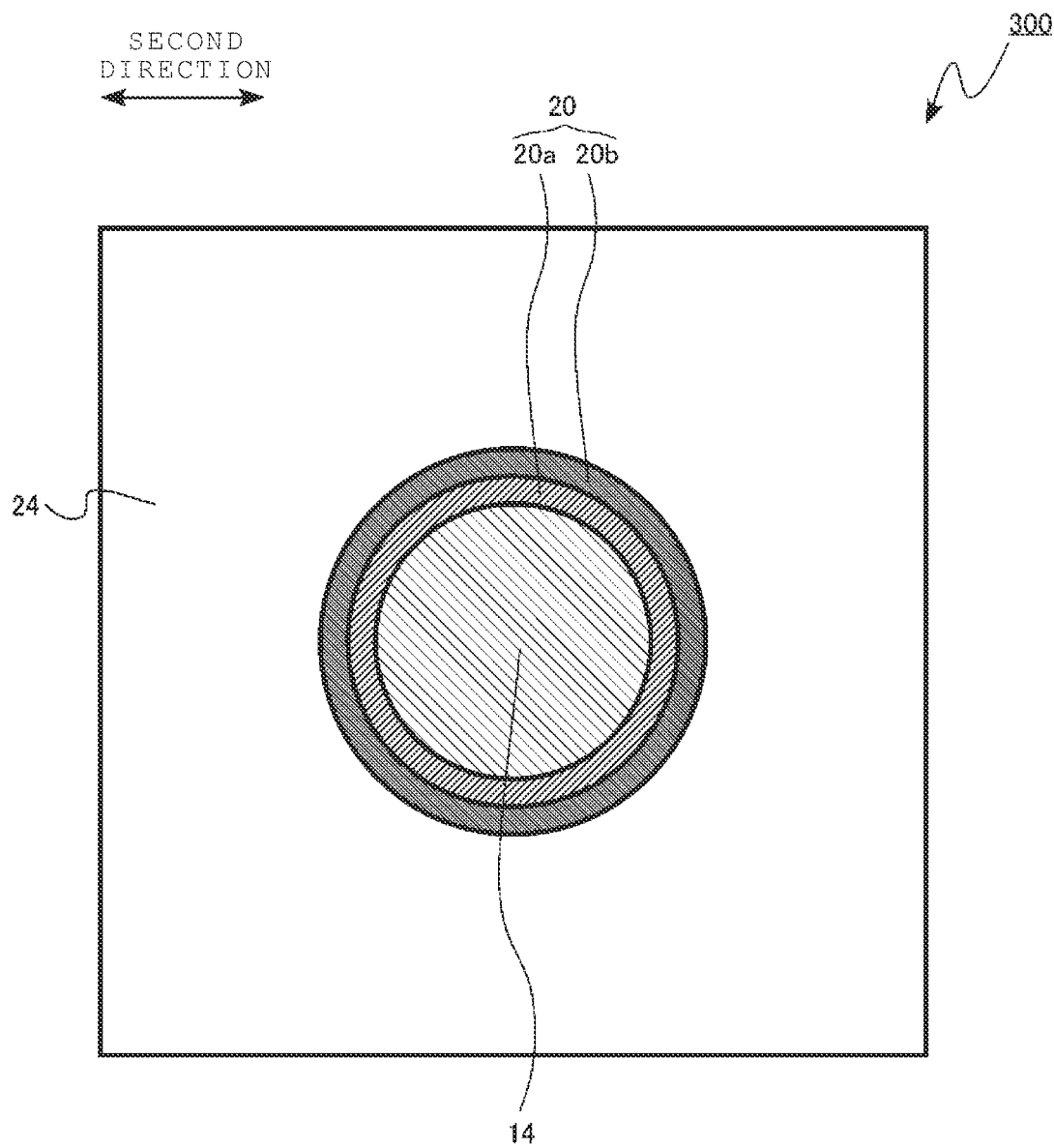
FIG. 37 is a schematic cross-sectional view of a semiconductor device according to a third embodiment.

FIGS. 34, 35, 36, and 37 are schematic cross-sectional views of the semiconductor device according to the third embodiment. FIG. 35 is a cross-sectional view taken along line HH' of FIG. 34. FIG. 36 is a cross-sectional view taken along line II' of FIG. 34. FIG. 37 is a cross-sectional view taken along line JJ' of FIG. 34. In FIG. 34, the vertical direction is called a first direction. In FIG. 34, the horizontal direction is called a second direction. The second direction is perpendicular to the first direction.

The cross section taken along line II' is an example of a second cross section. The cross section taken along line JJ' is an example of a first cross section.

The semiconductor device according to the third embodiment is a transistor 300. The transistor 300 is an oxide semiconductor transistor in which a channel is formed in an oxide semiconductor. In the transistor 300, a gate electrode surrounds the oxide semiconductor layer in which the channel is formed. The transistor 300 is a so-called SGT. The transistor 300 is a so-called vertical transistor.

The transistor 300 includes a lower electrode 12, an upper electrode 14, an oxide semiconductor layer 16, a gate electrode 18, a gate insulating layer 20, a lower insulating layer 22, an upper insulating layer 24, a lower barrier conductive layer 26, an upper barrier conductive layer 28, a first sidewall barrier layer 30, a lower barrier insulating layer 34, a metal layer 38, a lower interlayer insulating layer 40, and an upper interlayer insulating layer 42. The gate insulating layer 20 includes a first gate insulating film 20a and a second gate insulating film 20b.

The lower electrode 12 is an example of the first electrode. The upper electrode 14 is an example of the second electrode. The lower insulating layer 22 is an example of the first insulating layer. The upper insulating layer 24 is an example of the second insulating layer. The lower barrier conductive layer 26 is an example of the first conductive layer. The upper barrier conductive layer 28 is an example of the second conductive layer. The first sidewall barrier layer 30 is an example of the first layer. The lower barrier insulating layer 34 is an example of the third insulating layer. The first gate insulating film 20a is an example of a first film. The second gate insulating film 20b is an example of a second film.

The upper electrode 14 is provided on the oxide semiconductor layer 16. The upper electrode 14 is electrically connected to the oxide semiconductor layer 16. The upper electrode 14 is in contact with the oxide semiconductor layer 16, for example. The upper electrode 14 functions as a source electrode or drain electrode of the transistor 300.

The upper electrode 14 is surrounded by the upper insulating layer 24 and the gate insulating layer 20, as illustrated in FIG. 37. The upper electrode 14 is surrounded by the upper insulating layer 24 and the gate insulating layer 20 in the first cross section perpendicular to the first direction. The cross section taken along line JJ' illustrated in FIG. 37 is an example of the first cross section.

As illustrated in FIG. 35, the gate electrode 18 surrounds the oxide semiconductor layer 16 in a cross section perpendicular to the first direction. The gate electrode 18 is provided around the oxide semiconductor layer 16.

The upper barrier conductive layer 28 is provided on the upper electrode 14. The upper barrier conductive layer 28 is in contact with a surface of the upper electrode 14 opposite to the oxide semiconductor layer 16.

The upper barrier conductive layer 28 is in contact with the gate insulating layer 20. The upper barrier conductive layer 28 is in contact with the second gate insulating film 20b, for example.

The upper insulating layer 24 is provided between the upper barrier conductive layer 28 and the gate electrode.

The first sidewall barrier layer 30 surrounds the side surfaces of the lower electrode 12. As illustrated in FIG. 36, the first sidewall barrier layer 30 surrounds the lower electrode 12 in the second cross section perpendicular to the first direction. The cross section (illustrated in FIG. 36) taken along line II' (illustrated in FIG. 34) is an example of the second cross section.

The metal layer 38 is provided on the upper barrier conductive layer 28. Then upper barrier conductive layer 28 is provided between the metal layer 38 and the upper electrode 14. The metal layer 38 is in contact with the upper barrier conductive layer 28, for example.

Next, an example of a method for manufacturing the semiconductor device according to the third embodiment will be described.

FIGS. 38, 39, 40, 41, 42, 43, 44, 45 and 46 are schematic cross-sectional views illustrating an example of the method for manufacturing the semiconductor device according to the third embodiment. FIGS. 38 to 46 each illustrate a cross section corresponding to FIG. 34. FIGS. 38 to 46 are diagrams illustrating an example of the method for manufacturing the transistor 300.

Hereinafter, a case where the lower electrode 12 is an indium tin oxide layer, the upper electrode 14 is an indium tin oxide layer, the oxide semiconductor layer 16 is an indium gallium zinc oxide layer, the gate electrode 18 is a tungsten layer, the gate insulating layer 20 has a stacked structure of a silicon oxide film and a silicon nitride film, the lower insulating layer 22 is a silicon oxide layer, the upper insulating layer 24 is a silicon oxide layer, the lower barrier conductive layer 26 is a titanium nitride layer, the upper barrier conductive layer 28 is a titanium nitride layer, the first sidewall barrier layer 30 is a titanium nitride layer, the lower barrier insulating layer 34 is a silicon nitride layer, the metal layer 38 is a tungsten layer, the lower interlayer insulating layer 40 is a silicon oxide layer, and the upper interlayer insulating layer 42 is a silicon oxide layer will be described as an example.

First, a first silicon oxide film 51 is formed on a substrate (not illustrated). The first silicon oxide film 51 is formed by, for example, the CVD method.

Next, an opening (not illustrated) is formed in the first silicon oxide film 51. The opening of the first silicon oxide film 51 is formed using, for example, the lithography method and the RIE method.

Next, in the opening of the first silicon oxide film 51, a first titanium nitride film 52 and a first indium tin oxide film 53 are formed. The first titanium nitride film 52 and the first indium tin oxide film 53 are formed using, for example, the CVD method.

Figure 38:
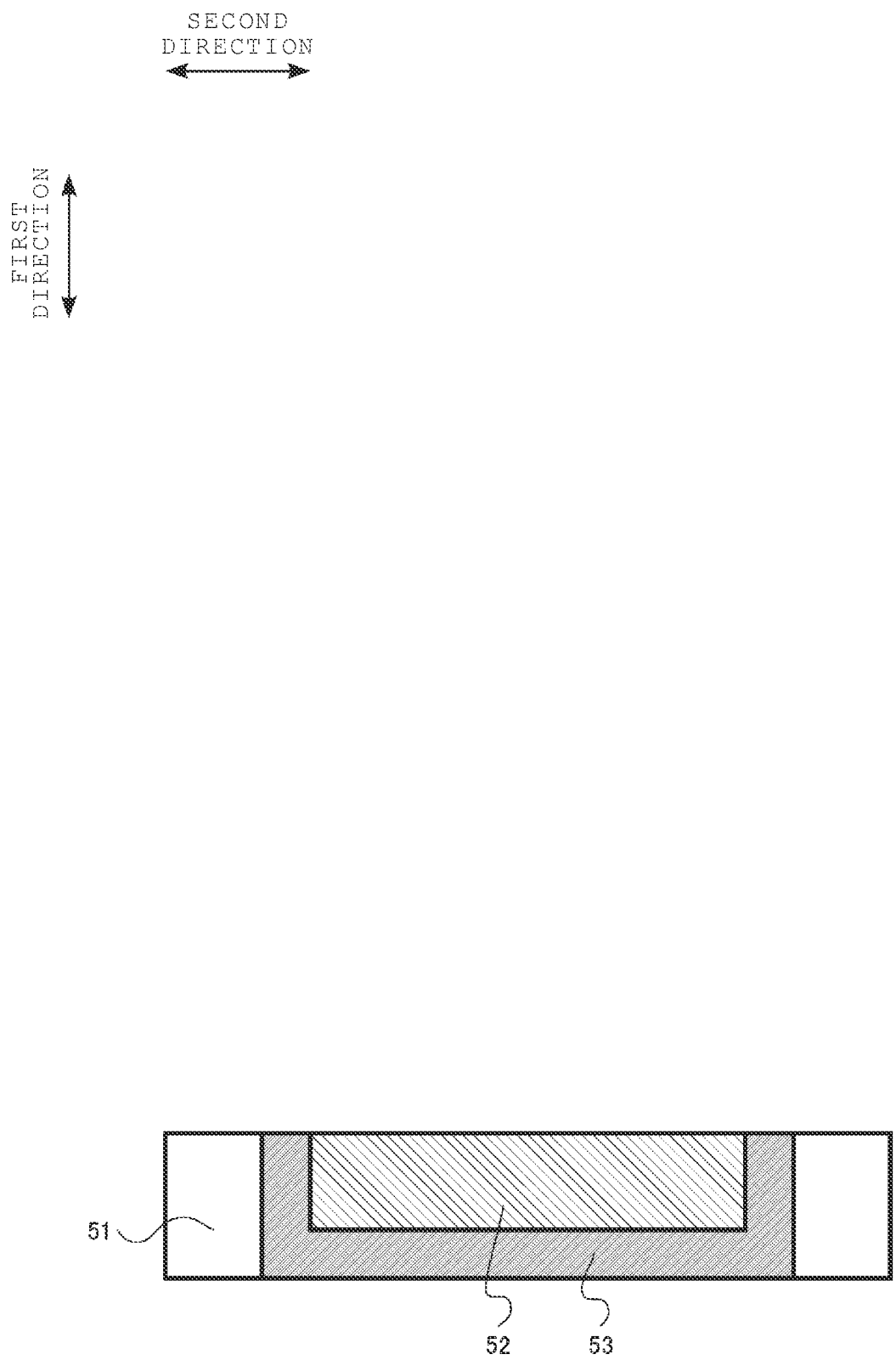
FIGS. 38 to 46 are schematic cross-sectional views depicting aspects of a method for manufacturing the semiconductor device according to a third embodiment.

Next, the first titanium nitride film 52 and the first indium tin oxide film 53 on the surface of the first silicon oxide film 51 are removed (FIG. 38). For example, the CMP method is used for removing the first titanium nitride film 52 and the first indium tin oxide film 53.

The first silicon oxide film 51 finally becomes the lower interlayer insulating layer 40. The first titanium nitride film 52 finally becomes the lower barrier conductive layer 26 and the first sidewall barrier layer 30. The first indium tin oxide film 53 finally becomes the lower electrode 12.

Figure 39:
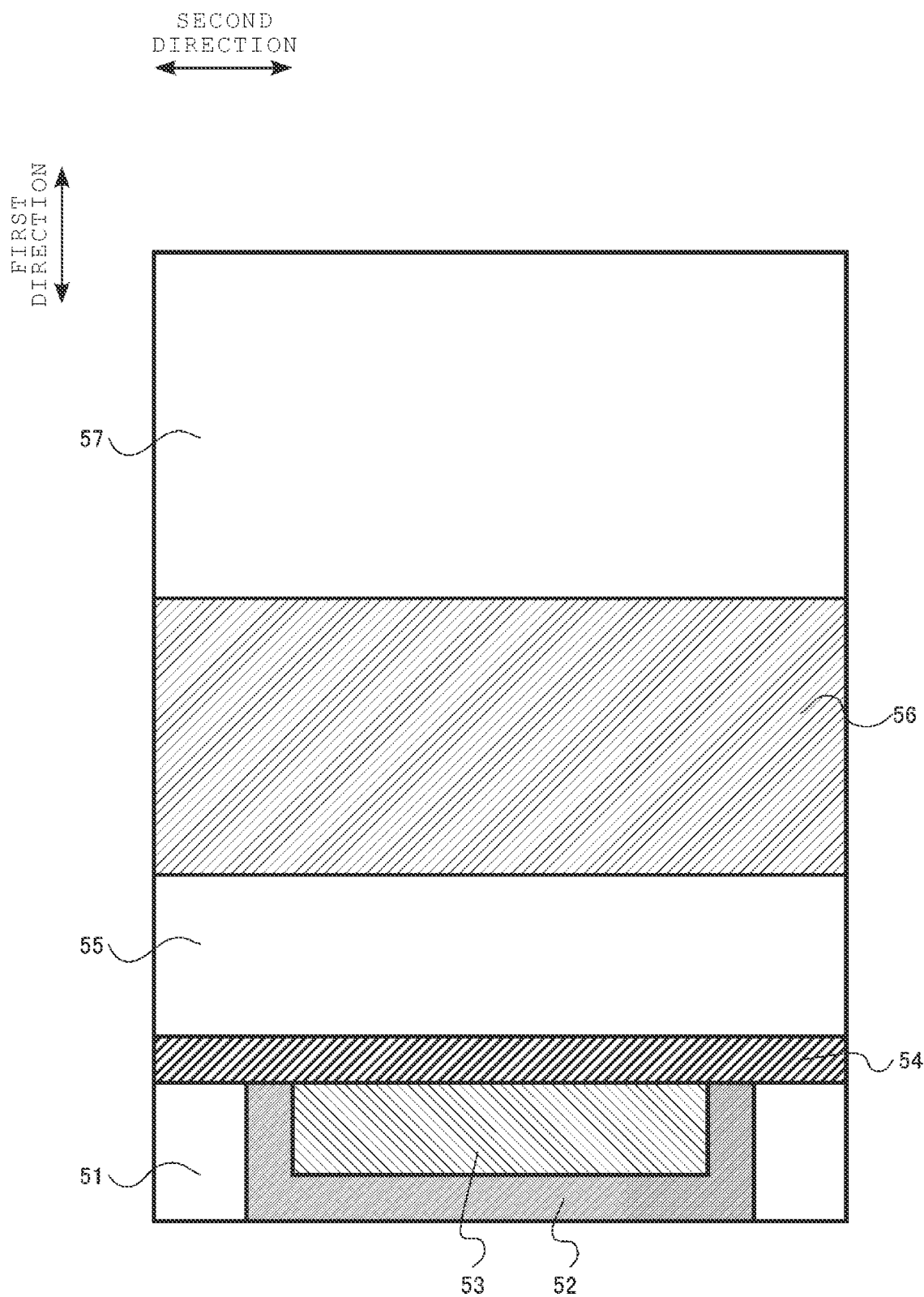

Next, on the first indium tin oxide film 53, a first silicon nitride film 54, a second silicon oxide film 55, a first tungsten film 56, and a third silicon oxide film 57 are stacked in this order in the first direction (FIG. 39). The first silicon nitride film 54, the second silicon oxide film 55, the first tungsten film 56, and the third silicon oxide film 57 are formed using, for example, the CVD method.

A part of the first silicon nitride film 54 finally becomes the lower barrier insulating layer 34. A part of the second silicon oxide film 55 finally becomes the lower insulating layer 22. A part of the first tungsten film 56 finally becomes the gate electrode 18. A part of the third silicon oxide film 57 finally becomes the upper insulating layer 24.

Figure 40:
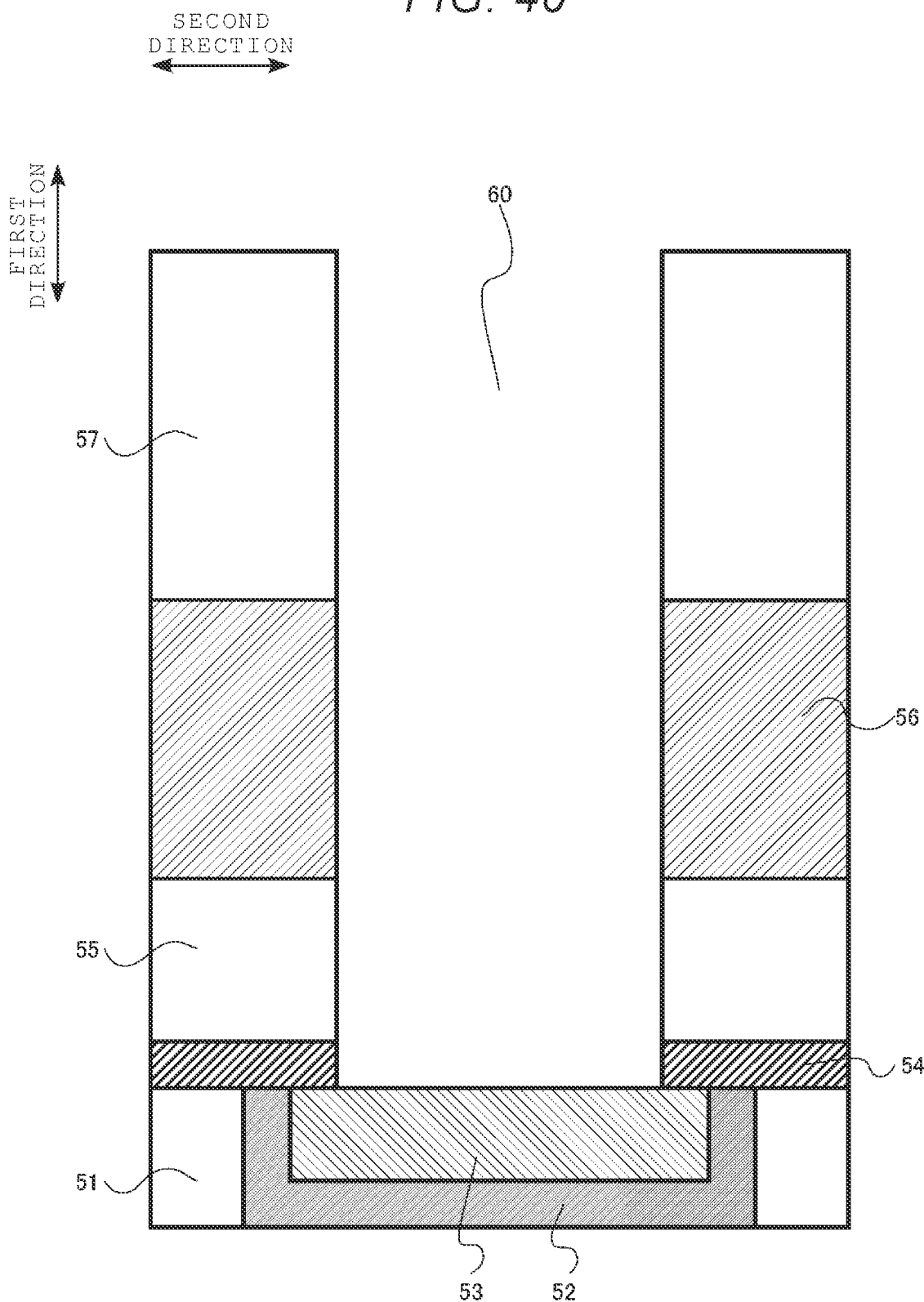

Next, an opening 60 extending from the surface of the third silicon oxide film 57 to reach the first indium tin oxide film 53 is formed by penetrating through the third silicon oxide film 57, the first tungsten film 56, the second silicon oxide film 55, and the first silicon nitride film 54 (FIG. 40). The opening 60 is formed using, for example, the lithography method and the RIE method.

Figure 41:
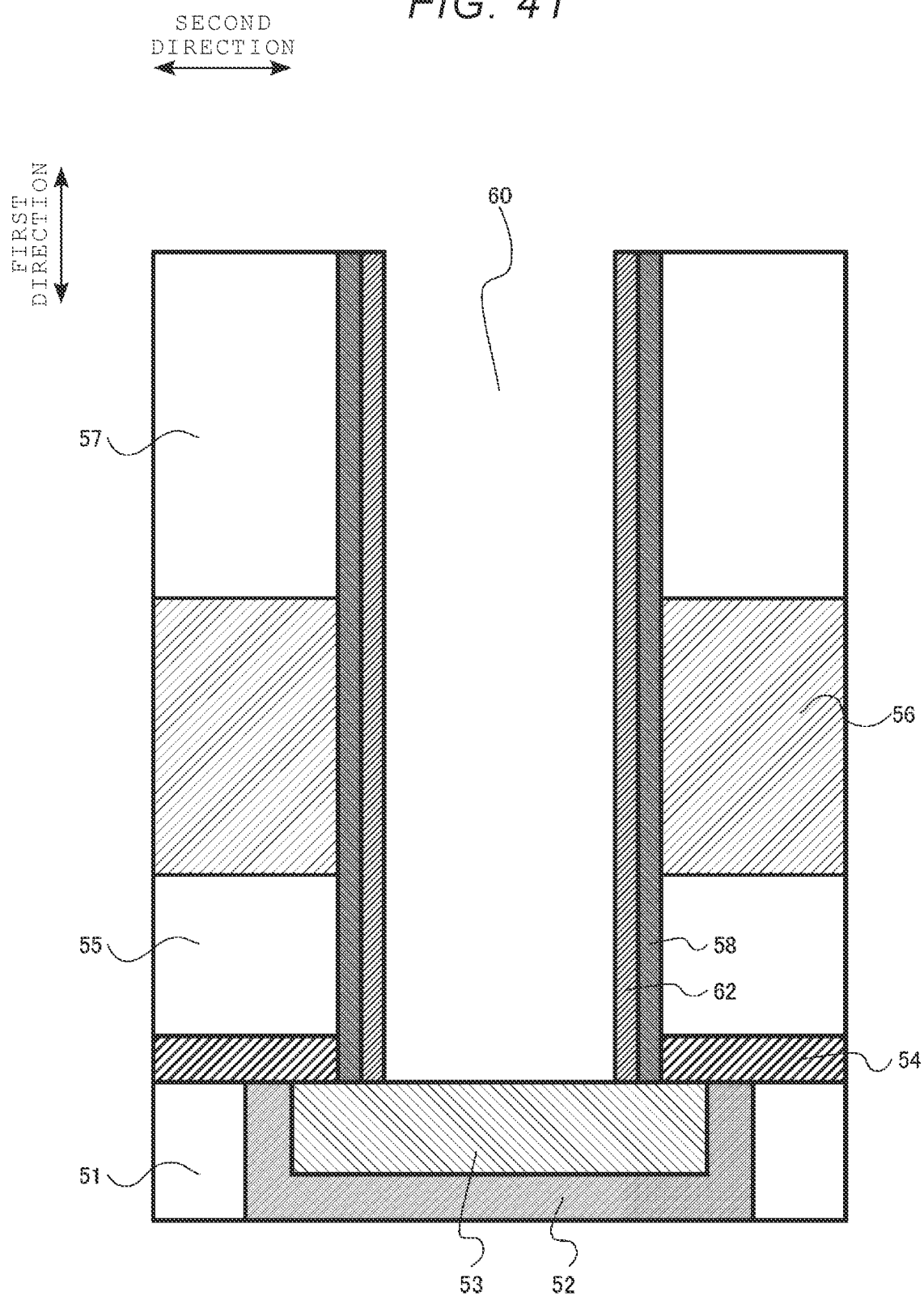

Next, a second silicon nitride film 58 and a fourth silicon oxide film 62 are formed on inner side surfaces of the opening 60 (FIG. 41). The second silicon nitride film 58 and the fourth silicon oxide film 62 are formed by, for example, deposition by the CVD method and etching by the RIE method. The second silicon nitride film 58 finally becomes the second gate insulating film 20b. The fourth silicon oxide film 62 finally becomes the first gate insulating film 20a.

Figure 42:
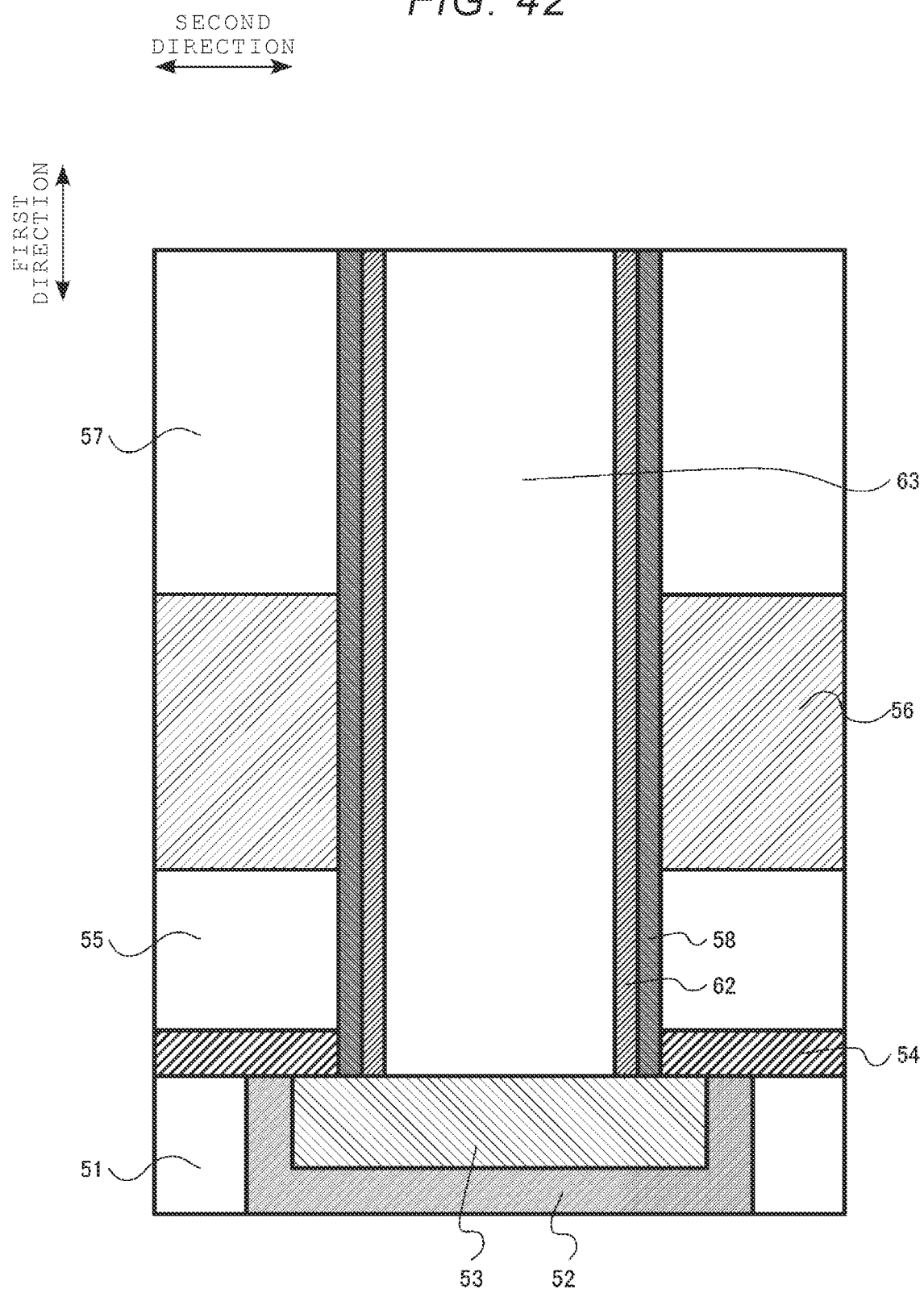

Next, the opening 60 is filled with an indium gallium zinc oxide film 63 (FIG. 42). A part of the indium gallium zinc oxide film 63 finally becomes the oxide semiconductor layer 16. The indium gallium zinc oxide film 63 is deposited, for example, by the CVD method, and then a part of an upper portion thereof is removed by the CMP method.

Figure 43:
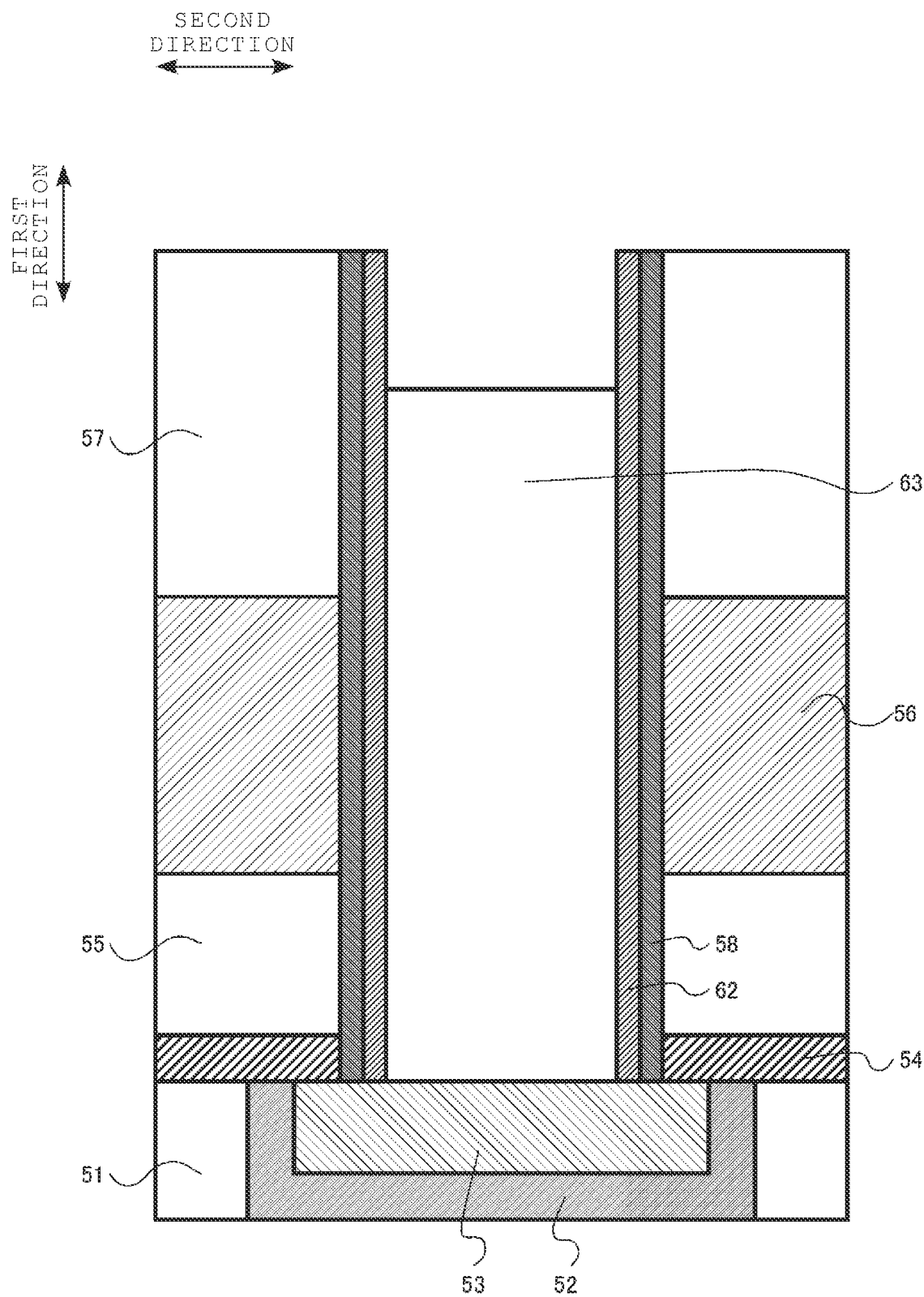

Next, a part of the upper portion of the indium gallium zinc oxide film 63 is selectively etched back (FIG. 43). Etching back of the indium gallium zinc oxide film 63 is performed using, for example, the RIE method.

Figure 44:
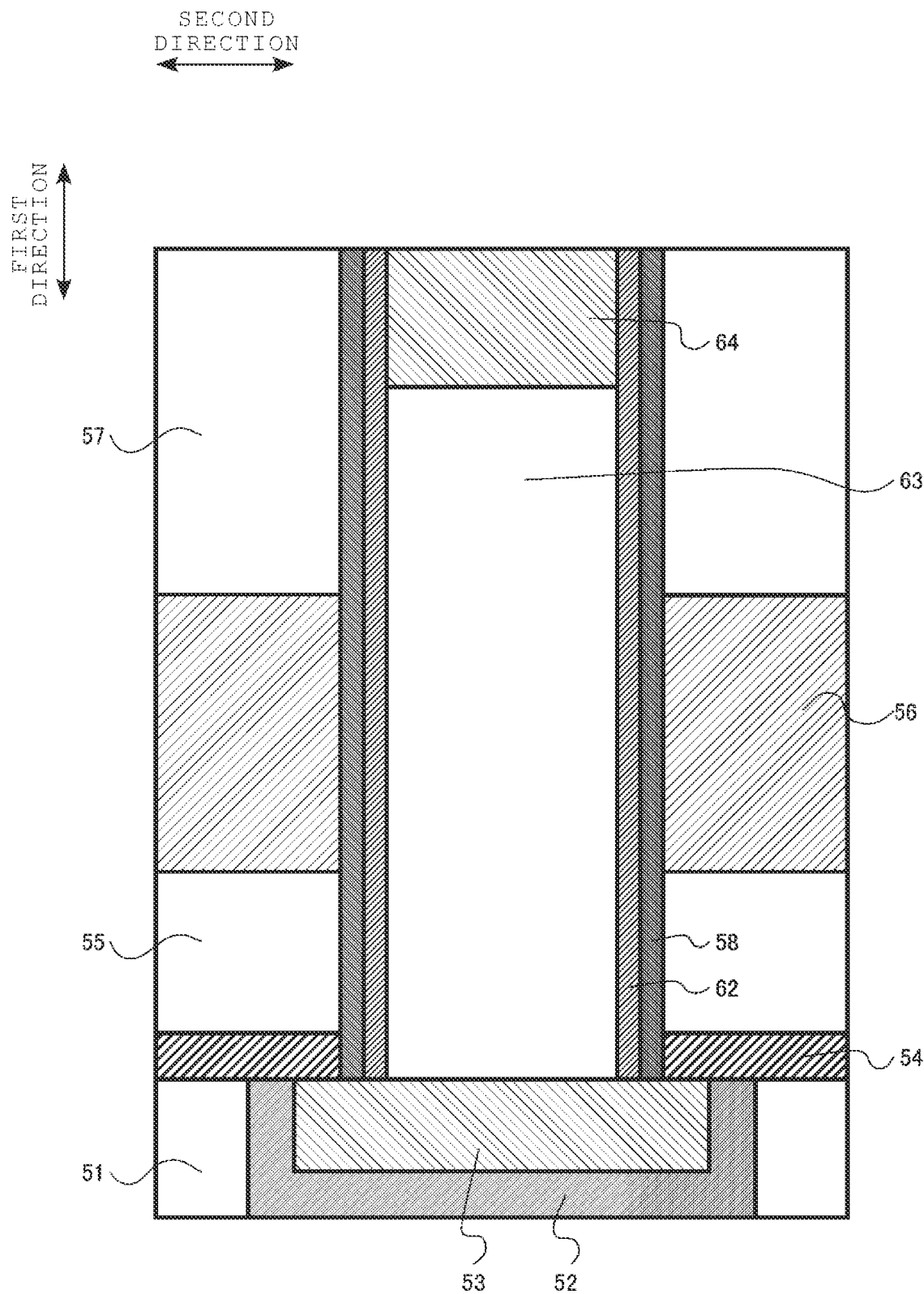

Next, a second indium tin oxide film 64 is formed on the indium gallium zinc oxide film 63 (FIG. 44). After the second indium tin oxide film 64 is deposited by, for example, the CVD method, the surface of the third silicon oxide film 57 is removed by CMP method. The second indium tin oxide film 64 finally becomes the upper electrode 14.

Next, a heat treatment for adjusting an amount of oxygen vacancies in the indium gallium zinc oxide film 63 is performed. For example, when it is desired to increase the amount of oxygen vacancies, heat treatment is performed in a non-oxidizing atmosphere to accelerate desorption of oxygen from the indium gallium zinc oxide film 63. For example, when it is desired to reduce the amount of oxygen vacancies, heat treatment is performed in an oxidizing atmosphere to accelerate supply of oxygen to the indium gallium zinc oxide film 63.

The second indium tin oxide film 64 serves as a path for desorption of oxygen from the indium gallium zinc oxide film 63 or a path for supply of oxygen to the indium gallium zinc oxide film 63. By adjusting the amount of oxygen vacancies in the indium gallium zinc oxide film 63, for example, a threshold voltage of the transistor can be set to a desired value.

Next, on the second indium tin oxide film 64, a second titanium nitride film 65 and a second tungsten film 66 are formed. The second titanium nitride film 65 and the second tungsten film 66 are formed using the CVD method, for example.

Figure 45:
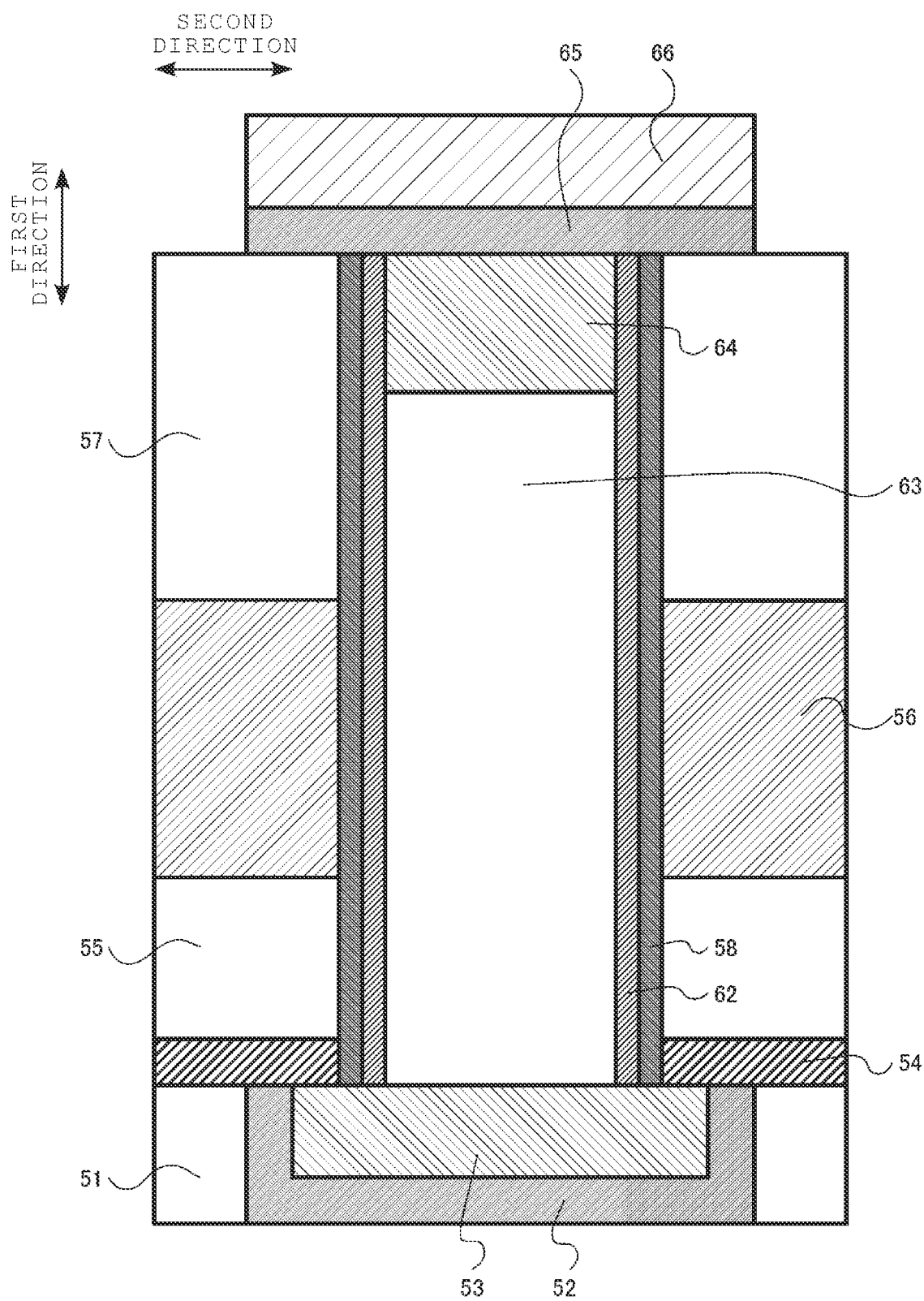

Next, the second titanium nitride film 65 and the second tungsten film 66 are patterned (FIG. 45). The patterning of the second titanium nitride film 65 and the second tungsten film 66 is performed using, for example, the lithography method and the RIE method.

The second titanium nitride film 65 finally becomes the upper barrier conductive layer 28. The second tungsten film 66 finally becomes the metal layer 38.

Figure 46:
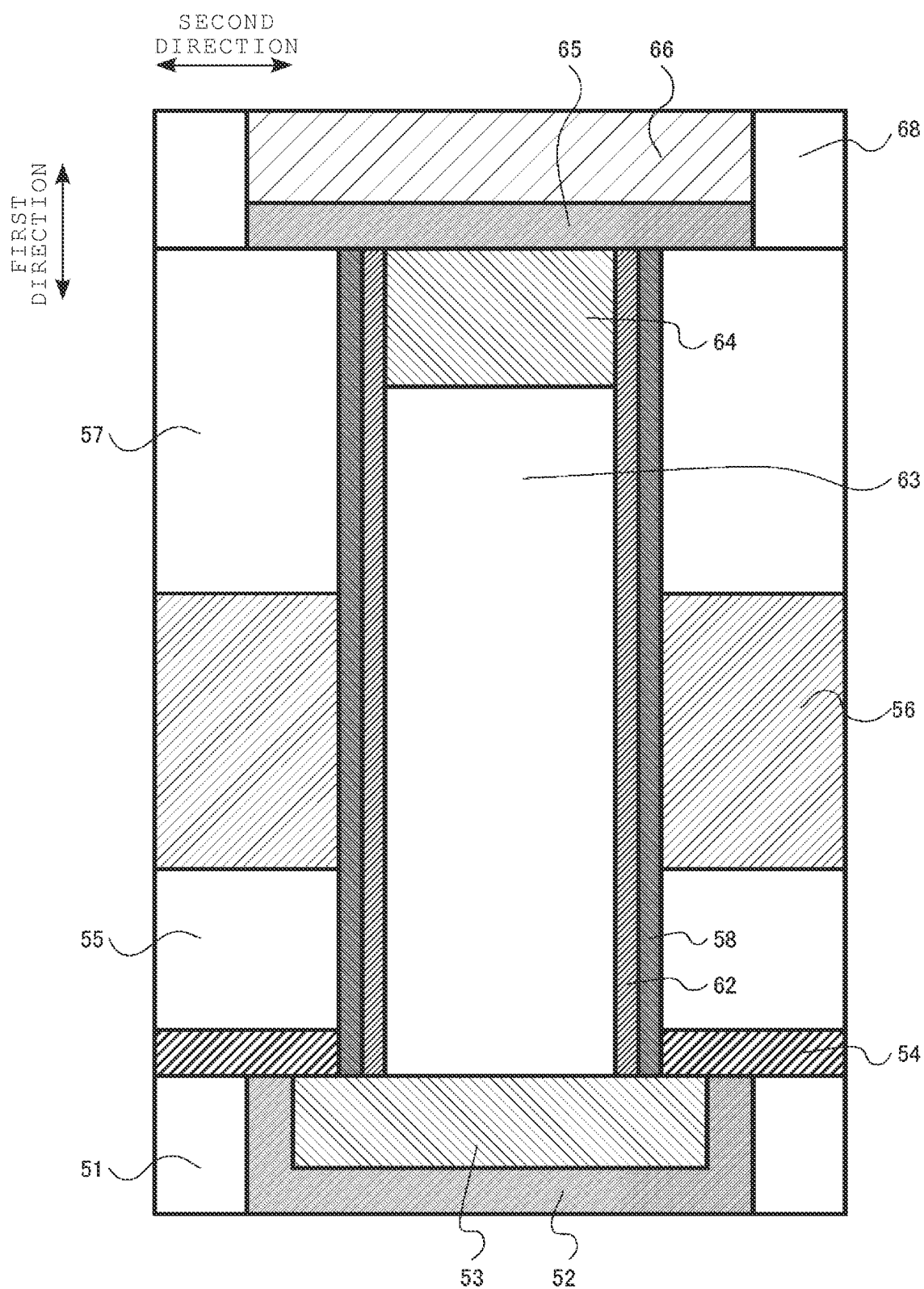

Next, a fifth silicon oxide film 68 is formed on the side surfaces of the second titanium nitride film 65 and the second tungsten film 66 (FIG. 46). The fifth silicon oxide film 68 is formed by the CVD method, for example. The fifth silicon oxide film 68 finally becomes the upper interlayer insulating layer 42.

By the manufacturing method described above, the transistor 300 illustrated in FIGS. 34, 35, 36, and 37 is manufactured.

Next, the action and effect of the semiconductor device according to the third embodiment will be described.

In the transistor 300 according to the third embodiment, the lower electrode 12, the oxide semiconductor layer 16, and the upper electrode 14 are surrounded by the gate insulating layer 20, the lower barrier conductive layer 26, the upper barrier conductive layer 28, the first sidewall barrier layer 30 and the lower barrier insulating layer 34. In other words, in the transistor 300 according to the third embodiment, the lower electrode 12, the oxide semiconductor layer 16, and the upper electrode 14 are surrounded by layers having barrier properties against oxygen. For this reason, desorption of oxygen from the oxide semiconductor layer 16 and supply of oxygen to the oxide semiconductor layer 16 due to heat treatment after the transistor structure is formed are prevented.

Therefore, by the same action as the semiconductor device of the first embodiment, variation in transistor characteristics due to heat treatment is prevented. Therefore, according to the third embodiment, the transistor 300 having excellent transistor characteristics can be implemented.

In the transistor 300, the upper electrode 14 is surrounded by the gate insulating layer 20. Therefore, for example, the second sidewall barrier layer 32 and the upper barrier insulating layer 36 provided in the transistor 100 of the first embodiment are not required. Therefore, for example, the manufacturing process can be simplified compared to the transistor 100 of the first embodiment.

As described above, according to the third embodiment, variation in transistor characteristics due to heat treatment is prevented, and a semiconductor device having excellent transistor characteristics can be implemented.

Fourth Embodiment

A semiconductor memory device according to the fourth embodiment includes the semiconductor device of the first embodiment and a capacitor electrically connected to the first electrode or the second electrode.

The semiconductor memory device according to the fourth embodiment is a semiconductor memory 400. The semiconductor memory device according to the fourth embodiment is a DRAM. The semiconductor memory 400 uses the transistor 100 of the first embodiment as a switching transistor of a DRAM memory cell.

In the following, a part of the description of the content that overlaps with the first embodiment will be omitted.

Figure 47:
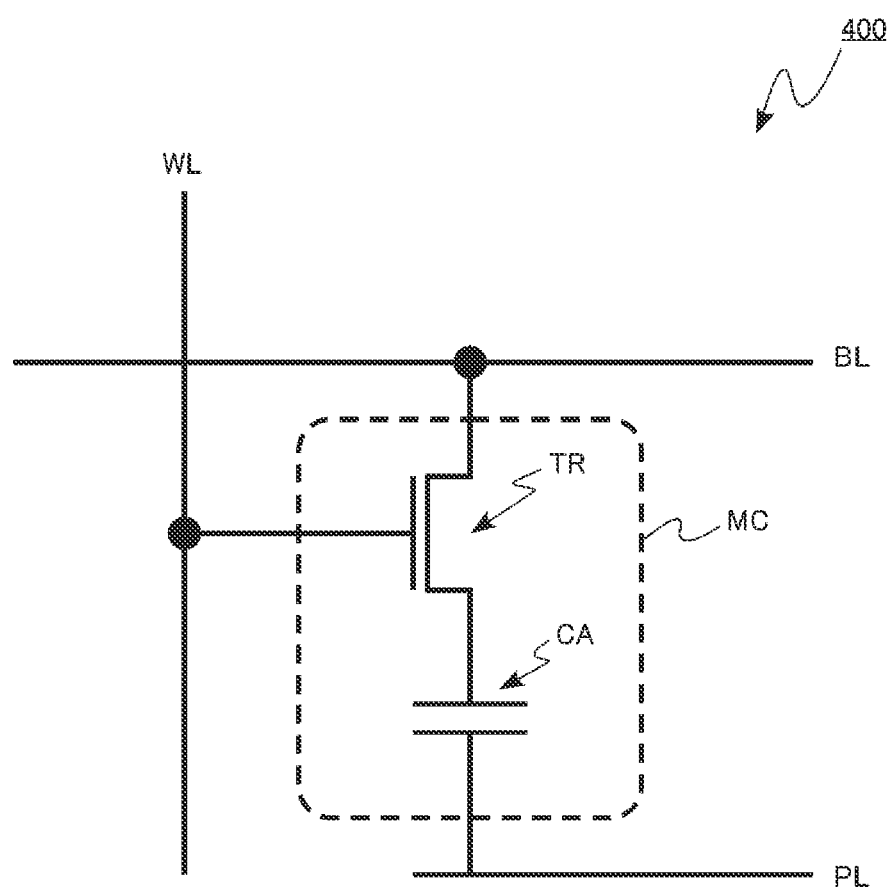
FIG. 47 is an equivalent circuit diagram of a semiconductor memory device of a fourth embodiment.

FIG. 47 is an equivalent circuit diagram of the semiconductor memory device according to the fourth embodiment. Although FIG. 47 illustrates a case where there is one memory cell MC, a plurality of memory cells MC may be provided in an array, for example.

The semiconductor memory 400 includes a memory cell MC, a word line WL, a bit line BL, and a plate line PL. The memory cell MC includes a switching transistor TR and a capacitor CA. In FIG. 47, an area surrounded by a dotted line is the memory cell MC.

The word line WL is electrically connected to a gate electrode of the switching transistor TR. The bit line BL is electrically connected to one of the source/drain electrodes of the switching transistor TR. One electrode of the capacitor CA is electrically connected to the other of the source/drain electrodes of the switching transistor TR. The other electrode of capacitor CA is connected to the plate line PL.

The memory cell MC stores data by storing electric charge in the capacitor CA. Data writing and reading are performed by turning on the switching transistor TR.

For example, the switching transistor TR is turned on in a state where a desired voltage is applied to the bit line BL to write data to the memory cell MC.

For example, the switching transistor TR is turned on, a voltage change of the bit line BL in accordance with an amount of charge stored in the capacitor is detected, and the data of the memory cell MC is read.

Figure 48:
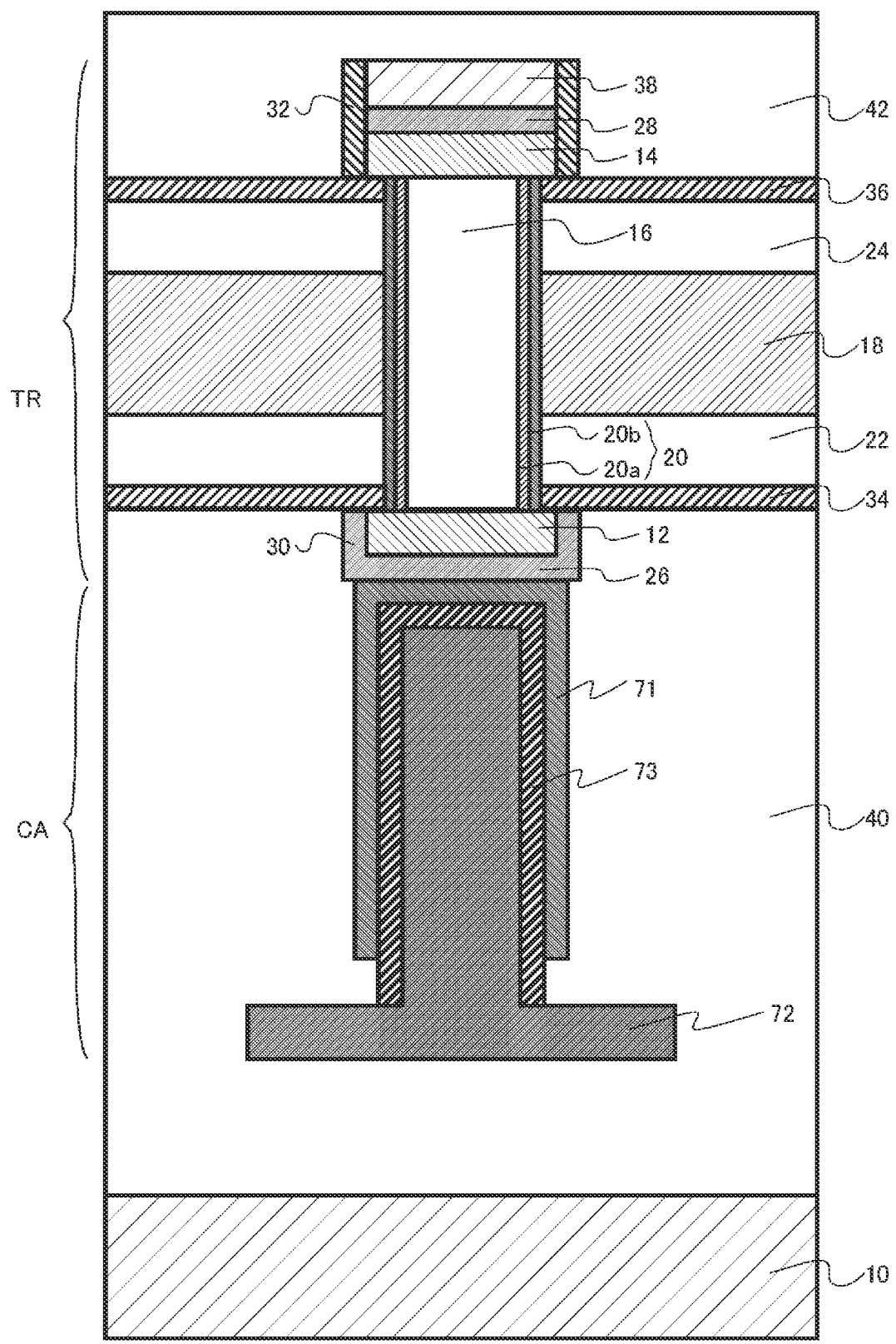
FIG. 48 is a schematic cross-sectional view of the semiconductor memory device according to a fourth embodiment.

FIG. 48 is a schematic cross-sectional view of the semiconductor memory device according to the fourth embodiment. FIG. 48 illustrates a cross section of the memory cell MC of the semiconductor memory 400.

The semiconductor memory 400 includes a silicon substrate 10, the switching transistor TR, and the capacitor CA.

The switching transistor TR has a structure similar to that of the transistor 100 of the first embodiment.

The capacitor CA is provided between the silicon substrate 10 and the switching transistor TR. The capacitor CA is provided between the silicon substrate 10 and the lower electrode 12. The capacitor CA is electrically connected to the lower electrode 12.

The capacitor CA includes a cell electrode 71, a plate electrode 72, and a capacitor insulating film 73. The cell electrode 71 is electrically connected to the lower electrode 12. The cell electrode 71 is in contact with the lower barrier conductive layer 26, for example.

The cell electrode 71 and the plate electrode 72 are, for example, a titanium nitride. The capacitor insulating film 73 has, for example, a stacked structure of a zirconium oxide, an aluminum oxide, and a zirconium oxide.

The gate electrode 18 is electrically connected to, for example, a word line WL (not illustrated). The upper electrode 14 is electrically connected to, for example, a bit line BL (not illustrated). The plate electrode 72 is connected to, for example, a plate line PL (not illustrated).

In the semiconductor memory 400, an oxide semiconductor transistor having an extremely small channel leakage current during turn-off operation is applied to the switching transistor TR. Therefore, a DRAM having excellent electric charge retention characteristics is implemented.

In the switching transistor TR of the semiconductor memory 400, the variation in transistor characteristics due to heat treatment is prevented. Therefore, for example, the operating characteristics of the memory cell MC are stabilized. Therefore, the semiconductor memory 400 having excellent operating characteristics can be implemented.

In the fourth embodiment, although the semiconductor memory to which the transistor of the first embodiment is applied has been described as an example, the semiconductor memory of the embodiment of the present disclosure may be a semiconductor memory to which the transistor of the modification of the first embodiment, the transistor according to the second embodiment, or the transistor according to the third embodiment is applied.

In the fourth embodiment, although the semiconductor memory in which the cell electrode is electrically connected to the lower electrode 12 has been described as an example, the semiconductor memory according to the embodiment of the present disclosure may be a semiconductor memory in which the cell electrode is electrically connected to the upper electrode 14.

Further, the capacitor CA may have a structure provided on the switching transistor TR. A structure in which the switching transistor TR is provided between the silicon substrate 10 and the capacitor CA may be adopted.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device, comprising:
   a first electrode comprising a metal oxide;
   a second electrode comprising a metal oxide;
   an oxide semiconductor layer between the first electrode and the second electrode in a first direction;
   a gate electrode surrounding the oxide semiconductor layer in a second direction intersecting the first direction;
   a gate insulating layer between the gate electrode and the oxide semiconductor layer and comprising silicon and nitrogen;
   a first insulating layer between the first electrode and the gate electrode in the first direction;
   a second insulating layer between the second electrode and the gate electrode in the first direction;
   a first conductive layer in contact with a surface of the first electrode opposite to the oxide semiconductor layer and comprising a metal, a metal nitride, or a metal carbide;
   a second conductive layer in contact with a surface of the second electrode opposite to the oxide semiconductor layer and comprising a metal, a metal nitride, or a metal carbide;
   a first layer surrounding the first electrode in the second direction, the first layer being in contact with the first conductive layer, the first layer comprising at least one insulator selected from a group consisting of aluminum oxide, magnesium oxide, gallium oxide, germanium oxide, yttrium oxide, zirconium oxide, lanthanum oxide, hafnium oxide, tantalum oxide, silicon nitride, aluminum nitride, silicon oxynitride, and aluminum oxynitride or at least one conductor selected from a group consisting of metal, metal nitride, and metal carbide;
   a second layer surrounding the second electrode in the second direction, the second layer being in contact with the second conductive layer and comprising at least one insulator selected from a group consisting of aluminum oxide, magnesium oxide, gallium oxide, germanium oxide, yttrium oxide, zirconium oxide, lanthanum oxide, hafnium oxide, tantalum oxide, silicon nitride, aluminum nitride, silicon oxynitride, and aluminum oxynitride or at least one conductor selected from a group consisting of a metal, a metal nitride, and a metal carbide;
   a third insulating layer between the first electrode and the first insulating layer, the third insulating layer being in contact with the gate insulating layer and the first layer and comprising at least one insulator selected from a group consisting of aluminum oxide, magnesium oxide, gallium oxide, germanium oxide, yttrium oxide, zirconium oxide, lanthanum oxide, hafnium oxide, tantalum oxide, silicon nitride, aluminum nitride, silicon oxynitride, and aluminum oxynitride; and
   a fourth insulating layer between the second electrode and the second insulating layer, the fourth insulating layer being in contact with the gate insulating layer and the second layer and comprising at least one insulator selected from a group consisting of aluminum oxide, magnesium oxide, gallium oxide, germanium oxide, yttrium oxide, zirconium oxide, lanthanum oxide, hafnium oxide, tantalum oxide, silicon nitride, aluminum nitride, silicon oxynitride, and aluminum oxynitride.

2. The semiconductor device according to claim 1, wherein the first electrode and the second electrode are a metal oxide comprising indium and tin.

3. The semiconductor device according to claim 1, wherein the first conductive layer and the second conductive layer each comprise titanium and nitrogen.

4. The semiconductor device according to claim 1, wherein the first layer comprises titanium and nitrogen.

5. The semiconductor device according to claim 1, wherein the first layer comprises the same material as the first conductive layer, and
   the first conductive layer and the first layer each comprise titanium and nitrogen.

6. The semiconductor device according to claim 1, wherein the third insulating layer and the fourth insulating layer each comprise silicon and nitrogen.

7. The semiconductor device according to claim 1, wherein the gate insulating layer includes:

a first film comprising silicon and oxygen, and
a second film that is between the first film and the gate electrode and comprises silicon and nitrogen.

8. The semiconductor device according to claim 7, wherein the second film is in contact with the third insulating layer and the fourth insulating layer.

9. The semiconductor device according to claim 1, further comprising:
a metal layer in contact with a surface of the second conductive layer opposite to the second electrode.

10. A semiconductor memory device, comprising:
a semiconductor device according to claim 1; and
a capacitor electrically connected to the first electrode or the second electrode.

11. A semiconductor device, comprising:
a first electrode comprising a metal oxide;
a second electrode comprising a metal oxide;
an oxide semiconductor layer between the first electrode and the second electrode in a first direction;
a gate electrode surrounding the oxide semiconductor layer in a second direction intersecting the first direction;
a gate insulating layer between the gate electrode and the oxide semiconductor layer and comprising silicon and nitrogen;
a first insulating layer between the first electrode and the gate electrode in the first direction;
a second insulating layer, the gate electrode being between the first insulating layer and the second insulating layer in the first direction;
a first conductive layer in contact with a surface of the first electrode opposite to the oxide semiconductor layer and comprising at least one of a metal, a metal nitride, or a metal carbide;
a second conductive layer in contact with a surface of the second electrode opposite to the oxide semiconductor layer, the second conductive layer being surrounded by the second electrode in the second direction and comprising at least one of a metal, a metal nitride, or a metal carbide;
a metal layer surrounded by the second conductive layer in the second direction;
a first layer surrounding the first electrode in the second direction, the first layer being in contact with the first conductive layer and comprising at least one insulator selected from a group consisting of aluminum oxide, magnesium oxide, gallium oxide, germanium oxide, yttrium oxide, zirconium oxide, lanthanum oxide, hafnium oxide, tantalum oxide, silicon nitride, aluminum nitride, silicon oxynitride, and aluminum oxynitride or at least one conductor selected from a group consisting of a metal, a metal nitride, and a metal carbide;
a third insulating layer between the first electrode and the first insulating layer in the first direction, the third insulating layer being in contact with the gate insulating layer and the first layer and comprising at least one insulator selected from a group consisting of aluminum oxide, magnesium oxide, gallium oxide, germanium oxide, yttrium oxide, zirconium oxide, lanthanum oxide, hafnium oxide, tantalum oxide, silicon nitride, aluminum nitride, silicon oxynitride, and aluminum oxynitride; and
a fourth insulating layer surrounding the metal layer in the second direction, the fourth insulating layer being in contact with the second conductive layer and the gate insulating layer and comprising at least one insulator selected from a group consisting of aluminum oxide, magnesium oxide, gallium oxide, germanium oxide, yttrium oxide, zirconium oxide, lanthanum oxide, hafnium oxide, tantalum oxide, silicon nitride, aluminum nitride, silicon oxynitride, and aluminum oxynitride.

12. The semiconductor device according to claim 11, wherein the second electrode is between the fourth insulating layer and the oxide semiconductor layer.

13. The semiconductor device according to claim 11, wherein the first electrode and the second electrode each comprise a metal oxide including indium and tin.

14. The semiconductor device according to claim 11, wherein the first conductive layer and the second conductive layer each comprise titanium and nitrogen.

15. The semiconductor device according to claim 11, wherein the first layer comprises titanium and nitrogen.

16. The semiconductor device according to claim 11, wherein
the first layer comprises the same material as the first conductive layer, and
the first conductive layer and the first layer each comprise titanium and nitrogen.

17. The semiconductor device according to claim 11, wherein the third insulating layer and the fourth insulating layer each comprise silicon and nitrogen.

18. The semiconductor device according to claim 11, wherein the gate insulating layer includes:
a first film comprising silicon and oxygen, and
a second film between the first film and the gate electrode and comprising silicon and nitrogen.

19. The semiconductor device according to claim 18, wherein the second film is in contact with the third insulating layer and the fourth insulating layer.

20. A semiconductor memory device, comprising:
a semiconductor device according to claim 11; and
a capacitor electrically connected to the first electrode or the second electrode.

21. A semiconductor device, comprising:
a first electrode comprising a metal oxide;
a second electrode comprising a metal oxide;
an oxide semiconductor layer between the first electrode and the second electrode in a first direction;
a gate electrode surrounding the oxide semiconductor layer;
a gate insulating layer between the gate electrode and the oxide semiconductor layer, the gate insulating layer surrounding the second electrode in a second direction intersecting the first direction and comprising silicon and nitrogen;
a first insulating layer between the first electrode and the gate electrode;
a second insulating layer, the gate electrode being between the first insulating layer and the second insulating layer;
a first conductive layer in contact with a surface of the first electrode opposite to the oxide semiconductor layer and being at least one of a metal, a metal nitride, or a metal carbide;
a second conductive layer in contact with a surface of the second electrode opposite to the oxide semiconductor layer, the second conductive layer being in contact with the gate insulating layer, the second insulating layer being between the gate electrode and the second conductive layer, and the second conductive layer being at least one of a metal, a metal nitride, or a metal carbide;
a first layer surrounding the first electrode in the second direction, the first layer being in contact with the first conductive layer and comprising at least one insulator selected from a group consisting of aluminum oxide, magnesium oxide, gallium oxide, germanium oxide, yttrium oxide, zirconium oxide, lanthanum oxide, hafnium oxide, tantalum oxide, silicon nitride, aluminum nitride, silicon oxynitride, and aluminum oxynitride or at least one conductor selected from a group consisting of a metal, a metal nitride, and a metal carbide; and a third insulating layer between the first electrode and the first insulating layer, the third insulating layer being in contact with the gate insulating layer and the first layer and comprising at least one insulator selected from a group consisting of aluminum oxide, magnesium oxide, gallium oxide, germanium oxide, yttrium oxide, zirconium oxide, lanthanum oxide, hafnium oxide, tantalum oxide, silicon nitride, aluminum nitride, silicon oxynitride, and aluminum oxynitride.

22. The semiconductor device according to claim 21, wherein the first electrode and the second electrode comprise a metal oxide including indium and tin.

23. The semiconductor device according to claim 21, wherein the first conductive layer and the second conductive layer each comprise titanium and nitrogen.

24. The semiconductor device according to claim 21, wherein the first layer comprises titanium and nitrogen.

25. The semiconductor device according to claim 21, wherein the first layer comprises the same material as the first conductive layer, and the first conductive layer and the first layer each comprise titanium and nitrogen.

26. The semiconductor device according to claim 21, wherein the third insulating layer comprises silicon and nitrogen.

27. The semiconductor device according to claim 21, wherein the gate insulating layer includes:

a first film comprising silicon and oxygen, and a second film between the first film and the gate electrode and comprising silicon and nitrogen.

28. The semiconductor device according to claim 27, wherein the second film is in contact with the third insulating layer and the second conductive layer.

29. The semiconductor device according to claim 21, further comprising:

a metal layer in contact with a surface of the second conductive layer opposite to the second electrode.

30. A semiconductor memory device, comprising:

a semiconductor device according to claim 21; and a capacitor electrically connected to the first electrode or the second electrode.

* * * * *